United States Patent
Ware et al.

(10) Patent No.: US 9,653,146 B2
(45) Date of Patent: *May 16, 2017

(54) HIGH CAPACITY MEMORY SYSTEM USING STANDARD CONTROLLER COMPONENT

(71) Applicant: RAMBUS INC., Sunnyvale, CA (US)

(72) Inventors: Frederick A. Ware, Los Altos Hills, CA (US); Suresh Rajan, Fremont, CA (US); Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/869,294

(22) Filed: Sep. 29, 2015

(65) Prior Publication Data

US 2016/0189764 A1    Jun. 30, 2016

Related U.S. Application Data

(63) Continuation of application No. 14/578,078, filed on Dec. 19, 2014, now Pat. No. 9,183,920, which is a continuation of application No. 14/538,524, filed on Nov. 11, 2014, now Pat. No. 9,165,639.

(60) Provisional application No. 61/930,895, filed on Jan. 23, 2014, provisional application No. 61/906,242, (Continued)

(51) Int. Cl.
| | |
|---|---|
| G06F 3/00 | (2006.01) |
| G11C 11/408 | (2006.01) |
| G11C 5/04 | (2006.01) |
| G11C 11/4093 | (2006.01) |
| G06F 12/06 | (2006.01) |
| G06F 13/16 | (2006.01) |
| G11C 7/10 | (2006.01) |

(Continued)

(52) U.S. Cl.
CPC ......... *G11C 11/4082* (2013.01); *G06F 12/06* (2013.01); *G06F 13/1673* (2013.01); *G06F 13/1684* (2013.01); *G11C 5/04* (2013.01); *G11C 7/1051* (2013.01); *G11C 7/1078* (2013.01); *G11C 11/4093* (2013.01); *G11C 7/22* (2013.01); *G11C 11/4076* (2013.01)

(58) Field of Classification Search
None
See application file for complete search history.

(56) References Cited

U.S. PATENT DOCUMENTS

| | | | |
|---|---|---|---|
| 6,742,098 B1 | 5/2004 | Halbert et al. | |
| 6,882,082 B2 * | 4/2005 | Greeff | G06F 13/4256 310/307 |

(Continued)

OTHER PUBLICATIONS

PCT International Search Report and the Written Opinion re PCT/US2014/065083 dated Feb. 9, 2015. 9 pages.

(Continued)

*Primary Examiner* — Elias Mamo
(74) *Attorney, Agent, or Firm* — Lowenstein Sandler LLP

(57) ABSTRACT

The embodiments described herein describe technologies for using the memory modules in different modes of operation, such as in a standard multi-drop mode or as in a dynamic point-to-point (DPP) mode (also referred to herein as an enhanced mode). The memory modules can also be inserted in the sockets of the memory system in different configurations.

20 Claims, 45 Drawing Sheets

Related U.S. Application Data filed on Nov. 19, 2013, provisional application No. 61/902,677, filed on Nov. 11, 2013.

(51) Int. Cl.
   *G11C 7/22* (2006.01)
   *G11C 11/4076* (2006.01)

(56) References Cited

U.S. PATENT DOCUMENTS

| | | | | |
|---|---|---|---|---|
| 7,296,129 | B2* | 11/2007 | Gower | G06F 13/4022 |
| | | | | 365/63 |
| 8,130,560 | B1 | 3/2012 | Rajan et al. | |
| 2004/0236894 | A1* | 11/2004 | Grundy | G06F 13/4022 |
| | | | | 711/1 |
| 2005/0021884 | A1* | 1/2005 | Jeddeloh | G06F 13/4009 |
| | | | | 710/22 |
| 2006/0023482 | A1 | 2/2006 | Dreps et al. | |
| 2006/0129755 | A1 | 6/2006 | Raghuram | |
| 2007/0133247 | A1 | 6/2007 | Lee et al. | |
| 2007/0260841 | A1 | 11/2007 | Hampel et al. | |
| 2007/0286078 | A1* | 12/2007 | Coteus | G06F 13/1657 |
| | | | | 370/235 |
| 2009/0177816 | A1 | 7/2009 | Marx et al. | |
| 2010/0262790 | A1 | 10/2010 | Perego et al. | |
| 2012/0134084 | A1 | 5/2012 | Perego et al. | |
| 2012/0204079 | A1 | 8/2012 | Takefman et al. | |
| 2012/0326775 | A1 | 12/2012 | Heo | |
| 2013/0010556 | A1 | 1/2013 | Koshizuka | |
| 2013/0033954 | A1 | 2/2013 | Shaeffer | |
| 2013/0058145 | A1 | 3/2013 | Yu et al. | |
| 2013/0063998 | A1 | 3/2013 | Harashima | |
| 2013/0135916 | A1 | 5/2013 | Osanai et al. | |
| 2013/0254495 | A1 | 9/2013 | Kim et al. | |

OTHER PUBLICATIONS

PCT International Search Report and Written Opinion dated Dec. 24, 2014 in International Application No. PCT/US2014/057314. 15 pages.

Notification Concerning Transmittal of International Preliminary Report on Patentability with mail date of May 26, 2016 re Int'l. Appln. No. PCT/US14/065083. 7 Pages.

\* cited by examiner

DQ and CA links – Standard topology 100

CA link detail

DQ link detail – write access

DQ link detail – read access

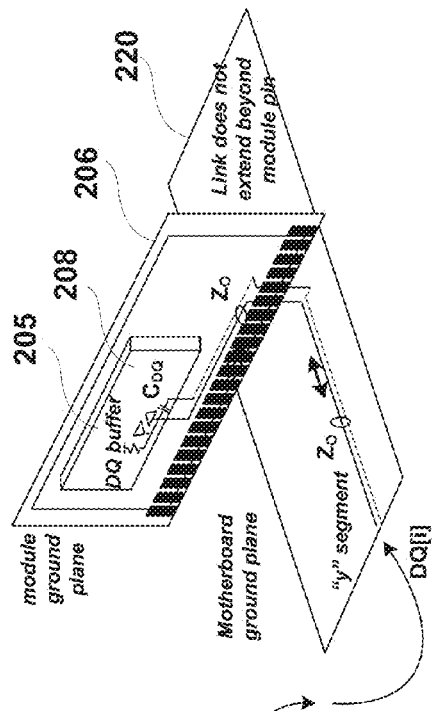
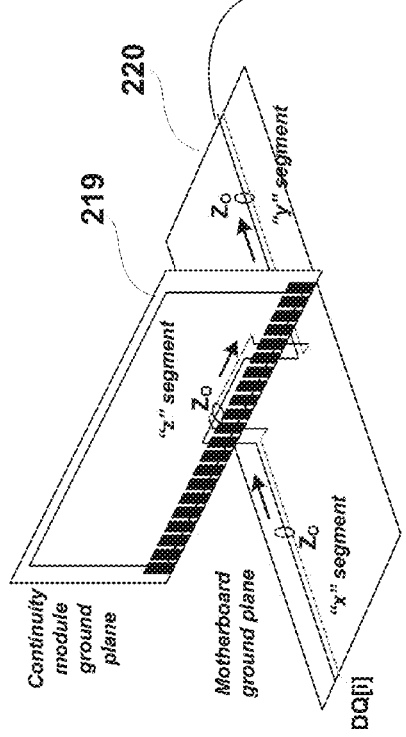

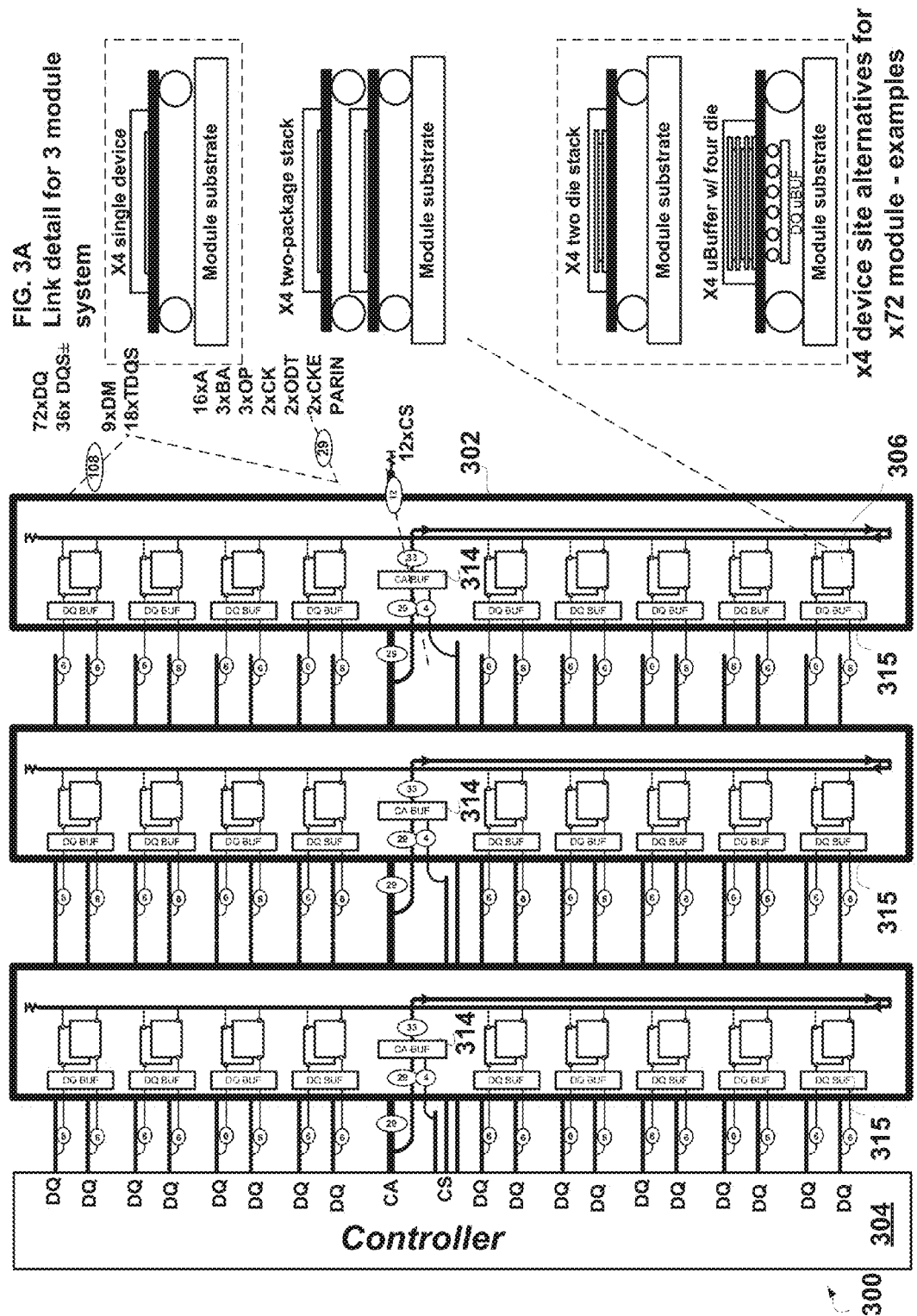

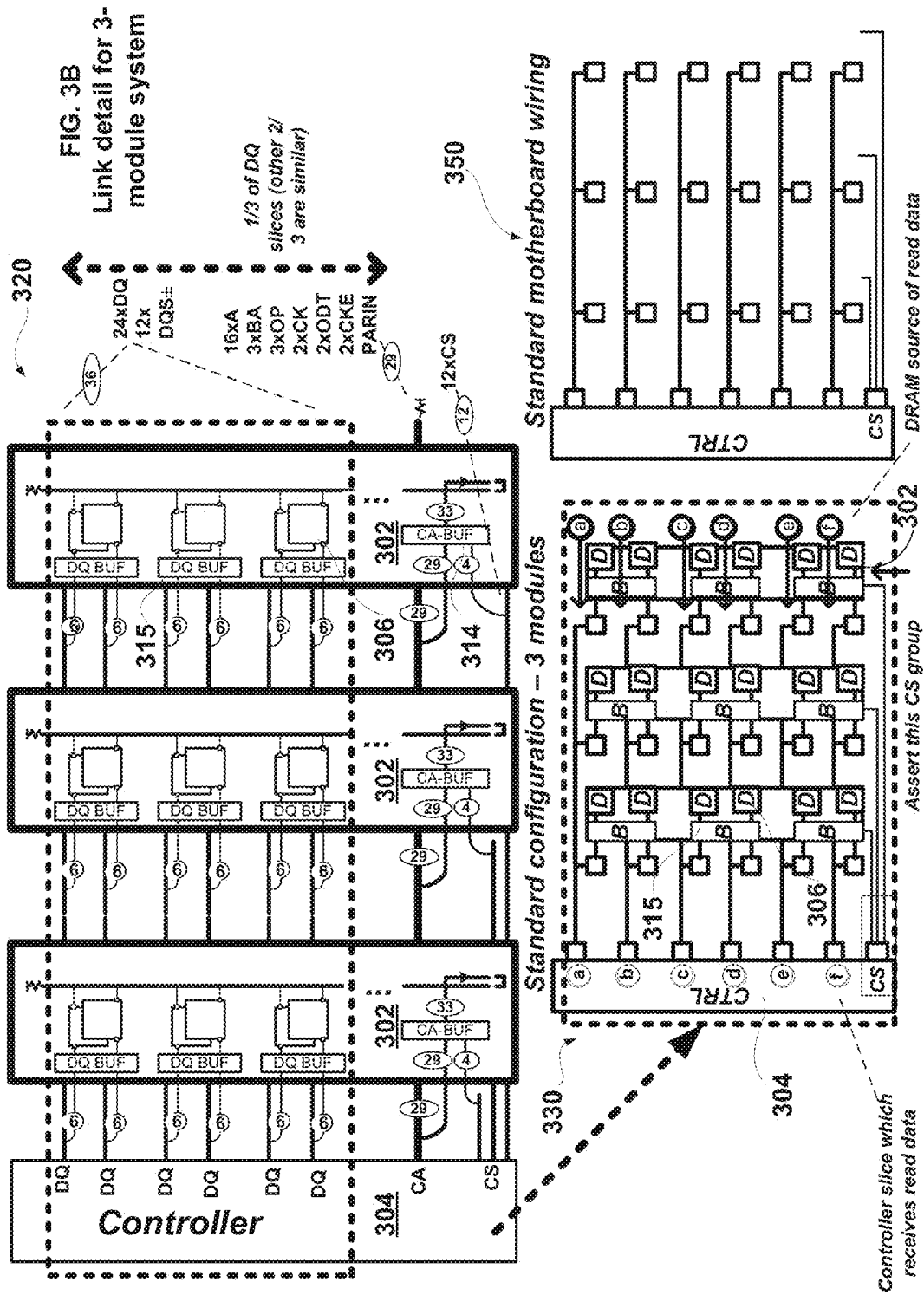
FIG. 3B Link detail for 3-module system

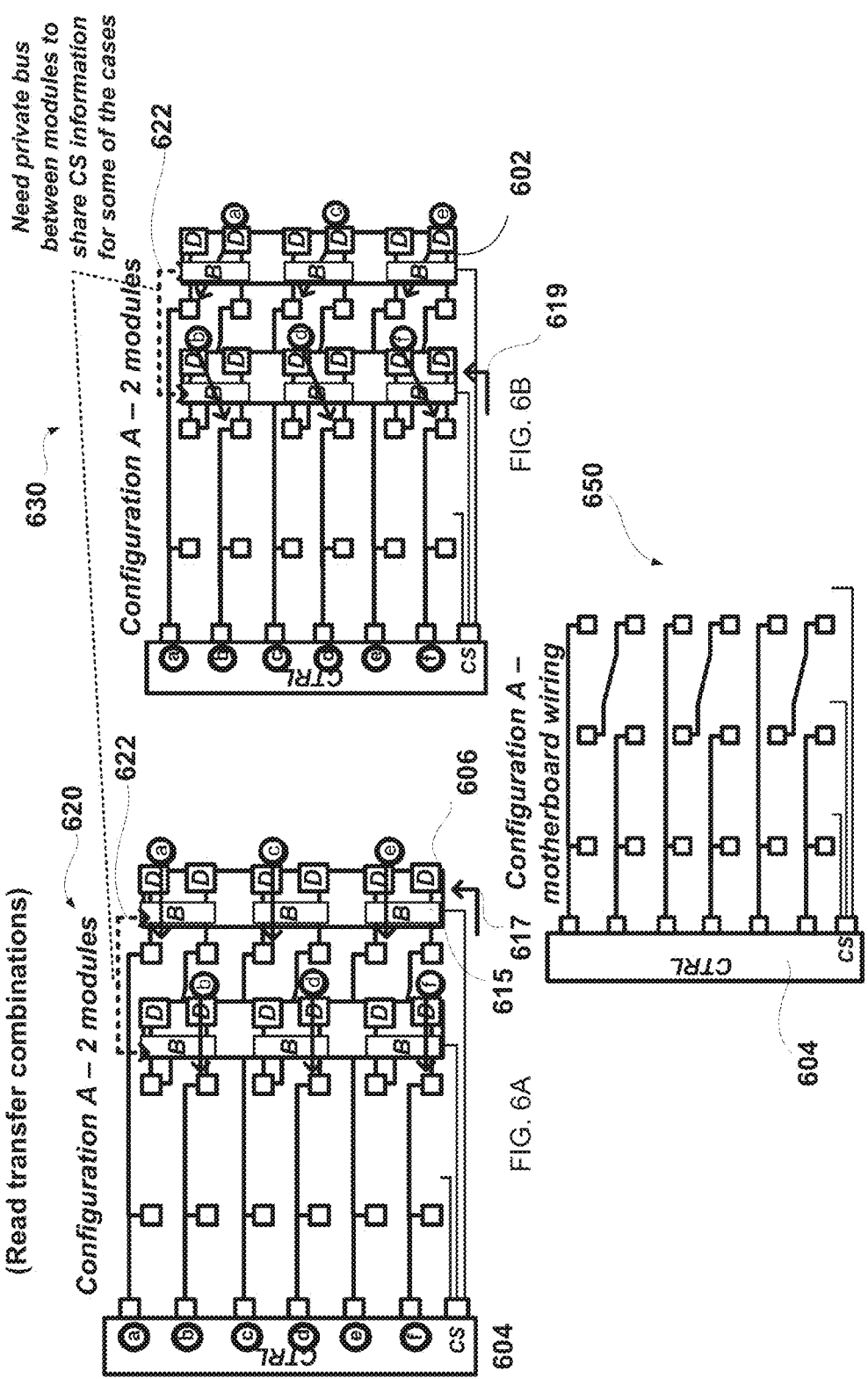

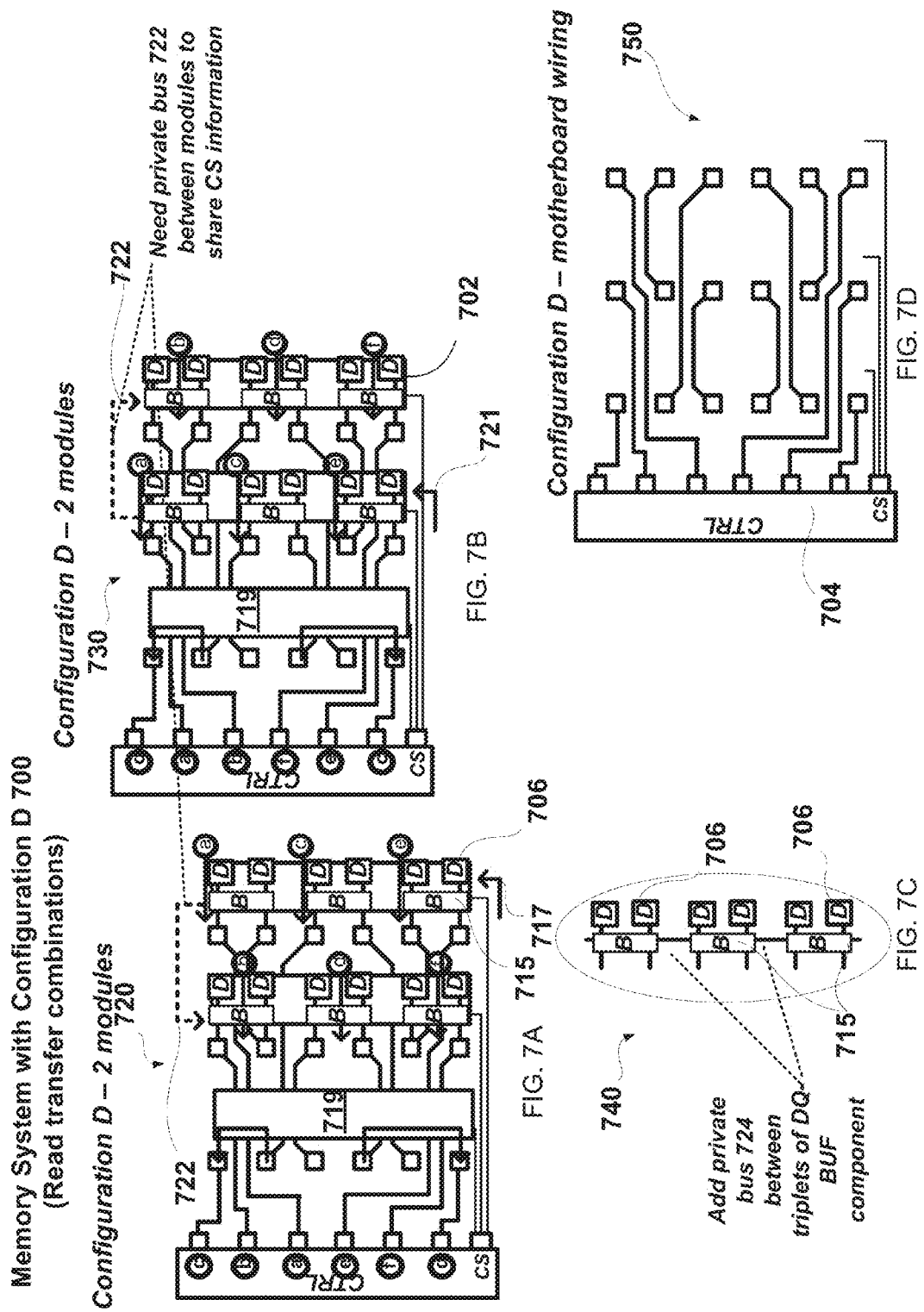

Memory System with Configuration E 800
(Read transfer combinations)

Configuration E – 2 modules
820

FIG. 8A

Configuration E – 2 modules
830

FIG. 8B

Need private bus between modules to share CS information

FIG. 8C
Center device sites connect to two DQ-BUF components

Configuration E – motherboard wiring
850

FIG. 8D

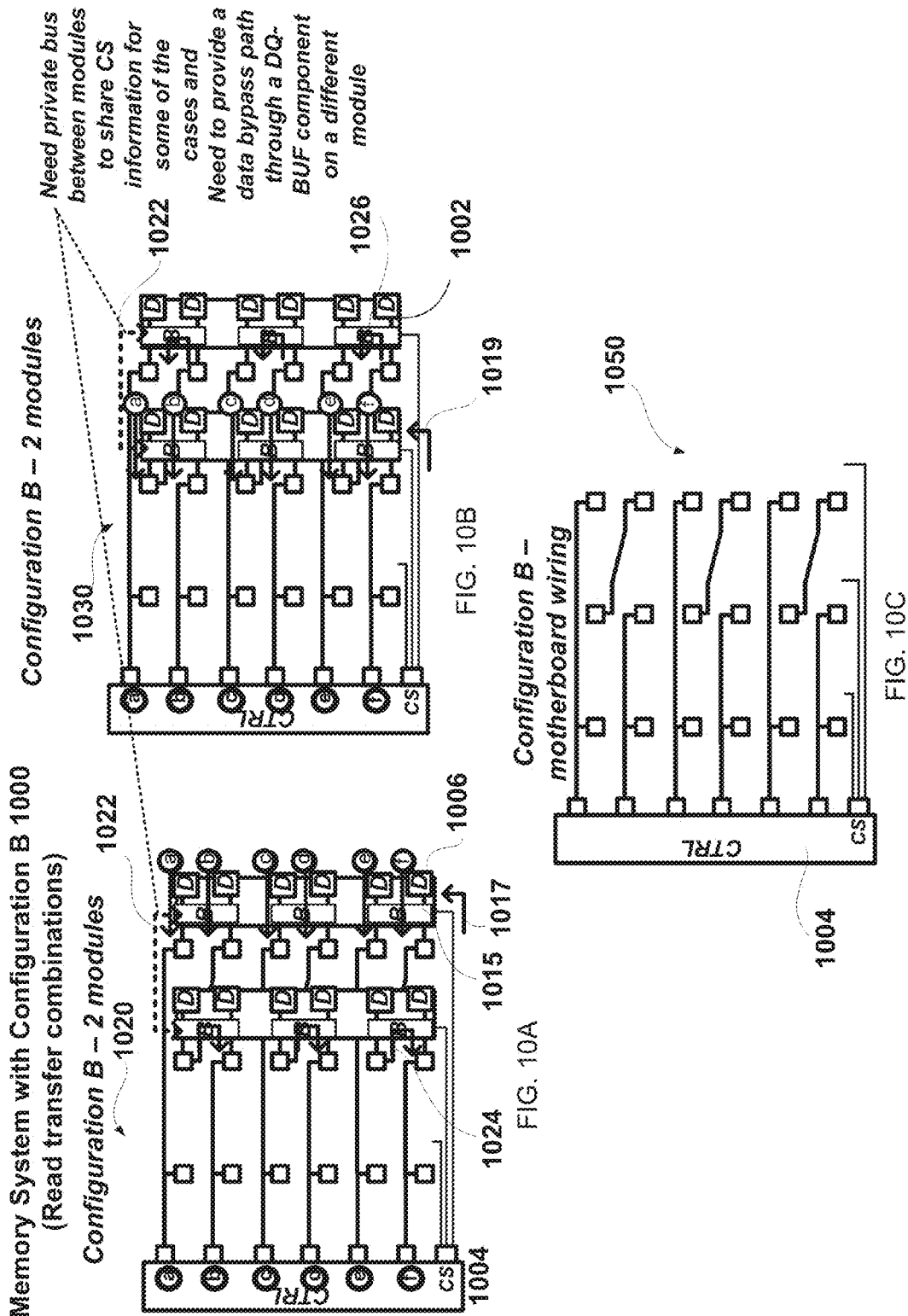

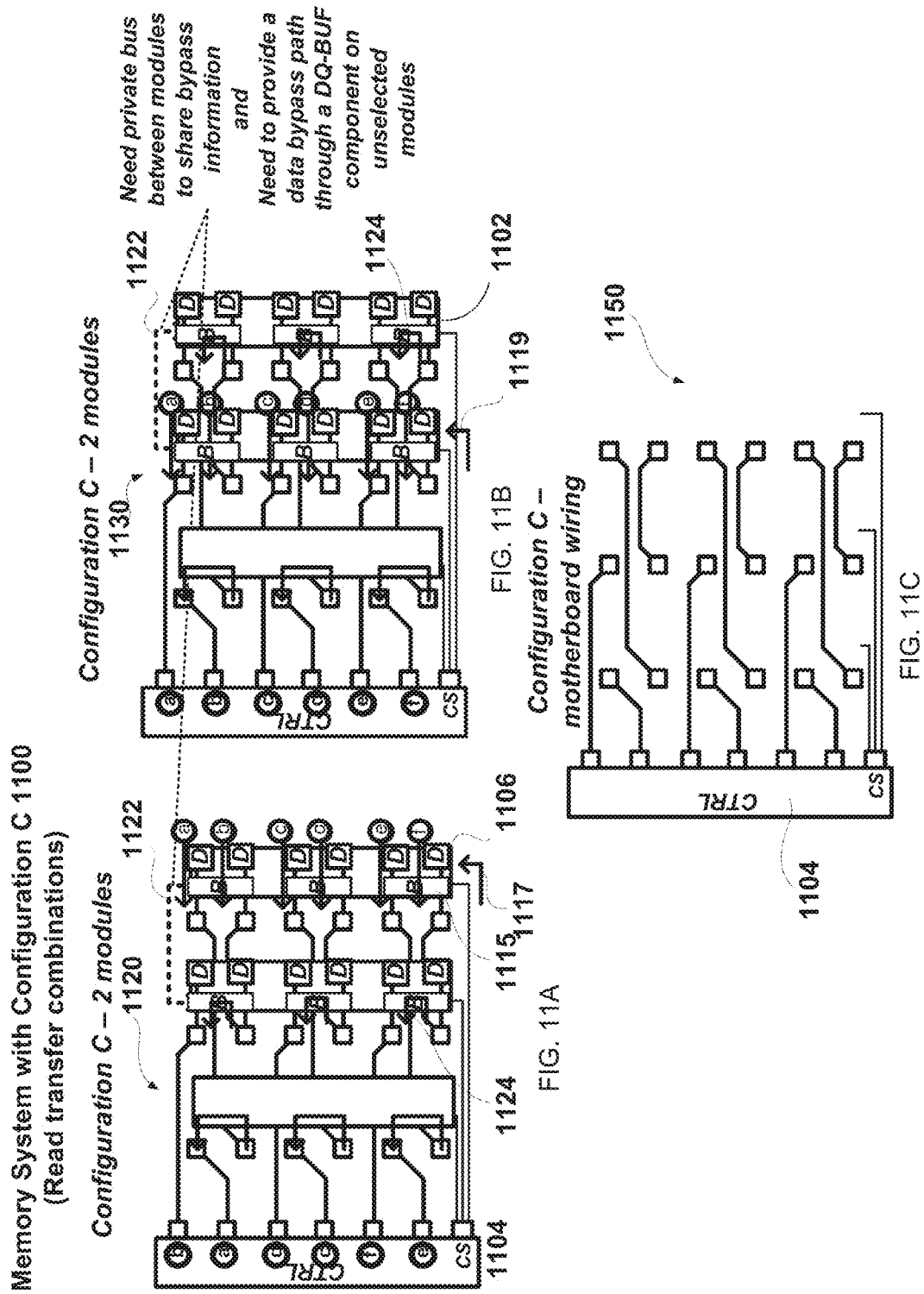

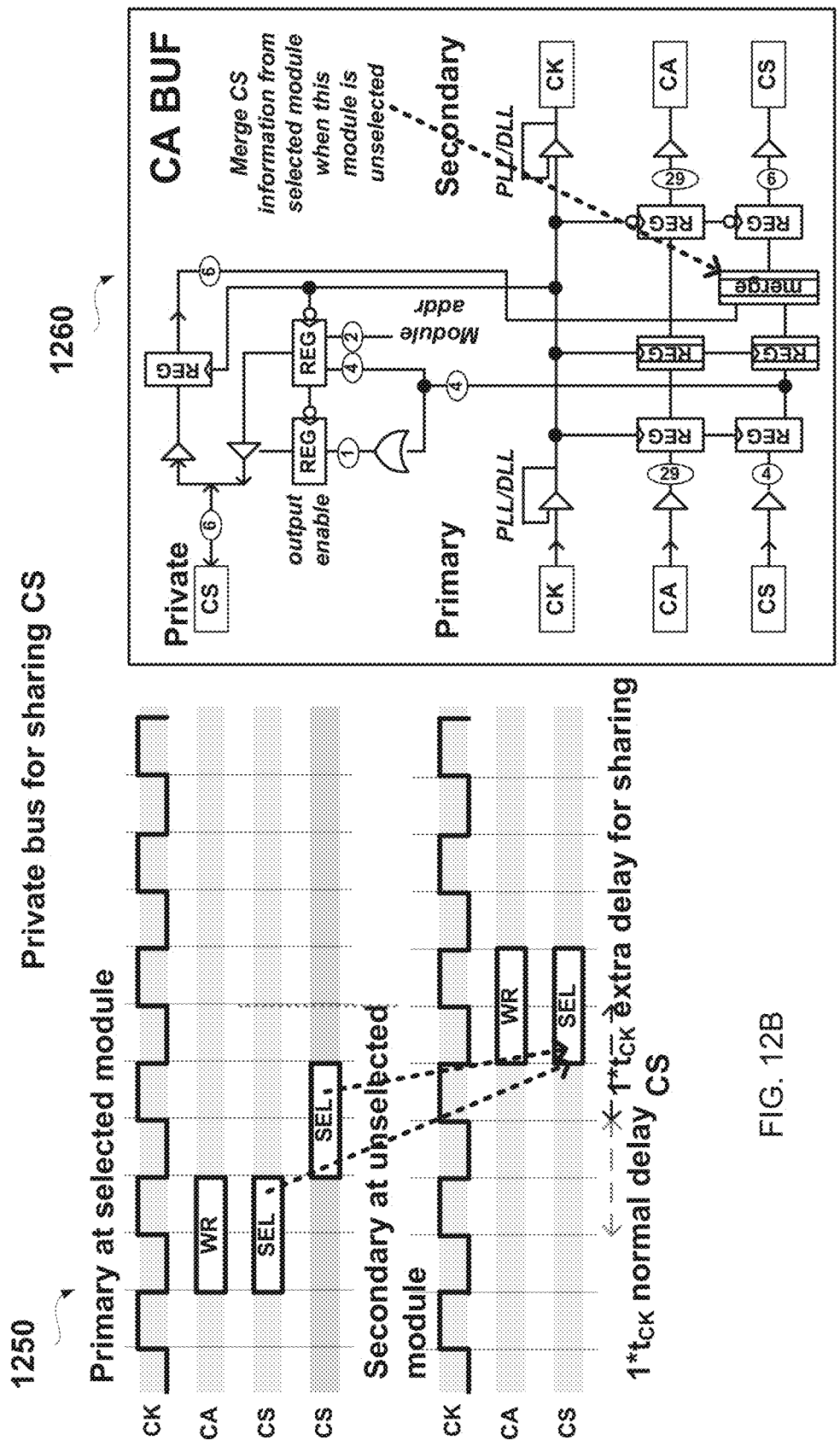

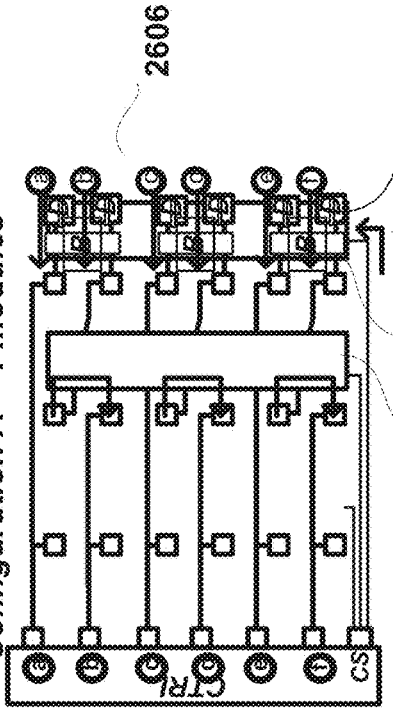
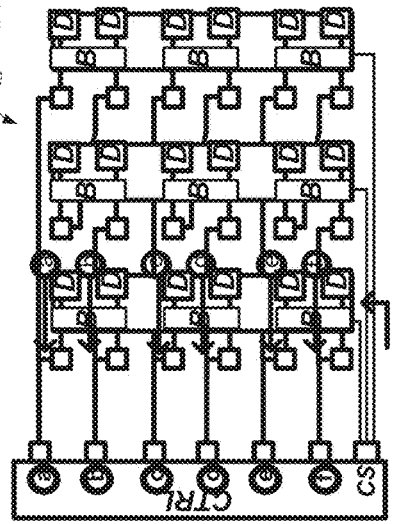
Memory System with Configuration A 600
(Read transfer combinations)
FIG. 26A — Configuration A – 1 modules
FIG. 26B — Configuration A – 3 modules
Need private bus between modules to share CS information for some of the cases

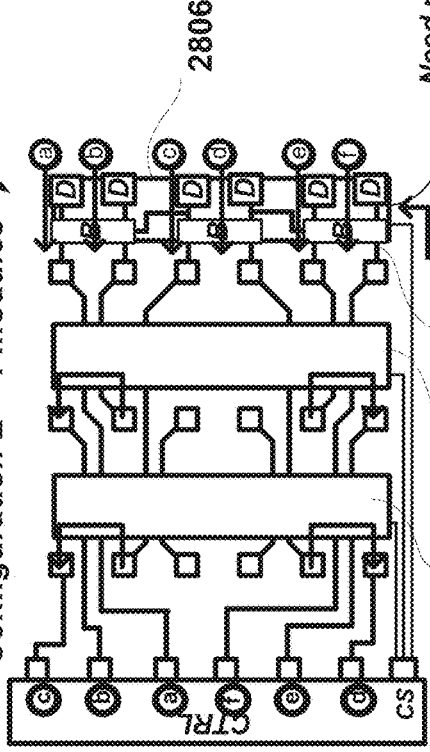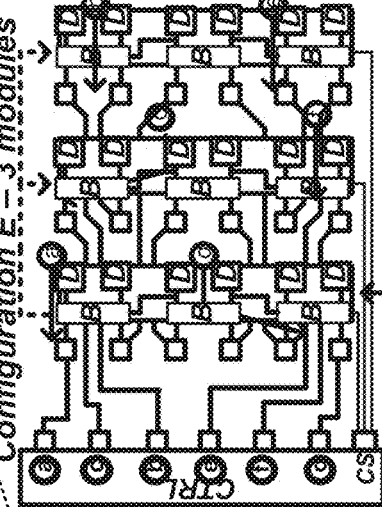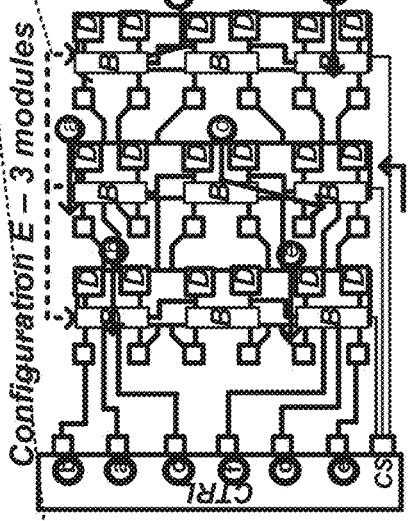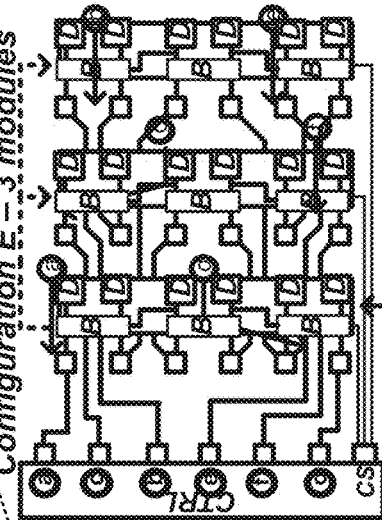
FIG. 28A — Memory System with Configuration E 800 (Read transfer combinations)
FIG. 28B

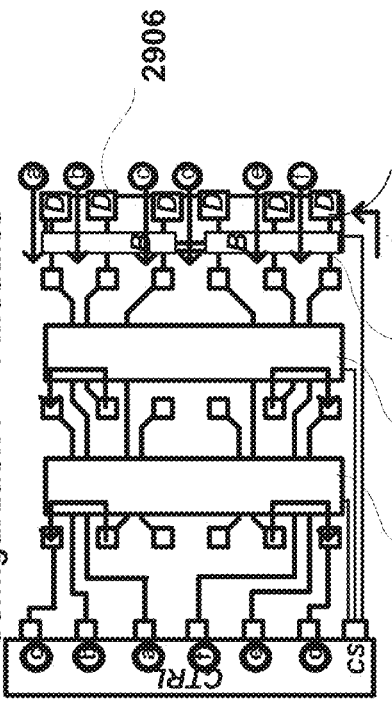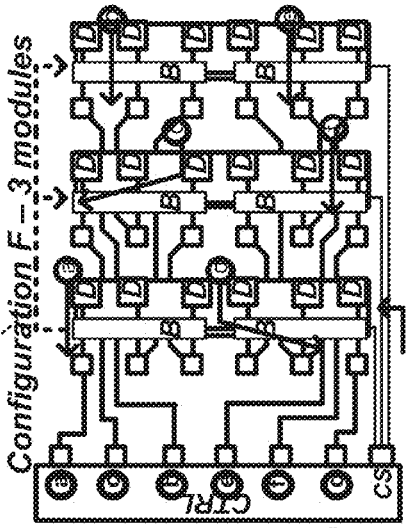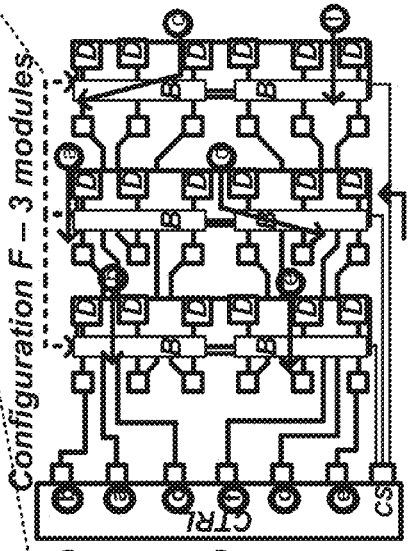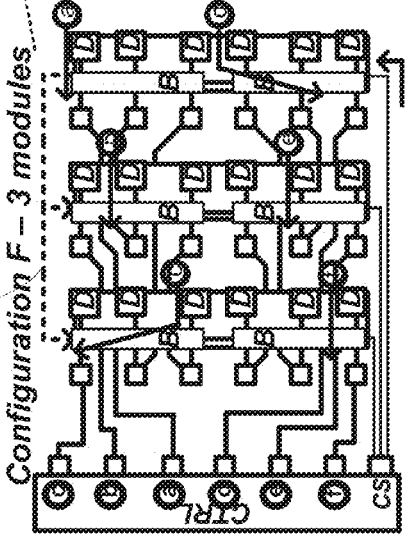
FIG. 29A — Memory System with Configuration F 900 (Read transfer combinations)
FIG. 29B Memory System with Configuration B 1000
(Read transfer combinations)

FIG. 30A

Configuration B – 1 modules

*Need private bus between modules to share CS information for some of the cases and Need to provide a data bypass path through a DQ-BUF component on a different module*

FIG. 30B

Configuration B – 3 modules
Configuration B – 3 modules
Configuration B – 3 modules

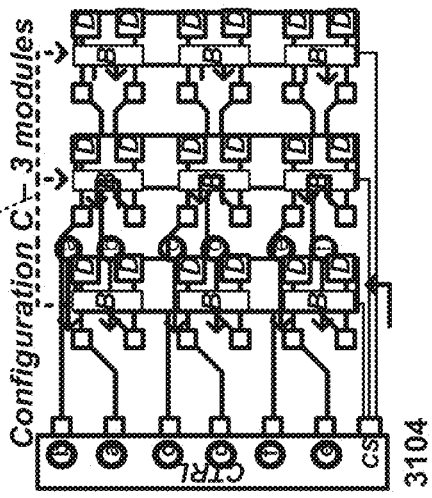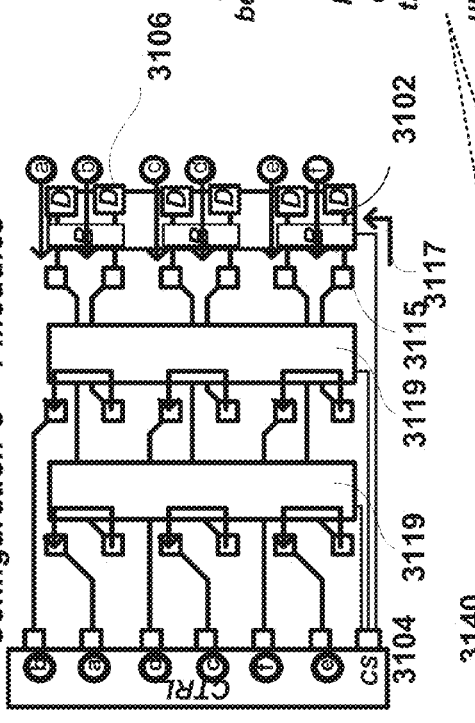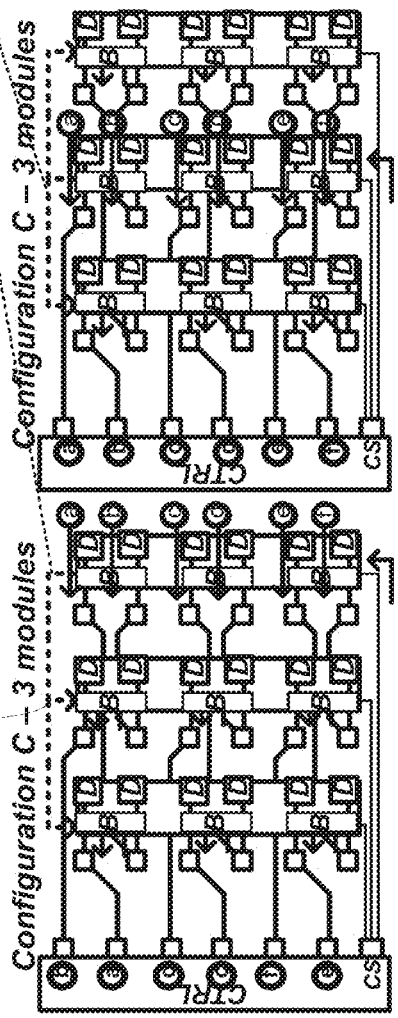
FIG. 31A
FIG. 31B

HIGH CAPACITY MEMORY SYSTEM USING STANDARD CONTROLLER COMPONENT

RELATED APPLICATIONS

This application is a continuation of U.S. application Ser. No. 14/578,078 filed Dec. 19, 2014, and Ser. No. 14/538,524, filed Nov. 11, 2014, which claims the benefit of U.S. 61/930,895, filed Jan. 23, 2014, U.S. Provisional Application No. 61/906,242, filed Nov. 19, 2013, and U.S. Provisional Application No. 61/902,677, filed Nov. 11, 2013, the entire contents of which are incorporated by reference.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, including a load-reduced DIMM (LRDIMM) for Double Data Rate Type three (DDR3), which have been used for large-capacity servers and high-performance computing platforms. Memory capacity may be limited by the loading of the data (DQ) bus and the request (RQ) bus associated with the user of many DRAM devices and DIMMs. LRDIMMs may increase memory capacity by using a memory buffer component (also referred to as a register). Registered memory modules have a register between the DRAM devices and the system's memory controller. For example, a fully buffer componented DIMM architecture introduces an advanced memory buffer component (AMB) between the memory controller and the DRAM devices on the DIMM. The memory controller communicates with the AMB as if the AMB were a memory device, and the AMB communicates with the DRAM devices as if the AMB were a memory controller. The AMB can buffer component data, command and address signals. With this architecture, the memory controller does not write to the DRAM devices, rather the AMB writes to the DRAM devices.

Lithographic feature size has steadily reduced as each successive generation of DRAM has appeared in the marketplace. As a result, the device storage capacity of each generation has increased. Each generation has seen the signaling rate of interfaces increase, as well, as transistor performance has improved.

Unfortunately, one metric of memory system design which has not shown comparable improvement is the module capacity of a standard memory channel. This capacity has steadily eroded as the signaling rates have increased.

Part of the reason for this is the link topology used in standard memory systems. When more modules are added to the system, the signaling integrity is degraded, and the signaling rate must be reduced. Typical memory systems today are limited to just one or two modules when operating at the maximum signaling rate.

BRIEF DESCRIPTION OF THE DRAWINGS

The present embodiments are illustrated by way of example, and not of limitation, in the figures of the accompanying drawings in which:

FIG. 2A shows some details of the physical connection topology of the high speed signaling links of an improved memory system according to one embodiment.

FIG. 2B shows some details of the physical connection topology of the CA links of an improved memory system according to one embodiment.

FIG. 2C shows some details of the physical connection topology of the DQ links of an improved memory system for a continuity module according to one embodiment.

FIG. 2D shows some details of the physical connection topology of the DQ links of an improved memory system for a memory module according to one embodiment.

FIG. 3A shows a standard system with three modules according to one embodiment.

FIG. 3B shows a simplified view of the standard system with three modules according to one embodiment.

FIGS. 6A-C show an improved memory system with a first configuration A with different combinations of one or two memory modules in a 3-SPC memory channel according to one embodiment.

FIGS. 7A-7D show an improved memory system with a second configuration D with different combinations of one or two memory modules in a 3-SPC memory channel according to one embodiment.

FIGS. 8A-D show an improved memory system with a third configuration E with different combinations of one or two memory modules in a 3-SPC memory channel according to one embodiment.

FIGS. 9A-9D show an improved memory system with a fourth configuration F with different combinations of one or two memory modules in a 3-SPC memory channel according to one embodiment.

FIGS. 10A-10C show an improved memory system with a fifth configuration B with different combinations of one or two memory modules in a 3-SPC memory channel according to one embodiment.

FIGS. 11A-C show an improved memory system with a sixth configuration C with different combinations of one or two memory modules in a 3-SPC memory channel according to one embodiment.

FIG. 12B is a timing diagram of the private bus for sharing CS information according to one embodiment.

FIG. 12C is a block diagram illustrating a CA buffer component for sharing CS information according to one embodiment.

FIGS. 26A-B show an improved memory system with the first configuration A with different combinations of one or three memory modules in a 3-SPC memory channel according to one embodiment.

FIGS. 28A-B show an improved memory system with the third configuration E with different combinations of one or three memory modules in a 3-SPC memory channel according to one embodiment.

FIGS. 29A-B show an improved memory system with the fourth configuration F with different combinations of one or three memory modules in a 3-SPC memory channel according to one embodiment.

FIGS. 30A-B show an improved memory system with the fifth configuration B with different combinations of one or three memory modules in a 3-SPC memory channel according to one embodiment.

FIGS. 31A-B show an improved memory system with the sixth configuration C with different combinations of one or three memory modules in a 3-SPC memory channel according to one embodiment.

DETAILED DESCRIPTION

Figure 1A:
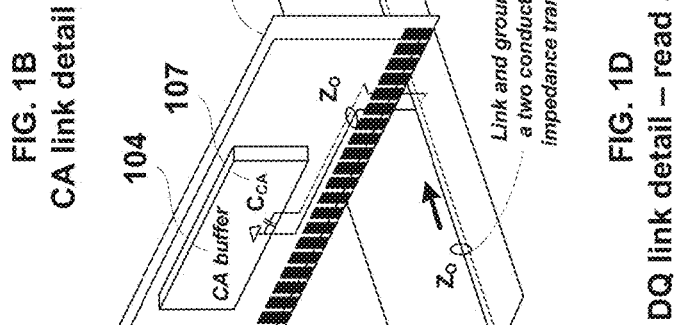
FIG. 1A shows some details of the physical connection topology of the high speed signaling links in standard memory systems.

The embodiments described herein describe technologies for using the memory modules in different modes of operation, such as in a standard multi-drop mode or as in a dynamic point-to-point (DPP) mode (also referred to herein as an enhanced mode). The memory modules can also be inserted in the sockets of the memory system in different configurations. The memory modules, as described in various embodiments herein, may be built from standard memory components, and may be used with existing controllers. In some cases, no modifications are necessary to the existing memory controllers in order to operate with these multi-mode, multi-configuration memory modules. In other cases, memory controller with minimal modifications may be used in standard memory systems or in new higher-capacity memory systems.

In addition to improving the capacity, the embodiments described herein may be used to improve signaling integrity of the data-links, which normally limit the signaling rate. The embodiments may avoid some of the delays due to rank switching turnaround, another result of the standard link topology. The embodiments described herein may also be compatible with standard error detection and correction (EDC) codes. This includes standard (Hamming) ECC bit codes and standard BCH (a.k.a., "Chip-Kill®") symbol codes. In fact, in some configurations, the embodiments can correct for the complete failure of a module.

In one embodiment, a memory module includes a command and address (CA) buffer component and multiple CA links that are multi-drop links that connect with all other memory modules connected to a memory controller to which the memory module is connected. The memory module also includes a data (DQ) buffer component (also referred to as data request buffer component), which includes at least two primary ports and at least two secondary ports to connect to multi-drop data-links when inserted into a first type of memory channel and to connect to dynamic point-to-point (DPP) links, wherein each of the DPP links pass through a maximum of one bypass path of one of the other memory modules or of a continuity module when inserted into one of the sockets of the memory system.

In another embodiment, a memory module with two modes of operation includes a first mode in which the memory module is inserted onto a first type of memory channel with multi-drop data-links which are shared with all other memory modules connected to a memory controller to which the memory module is connected, and a second mode in which the memory module is inserted onto a second type of memory channel in which some data-links do not connect to all of the other memory modules. Alternatively, the memory module may be inserted onto a first type of memory channel with multi-drop data-links which are shared with at least one other memory module in the first mode and inserted onto a second type of memory channel in which some data-links do not connect to all of the other memory modules.

In another embodiment, a command and address (CA) buffer component includes CA links that are multi-drop links that connect with all other memory modules connected to a memory controller to which the memory module is connected. In this embodiment, the CA buffer component is to receive chip select (CS) information from the memory controller over the CA links. A data (DQ) buffer components (also referred to as data request buffer component) includes data-links, where the data-links are at least one of point-to-point (P-to-P) links or point-to-two-points (P-to-2P) links that do not connect to all of the other memory modules. The memory module may also include private CS sharing logic coupled to receive the CS information from the CA buffer component and to share the CS information on secondary private links to at least one of the other memory modules when the memory module is selected for data access according to the CS information. The private CS sharing logic is to receive the CS information from the at least one of the other memory modules via the secondary private links when the at least one of the other memory modules is selected for the data access.

In another embodiment, a DQ buffer component of a memory module includes a first primary port to couple to a memory controller, a second primary port to couple to the memory controller, a first secondary port to couple to a first dynamic random access memory (DRAM) device, a second secondary port to couple to a second DRAM device, and control logic to receive retransmitted CS information from another memory module on secondary links of the memory module when the memory module is not selected, wherein the control logic, in response to the CS information, is to establish at least one of the following: 1) a first path between the first primary port and the first secondary port and a second path between the second primary port and the second secondary port; 2) a third path between the first primary port and the second secondary port and a fourth path between the second primary port and the first secondary port; or 3) a bypass path between the first primary port and the second primary port.

The embodiments describe memory modules, DQ buffer components, CA buffer components, memory sockets, motherboard wirings, and other technologies that permit different configurations in which the memory modules can be used in existing legacy systems, as well as current computing systems.

For example, a first memory system includes a controller component, a first motherboard substrate with module sockets, and at least two memory modules, operated in a first mode with multi-drop data-links which can be shared by the at least two memory modules, and a second mode used with a second motherboard substrate with point-to-point data-links between the memory controller and the memory modules. In the second mode, the memory sockets may be populated with one of {1,2,3} memory modules. The memory controller can select ranks of the memory system with decoded, one-hot chip-select links. The memory system may include links that carry rank-selection information from a first module to a second module. The memory system may also include links that carry data accessed on a first module to a second module. The memory module can share CS information to coordinate data transfers or to coordinate bypassing.

In another embodiment, a memory module with two modes of operation; a first mode, in which it can be inserted onto a first type of memory channel with multi-drop data-links which are shared with at least one other module, and a second mode in which it can be inserted onto a second type of memory channel in which some data-links do not connect to all the modules.

The embodiments described herein may provide an improved solution in that the memory controller may not require any changes to interact with the dual-mode memory modules in some embodiments. The motherboard wiring can be modified to accommodate any one of the various configurations described or illustrated herein, such as a multi-drop embodiments or a point-to-point embodiment. The embodiments described herein permit variable capacity {1,2,3} modules, and may support error coding (e.g., ECC, ChipKill®). Conventional solutions did not support ECC with 64 lines. In some embodiments, the memory module includes 72 lines. Also, the embodiments described herein can be used to achieve DQ data rates as high as 6.4 Gbps, which may be a factor of three or greater than conventional solutions, which reach their speed limit at approximately 2.4 Gbps. In other embodiments, the memory module can dynamically track timing drift of DQ/DWQS while receiving data.

Figure 22:
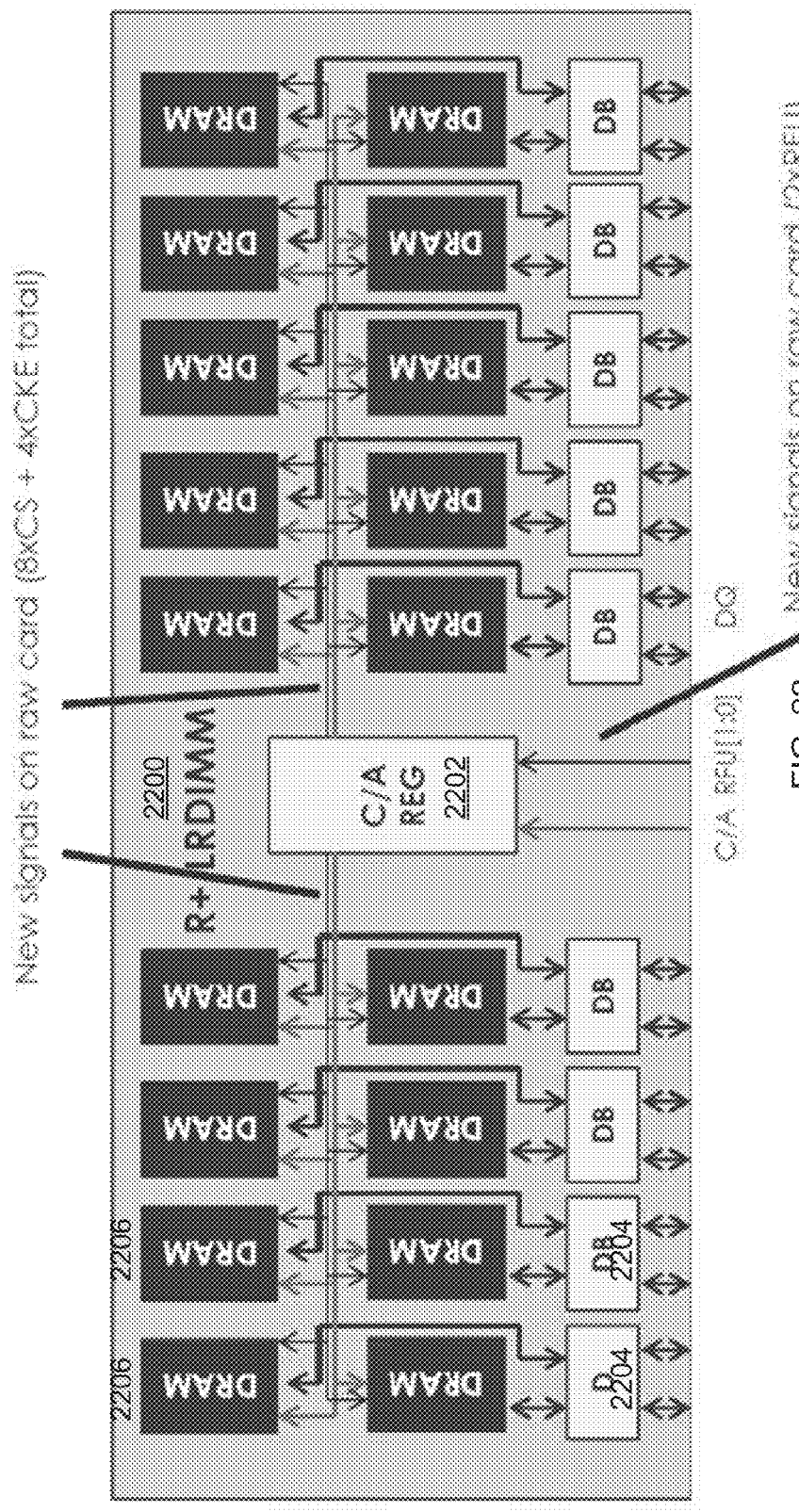
FIG. 22 is a memory module card for two-socket DPP according to one embodiment.

In a further embodiment, each DQ link passes through a maximum of one continuity module when present. In another embodiment, the memory module uses unallocated module pins to broadcast CS information from a selected module. The embodiments described herein also include technologies for domain-crossing for a DQ buffer component as illustrated in FIG. 22. Various motherboard wirings are described and illustrated in the present disclosures.

The following is a description of link topology in standard memory systems.

Link Topology in Standard Memory Systems

FIG. 1A shows some details of the physical connection topology 100 of the high speed signaling links in current memory systems. There are two classes of links: the CA (control-address) links 101 and the DQ (data) links 102.

These signals are transmitted (and received, in the case of DQ links) by the controller component 103 (also referred to herein as a memory controller but can be other components that control access to the memory modules). These signals are typically received (and transmitted, in the case of DQ links) by buffer components on a module 106, such as by a CA buffer component 104 and DQ buffer component 105.

Some systems may not use buffer components in the path of the CA and DQ links on the memory module 106, but these memory systems may tend to have a more limited memory device capacity and a more limited signaling rate. This is because the un-buffered, componented links can have their signal-integrity impacted by the longer wires and heavier loading on the module.

The CA and DQ links may be buffer componented by the same component, or there may be a separate CA buffer component and a separate DQ buffer component (also referred to herein as DQ-BUF component). Examples of both of these alternatives will be described.

First DQ buffer component may be divided (sliced) into several smaller components, each covering a subset of the DQ links. DQ buffer components, which handle eight DQ links, are described in the present disclosure. Other DQ buffer widths are possible. A wider DQ buffer may permit a larger module capacity in some cases.

Some embodiments of the present disclosure are primarily focused on those systems in which maximum memory device capacity is important. It should be noted that the technologies described in this disclosure can also be applied to systems with moderate capacity, as well.

The embodiments discussed in this disclosure all assume memory modules with seventy-two data-links (72 DQ links) to accommodate standard EDC codes. The technologies described in this disclosure can be applied to memory modules with other number of data-links as well, such as sixty-four DQ links.

CA Link of Standard CA Links in Multi-Drop Topology

In FIG. 1A, it should be noted that even with the assumption of CA and DQ buffer componenting, there may still be issues of signaling integrity, particularly with the DQ links.

The CA link topology typically includes a transmitter on the controller, a controlled-impedance wire on a motherboard substrate, and a termination resistor at the farthest end. A receiver in the CA buffer component in each module connects to the CA link, adding multiple loads to the link. In some embodiments, each CA buffer component has on-die termination resistors. This is called a multi-drop topology.

This module load is primarily capacitive, and includes loading introduced by a socket connection to a module pin, the wire trace between the module pin and the buffer component, and the receiver circuit on the buffer component.

The receiver circuit includes the transistors forming the input amplifier, as well as the protection devices that guard against electrostatic discharge. This protection device includes some series resistance as well.

Figure 1B:
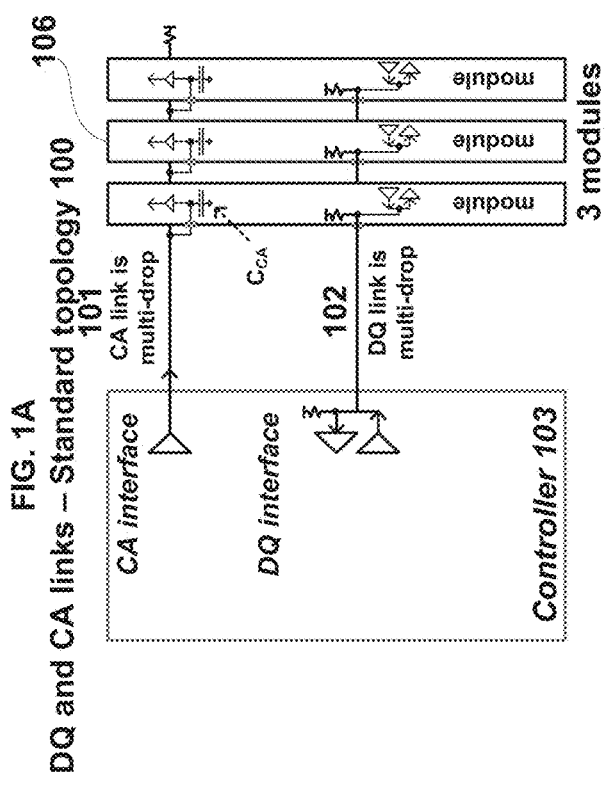
FIG. 1B shows some details of the physical connection topology of the command and address (CA) links of a standard memory system.

Because the CA link is input only, the total capacitive load is relatively small. FIG. 1B shows a lumped capacitance $C_{CA}$ 107 representing this load. The impact of CA loading (and methods to address it) is described herein.

DQ Link of Standard Memory System in Multi-Drop Topology

The DQ link topology typically includes a transmitter and receiver on the controller and a controlled-impedance wire on a motherboard substrate.

Inside the first DQ buffer component there is a termination device, a receiver, and a transmitter. Each module (with a DQ buffer component) adds a load to the DQ link.

The loading presented by each buffer component is mainly capacitive, and includes loading introduced by the socket connection to the module pin, the wire trace between the module pin and the buffer component, and the transmitter and receiver circuits on the buffer component.

The receiver/transmitter circuit includes the transistors forming the input amplifier and the output driver, as well as the protection devices that guard against electrostatic discharge. This protection device and the output driver include some series resistance as well.

Figure 1C:
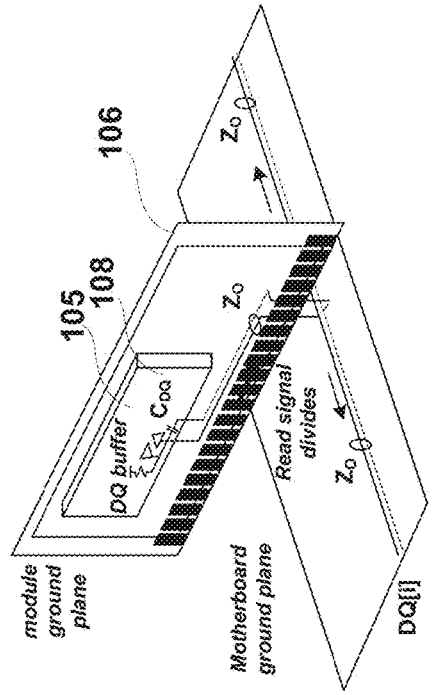
FIG. 1C shows some details of the physical connection topology of the data (DQ) links of a standard memory system for a write access.
Figure 1D:
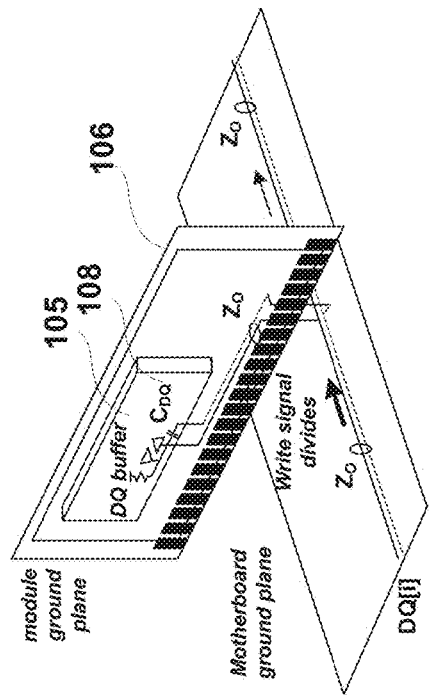
FIG. 1D shows some details of the physical connection topology of the DQ links of a standard memory system for a read access.

Because the DQ link is input/output (bidirectional), the total capacitive load $C_{DQ}$ will be larger than the $C_{CA}$ that is present on the CA links. FIGS. 1C and 1D show a lumped capacitance $C_{DQ}$ 108 representing this load. The impact of DQ loading (and methods to address it) is described herein.

A fundamental signaling problem arises because of the fact that the DQ links are bidirectional in that read data can be driven from any module position. FIG. 1D illustrates a read access on the DQ link. The transmitter in the first DQ buffer component drives the signal through the module trace and the connector to the motherboard trace. Here the signal's energy is divided, with half going left and half going right.

Ideally, the half signal traveling to the end of the module is absorbed by the terminator on the last module, which has been turned on. In practice, the signal divides at the inactive modules and reflects back, introducing ISI (inter-symbol-interference) and degrading signal integrity. In some systems, the termination devices are partially enabled in the inactive modules.

FIG. 1C illustrates the analogous problem for write data. The transmitter in the controller drives the signal through the motherboard trace. The signal's energy is divided at each module. If the module has disabled termination, the signal reflects back out to the motherboard, with half going left and half going right.

This is addressed in the standard system by including termination devices at each module, typically as an adjustable device in the input/output circuit in the first DQ buffer component.

A consequence of this need to choreograph the termination values may introduce idle cycles (bubbles) between accesses to different modules.

The termination value of this device is adjusted according to which module accesses the data. It is possible that the termination value used in the non-selected modules is adjusted as well, for optimal signaling.

This is not a scalable signaling topology, as evidenced by the limited module capacity of standard systems.

The embodiments described herein are directed to an improved signaling topology for the DQ links of a memory system. This improved topology provides higher module capacity, and can be implemented in such a way that key components (controllers, modules, buffer component devices) can be designed so they can be used in either standard systems or in improved systems (also referred to as enhanced modes of operation).

Improved Link Topology

The embodiments disclosed in this disclosure can be employed to gain a number of important benefits:

[1] The system capacity can be improved to three modules running at the maximum data rate.

[2] The capacity of the system is adjustable; a 3 module system can hold different combinations of {1,2,3} modules.

[3] The signaling integrity of the DQ links is improved from the multi-drop topology of standard systems: each DQ link uses a point-to-point topology. In some configurations, each DQ link uses a point-to-two-point topology.

[4] High capacity systems allow standard error detection and correction codes (i.e. ECC, Chip-Kill®); in addition, in some configurations it is possible to correct for the complete failure of a module.

These improvements may be achieved while maintaining a high degree of compatibility to standard memory systems and their components:

[1] No change to the memory component.

[2] No change (or modest changes) to the controller component; the new controller can be used in standard systems as well as high-capacity memory systems as described herein.

[3] Change to the module—specifically a new buffer component design; the new module can be used in standard systems as well as high capacity systems.

By offering a standard mode and an enhanced mode of operation, the manufacturer of the controller component and the buffer component can deliver the same product into both standard motherboards and improved, high capacity motherboards.

CA Link of Improved Memory System

In FIG. 2A, the physical signaling topology 210 of the CA line 201 and DQ links 202 are shown for an improved memory system. The CA link topology may be similar to the CA topology of the standard system. FIGS. 2A and 2B illustrate these similarities.

The CA link topology 110 includes a transmitter on a controller component 203 (also referred to herein as a memory controller but can be other components that control access to the memory modules) and a controlled-impedance wire on a motherboard substrate 220 and a termination resistor at the farthest end. These signals are typically received by buffer components on a module 206, such as by a CA buffer component 204. A receiver in a CA buffer component 204 in each module 206 connects to the CA link 201, adding multiple loads to the CA link 201. This is called a multi-drop topology. In other cases, the CA and DQ links may be buffer componented by the same component, or there may be a separate CA buffer component and a separate DQ buffer component (also referred to herein as DQ-BUF component).

The module load is primarily capacitive, and includes loading introduced by the socket connection to the module pin, the wire trace between the module pin and the buffer component, and the receiver circuit on the CA buffer component 204.

The receiver circuit includes the transistors forming the input amplifier as well as the protection devices which guard against electrostatic discharge. This protection device includes some series resistance, as well.

Because the CA link 201 is input only, the total capacitive load is relatively small. FIG. 2B shows a lumped capacitance $C_{CA}$ 207 representing this load.

The round trip propagation time from the motherboard connection to the CA buffer component 204 is typically short compared to the rise and fall times of the signal, so the parasitic elements may be lumped together.

If this round trip propagation time is relatively long (i.e. the CA buffer component 204 is further from the module connector pins), the parasitic elements are treated as a distributed structure, potentially creating reflections and adding to inter-symbol-interference (ISI) in a more complex way.

One effect of the loading on the CA link 201 is that it can reduce the propagation speed of on the motherboard links. This may cause a slight increase in command latency, but can be automatically compensated for since the CA links 201 include a timing signal CK which sees the same delay.

A second effect of the loading may be to reduce the characteristic impedance of the motherboard trace in the module section. FIG. 2B shows this. The impedance change between the loaded and unloaded sections of the motherboard links can also create reflections and add to ISI.

It is possible to adjust the trace width of the motherboard links, widening them in the unloaded sections and narrowing them in the loaded sections to reduce the impedance mismatch.

This can also be done to the trace widths on the module, to compensate for impedance variations through the socket structure that connects a module pin to a motherboard trace. This can be important because the socket structure changes the geometry and spacing of the two-wire conductor carrying the signal. This change can be seen in FIG. 2B when the two conductors are routed vertically from the motherboard to the module.

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

A third effect of the CA loading may be to cause attenuation of the signal at higher frequencies. This attenuation is caused, in part, by the parasitic series resistance in the input protection structure of the CA buffer component. The attenuation may become more pronounced for the higher frequency spectral components of the signal.

This attenuation may be greater than in the standard system. It should be noted that the attenuation per unit length may be about the same in both systems, but the CA wire is longer in the improved system to accommodate the additional modules, hence the increase.

This can be addressed by reducing the signaling rate of the CA link 201. The CA links 201 may have lower bit transfer rates than the DQ links 202. For example, a CA link 201 may transfer one bit per clock cycle, whereas the DQ links 202 transfer two bits per clock cycle (twice the signaling rate). The CA rate can be lowered further so that one bit is transferred every two clock cycles (this is called 2T signaling, as compared to the normal 1T signaling). This lower CA rate may be adequate to provide the command bandwidth needed by the memory system.

Another option is to add transmit equalization to the controller, or receive equalization to the buffer component. This causes the higher frequency components of the signal to be selectively amplified, to compensate for the attenuation (which affects the high-frequency components the most).

DQ Link of Improved Memory System

FIG. 2A illustrates a DQ link topology 210 with the DQ link 202 being point-to-point.

The DQ link topology 210 includes a transmitter and receiver on the controller 203 and a controlled-impedance wire on a motherboard substrate 120, as before. Inside the DQ buffer component 205 of a module 206, there is a termination device, a receiver, and a transmitter, as in the standard DQ link topology. There are several key differences in the way these are connected together, such as set forth below:

[1] The DQ link 202 connects to a single module 206 in a point-to-point topology. This gives the best possible signaling quality, since the receiver and transmitter are at opposite ends of a controlled-impedance transmission line, with a termination device enabled at the receiver end of the link. Optionally, a termination device can be enabled at the transmitter end to dampen reflection noise further.

[2] The DQ link 202 includes a segment (the "x" segment) of wire on the motherboard 220, a connection through a continuity module 219 (the "z" segment), and a second segment of wire on the motherboard 220 (the "y" segment). Some DQ links 202 may only go through a single segment of wire on the motherboard (no connection through a continuity module). FIGS. 2C and 2D illustrate this topology.

The continuity module 219 is a standard module substrate with no active devices. It plugs into a standard socket, and connects some of the DQ links to other DQ links with a controlled impedance wire.

This connection through a continuity module 219 may introduce some discontinuities to the link, mainly by the socket connection to the continuity module pins. This is because the geometry and spacing of the two-conductor transmission line changes at these socket connections.

Each DQ link 202 sees an impedance change at the meeting point of the "x" and "z" segments, and an impedance change at the meeting point of the "z" and "y" segments. These impedance changes can create reflections and add to ISI.

It is possible to compensate partially for these impedance changes by adjusting the trace widths if the DQ link 202 on the module 206. the total capacitive load is relatively small. FIG. 2B shows a lumped capacitance $C_{CA}$ 207 representing a load on the CA link 201 and FIGS. 2C and 2D show a lumped capacitance $C_{DQ}$ 208 representing a load of the DQ link 202.

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

Because of this simpler DQ link topology, the improved memory system may have better DQ signal quality (even with a continuity module 219 in one of the sockets as described herein). The improved system may also avoid the need to introduce idle cycles (bubbles) between accesses to different modules.

Memory Systems Details of a Standard Memory System

FIG. 3A shows a standard memory system 300 with three memory modules 302. The controller component 304 connects to one hundred and eight (108) DQ links and forty-one (41) CA links.

The 108 DQ links includes 72 DQ data-links and 36 DQS timing links. This link count may include extra links needed for standard error detection and correction codes. This includes standard (Hamming) ECC bit codes and standard "Chip-Kill®" symbol codes.

An improved controller component has been designed to operate with standard modules or with improved modules as described herein. A control register, or control pin, or some equivalent method selects the mode in the controller 203 for the motherboard and module environment in which it is used. A similar mode control method is used in the buffer devices on the improved module.

The forty-one (41) CA links include twelve (12) CS (chip-select) links for standard operation. This allows four ranks of memory devices on each of three standard modules.

Each of the three groups of four CS links is routed with a point-to-point topology to the appropriate module. The remaining CA links (with command, control and address) are connected to the three modules via motherboard wires in a multi-drop topology as previously discussed. For each command issued on the CA links, one of the 12 CS links is asserted, indicating which of the 12 ranks is to respond. Four of the twelve CS links and the twenty-nine other CA links may be received by the CA buffer component (CA-BUF) 314 on each module 302 and each module 302 receives a different set of four CS links. The 12 CS links and 29 additional CA links (with command, control and address) are connected to the 3 modules 202 via motherboard wires in a multi-drop topology as previously discussed.

The term "primary" refers to a link that connects the buffer component on the module 302 to the memory controller 304 via the motherboard. The term "secondary" refers to a link that connects the buffer component device 314 on the module 302 to memory devices (e.g., DRAM devices) at device sites 306.

The twenty-nine CA links and the four CS links are retransmitted in a secondary multi-drop topology to the 18 device sites on the memory module 302. A device site 306 can include one or more 4-bit memory devices. The example shown in FIG. 3 has two devices stacked at each site. Alternative devices can be disposed at the device sites 306, as illustrated in dashed blocks in FIG. 3A. For example, the device site 306 can be a ×4 single device, a ×4 two-die stack, or a ×4 micro-buffer with four die, as illustrated in FIG. 3A.

In each access, each DQ buffer component 315 accesses two of the {2,4,6,8} ×4-devices attached to its secondary DQ links. The selected devices couple to the two sets of primary DQ links to which the DQ buffer component 315 connects.

The primary DQ links use a multi-drop topology, as discussed previously with respect to FIGS. 1A-1D.

FIG. 3B shows a simplified view of the standard system with three modules in a standard configuration for purposes of description of various embodiments described herein. A slice 320 of one third of the DQ links are illustrated in FIG. 3B (i.e., 24×DQ plus 12×DQS connecting to three of the DQ buffer components). The other two thirds of the DQ links are similar but not illustrated for ease of illustration and description. The diagram also shows the CA-BUF component 314 and the CA links and CS links connected to the CA BUF component 314.

FIG. 3B also illustrates a simplified diagram 330 of a standard configuration of 3 modules 302. The simplified diagram 320 shows the six groups of data-links (each with 4×DQ and 2×DQS). The CA links and the CA-BUF component 314 are not shown explicitly. The three groups of CS links are also shown in the simplified diagram 330 (4× per module).

The simplified diagram 330 also shows a read access to the third module 302, with the individual data groups labeled {a,b,c,d,e,f} and with the CS group identified with arrows. This simplified format is useful for the description of the various improved configurations of dynamic point-to-point (DPP) topologies as described below.

A write access would be similar to the read access that is shown in the lower diagram. The direction of the arrows would be reversed, but each data group would follow the same path. For this reason, only the read access path is shown on these simplified diagrams.

FIG. 3B also shows a motherboard wiring pattern 350 for the multi-drop DQ links and the point-to-point CS links. This is identical to the topology shown for these links in the more detailed diagrams. This motherboard wiring pattern 350 is useful for the description of the various improved configurations of dynamic point-to-point (DPP) topologies as described below.

Various embodiments below describe a memory module with multiple modes of operation. These embodiments of a memory module may operate in a first mode in which the memory module is inserted onto a first type of memory channel with multi-drop data-links which are shared with other memory modules connected to a same memory controller. The memory module may also operate in a second mode with point-to-point or point-to-multiple-point data-links which do not connect to the other memory modules as described herein. In one embodiment, the memory module includes DRAM devices, DQ buffer components coupled to the DRAMs. One of the DQ buffer components includes two primary ports to couple to two of the multi-drop data-links in the first mode and to couple to two of the data-links in the second mode. The DQ buffer component also includes two secondary ports coupled to two of DRAM devices. In another embodiment, the DQ buffer component includes three primary ports to couple to three primary ports to couple to three of the multi-drop data-links in the first mode and to couple to three of the data-links in the second mode and three secondary ports coupled to three of the DRAM devices.

The first mode may be a standard mode and the second mode may be an enhanced mode. That is the memory module may operate in a standard configuration, as described herein, as well as in one of the various configurations described herein. The memory modules may be inserted in 2-SPC (socket per channel) memory channels, as described with respect to FIGS. 4, 5A, and 5B, and may be inserted in 3-SPC memory channels, as described with respect to FIGS. 24, 25A, 25B, and 25C.

2-SPC Configurations

Figure 4:
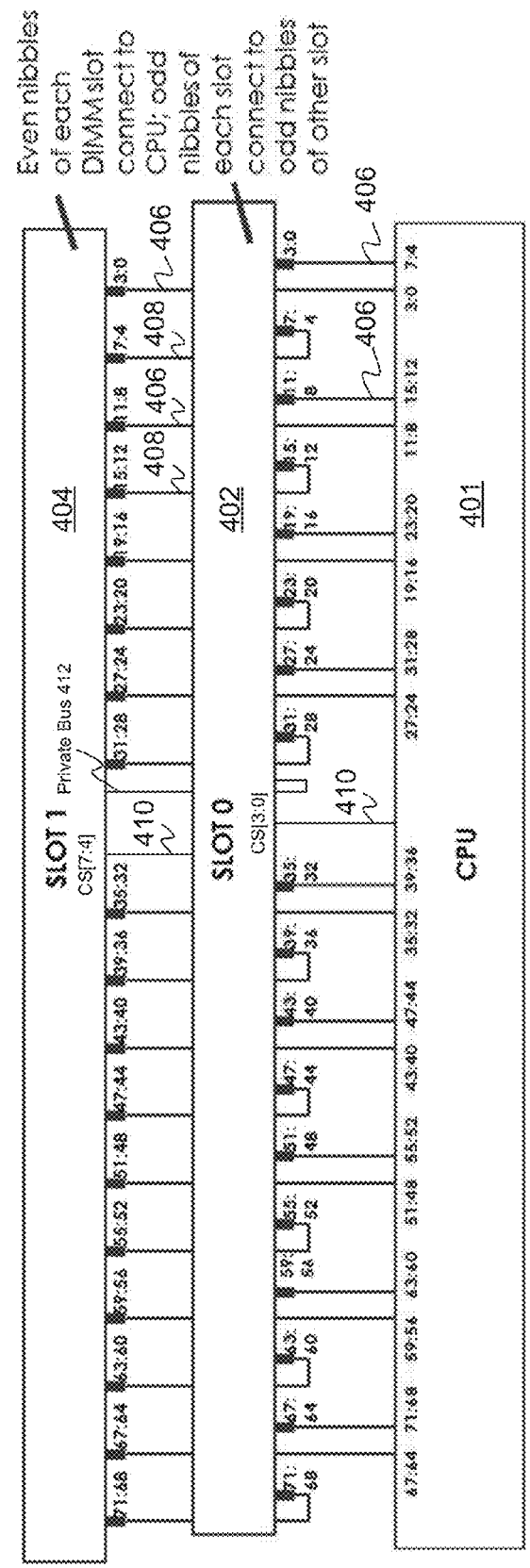
FIG. 4 is a diagram illustrating 2-SPC memory channel wiring with a central processing unit (CPU) slot and two DIMM slots for R+LRDIMMs coupled to the CPU slot with data lines according to even and odd nibbles according to one embodiment.

FIG. 4 is a diagram illustrating 2-SPC memory channel wiring 400 with a CPU slot 401 and two DIMM slots 402, 404 for R+LRDIMMs coupled to the CPU slot 401 with data lines according to even and odd nibbles according to one embodiment. A first set of data lines 406, corresponding to even nibbles, are connected to the DIMM slots 402, 404 and the CPU slot 401. A second set of data lines 408, corresponding to odd nibbles, are connected between the two DIMM slots 402, 404. That is odd nibbles of one DIMM slot is coupled to odd nibbles of the other DIMM slot. The first and second sets of data lines 406, 408 can accommodate 9 even nibbles and 9 odd nibbles for a 72-bit wide DIMM in 1 DPC or 2 DPC memory configurations.

The 2-SPC memory channel wiring 400 also includes CS lines 410 and a private bus 412. Details regarding one embodiment of the private bus 412 are described below with respect to FIG. 12A-B.

Figure 5A:
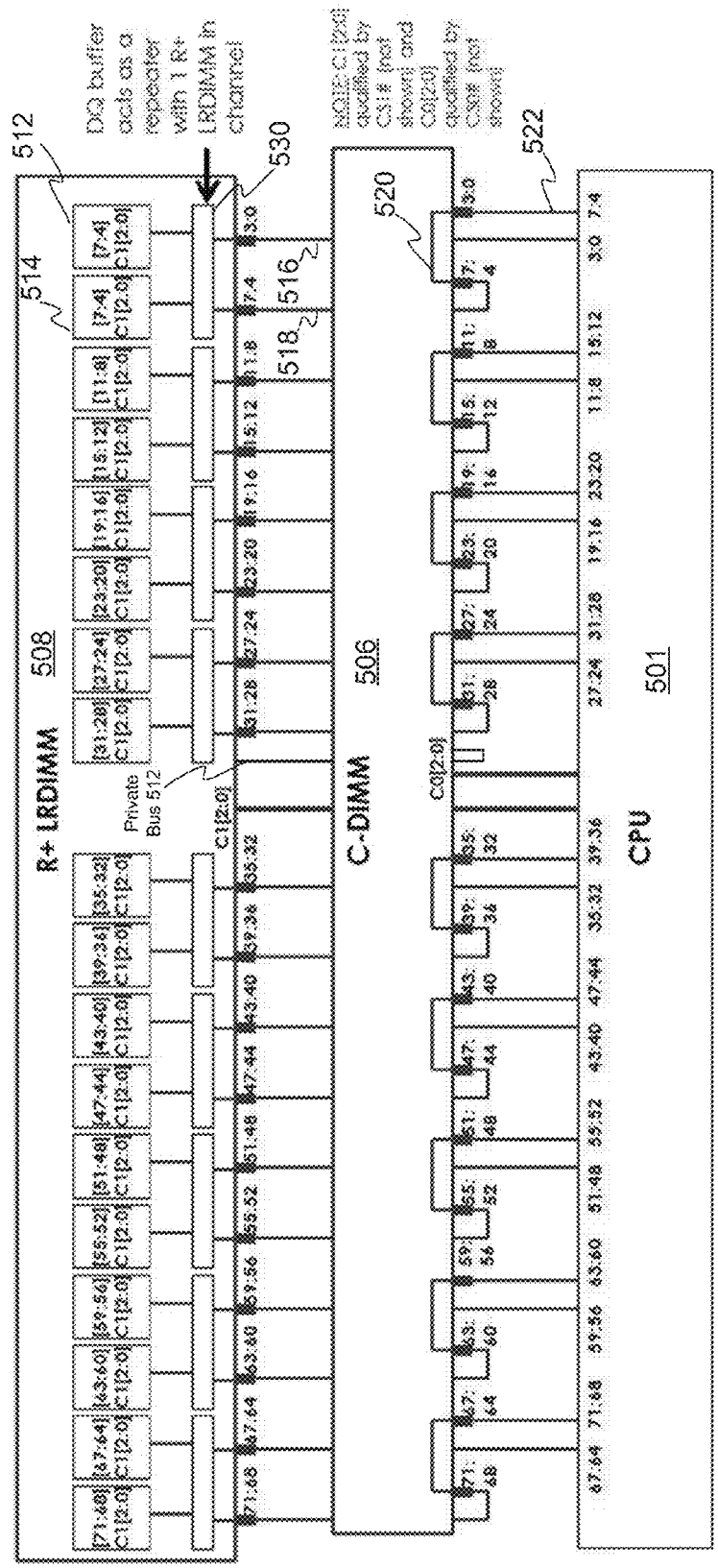
FIG. 5A is a diagram illustrating 2-SPC double data rate fourth generation (DDR4) channel with one DIMM slot populated with one R+LRDIMM and another DIMM slot populated with a continuity DIMM (C-DIMM) according to one embodiment.

FIG. 5A is a diagram illustrating 2-SPC DDR4 channel 500 with one DIMM slot populated with one R+LRDIMM 508 and another DIMM slot populated with a continuity DIMM (C-DIMM) 506 according to one embodiment. The R+LRDIMM 508 includes eighteen device sites, where each site may be a single memory component or multiple memory components. For ease of description, the data lines of two devices sites 512, 514 in the 2-SPC DDR4 channel 500 are described. A first device site 512 is coupled to the CPU 501 via data lines 516 (even nibble). A second device site 514 is coupled to the C-DIMM 506 via data lines 518 (odd nibble of R+LRDIMM to odd nibble of C-DIMM). The C-DIMM 506 use internal traces 520 to couple the data lines 518 to data lines 522, which are coupled to the CPU 501 (odd nibble).

In FIG. 5A, a DQ buffer component 530 is coupled between the first device site 512 and second device site 514 and the data lines 516 and 518, respectively. The DQ buffer component 530 acts as a repeater with one R+LRDIMM 508 in the 2-SPC DDR4 channel 500. It should be noted that C1[2:0] is qualified by CS1# (not illustrated in FIG. 5A) and C0[2:0] is qualified by CS0# (not illustrated in FIG. 5A).

Figure 5B:
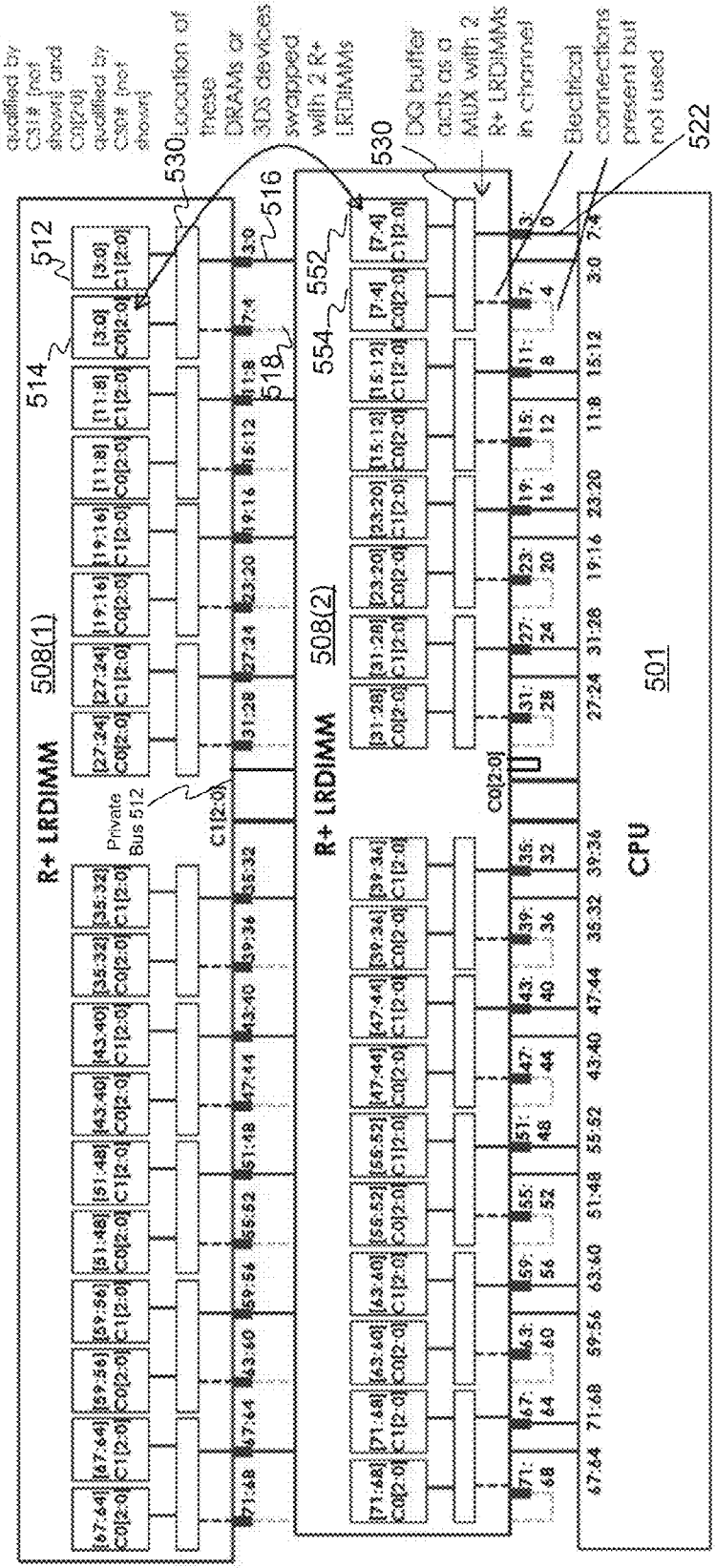
FIG. 5B is a diagram illustrating 2-SPC DDR4 channel with one DIMM slot populated with one R+LRDIMM and another DIMM slot populated with another one R+LRDIMM according to one embodiment.

FIG. 5B is a diagram illustrating 2-SPC DDR4 channel 550 with one DIMM slot populated with one R+LRDIMM 508(1) and another DIMM slot populated with another R+LRDIMM 508(2) according to one embodiment. The 2-SPC DDR4 channel 550 is similar to the 2-SPC DDR channel 500 as noted by similar reference labels. However, the other slot is populated with a second R+LRDIMM 508(2). The R+LRDIMM 508(2) includes eighteen device sites, where each site may be a single memory component or multiple memory components. For ease of description, the data lines of two devices sites 512, 552 in the 2-SPC DDR4 channel 550 are described. A first device site 512 is coupled to the CPU 501 via data lines 516 (even nibble) as described above with respect to 2-SPC DDR4 channel 500. A second device site 552 is coupled to the CPU 501 via data lines 522 (odd nibble). In effect, location of the second device site 514 of the 2-SPC DDR4 channel 500 is swapped with the first device site 552 of 2-SPC DDR4 channel 550 when both slots are populated with R+LRDIMMs 508(1), 508(2). It should be noted that the electrical connections for data lines 518 and internal data lines to the DQ buffer components are present on the motherboard and R+LDIMMs, but are not used.

In FIG. 5B, the DQ buffer component 530 acts as a multiplexer (MUX) with two R+LRDIMMs 508(1), 508(2) in the 2-SPC DDR4 channel 550. It should be noted that C1[2:0] is qualified by CS1# (not illustrated in FIG. 5A) and C0[2:0] is qualified by CS0# (not illustrated in FIG. 5B).

Improved Memory System—Configuration A

FIGS. 6A-C show an improved memory system with a first configuration A 600 with different combinations of one or two memory modules 602 in a 3-SPC memory channel according to one embodiment. FIGS. 6A-6B show simplified diagrams 620, 630 of two of the six read access cases for different module capacities {1,2,3}. The other simplified diagrams of the other read access cases for 3-SPC memory channels are described below. FIG. 6C shows a motherboard wiring pattern 650 for this first configuration A 600. The topology of the CS links is the same as in FIG. 3B, but the DQ link topology is different.

In this motherboard wiring pattern 650, each DQ link connects a memory controller 604 to a first module socket, and to only one of the second and third module sockets. The other DQ links on the second and third module sockets are connected together with motherboard wires that do not connect back to the controller 604. This is a key distinction with respect to the standard memory system of FIG. 3A. Each DQ link is multi-drop, but only with two module connections instead of three. This gives an improvement to the DQ signal integrity. Other configurations are shown later which have a single point-to-point controller to module connection on each DQ link.

Returning to FIGS. 6A-6B, the two two-module diagrams 620, 630 show the cases for two modules 602 in the memory channel. In both cases, the modules 602 occupy the second and third sockets, and the first socket is left empty.

The two-module diagrams 620 show a read access to the third module 602. The CS group links for the third module 602 are asserted, as indicated with arrow 617. The DQ buffer components 615 only enable the device sites 606 in the {a,c,e} positions. A private bus 622 allows a CA-BUF component (not illustrated) on the third module 602 to share its CS group with a CA-BUF component (not illustrated) on the second module 602. The details of this private bus 622 are described below. The DQ buffer components 615 on the second module 602 only enable the device sites 606 in the {b,d,f} positions, allowing the rest of the read access to be performed.

The two-module diagram 630 shows a read access to the second module 602. The CS group links for the second module 602 are asserted, as indicated with arrow 619. The DQ buffer components 615 only enable the device sites 602 in the {b,d,f} positions. It should be noted that that these are the device sites 606 that were not accessed in the previous case. The private bus 622 allows the CA-BUF component on the second module 602 to share its CS group with the CA-BUF component on the third module 602. The DQ buffer components 615 on the third module only enable the device sites 606 in the {a,c,e} positions, allowing the rest of the read access to be performed. Note that these are the device sites 606 that were not accessed in the previous case.

Improved Memory System—Configuration D

FIGS. 7A-7D show an improved memory system with a second configuration D 700 with different combinations of one or two memory modules in a 3-SPC memory channel according to one embodiment. The D configuration 700 has similarities to the A configuration 600 in that an access utilizes the DRAMs from more than one module 702, and CS (chip-selection) must be shared with the other modules 702 via a private bus 722. Configuration D 700 is different from configuration A 600 in that all three motherboard positions use DPP module sockets; there are no non-DPP module sockets used (this may also be the case for configurations E 800 and F 900 described below). Also, the configuration D 700 includes private buses 724 between two DQ buffer components 715 as illustrated in FIG. 7C.

FIGS. 7A-7B show simplified diagrams 720, 730 of two of the six read access cases for different module capacities {1,2,3}. The other simplified diagrams of the other read access cases for 3-SPC memory channels are described below. FIG. 7D shows a motherboard wiring pattern 750 for this second configuration D 700. The topology of the CS links is the same as in FIG. 3B, but the DQ link topology is different.

In this motherboard wiring pattern 750, each of six data groups (each group including 4×DQ links and a DQS± link) is routed from the memory controller 704 to the three module sockets. This pattern is repeated two additional times for the other 12 data groups, and the wiring for the CA, CK and CS links may be similar to what is shown in FIG. 3B.

This motherboard wiring example is only one way of connecting the controller and socket positions—there are other routing combinations which may achieve the same benefits. The motherboard wiring embodiments for this configuration share the characteristic that each motherboard wire (for the data groups) has a point-to-point topology, allowing the signaling rate to be maximized.

FIG. 7A-7B both show configuration D with a module 702 occupying the center and right-most sockets. The left-most socket contains a continuity module 719. All accesses involve some DRAMs on each module 702.

Data accessed on the modules 702 flow between the controller 704 and the DQ buffer components 715 through either [1] a continuity module 719 or [2] directly on a motherboard wire. The diagram shows the data direction for a read access. The arrows show the DRAM access, and the arrows show the movement through the continuity module.

In one embodiment, domain crossing logic in the memory controller 704 (see FIG. 22) has the DLY0.5 and DLY123 [1:0] values for each data group separately adjusted and maintained to account for the path differences. Alternatively, the controller 704 could use a FIFO (first-in-first-out) structure for performing this domain crossing. This would accommodate the path differences for the 18 data groups in each of the capacity cases. Alternatively, there are other functionally equivalent circuits that can be used for domain crossing logic with different tradeoffs.

It should be noted that in the two diagrams of FIGS. 7A-7B the mapping of DRAMs to data groups on the controller 702 is different for the two access cases. This may not be problematic since read and write accesses to the same DRAM use the same mapping and the mapping to different DRAMs can be different without affecting the memory subsystem.

Improved Memory System—Configuration E

FIGS. 8A-8D show an improved memory system with a third configuration E 800 with different combinations of one or two memory modules in a 3-SPC memory channel according to one embodiment. The E configuration 800 is similar to the D configuration 800 in that an access utilizes the DRAMs from more than one module 802, and CS information is shared with the other modules 802. Configuration E 800 is different from configuration D 700 in that the device sites 806A, 806B connected to a center DQ-BUF component 815 are also connected to private bus 824A, 824, respectively on edges of the other DQ-BUF components 815, as illustrated in FIG. 8C.

FIGS. 8A-8B show simplified diagrams 820, 830 of two of the six read access cases for different module capacities {1,2,3}. The other simplified diagrams of the other read access cases for 3-SPC memory channels are described below. FIG. 8D shows a motherboard wiring pattern 850 for this third configuration E 800. The topology of the CS links is the same as in FIG. 3B, but the DQ link topology is different.

In this motherboard wiring pattern 850, each of six data groups (each group including 4×DQ links and a DQS± link) is routed from the memory controller 704 to the three module sockets. This pattern is repeated two additional times for the other 12 data groups, and the wiring for the CA, CK and CS links may be similar to what is shown in FIG. 3B.

FIG. 8A-8B both show configuration E with a module 802 occupying the center and right-most sockets. The left-most socket contains a continuity module 819. All accesses involve some DRAMs on each module 802. Otherwise, the diagrams of configuration E in FIGS. 8A-8B are similar to the diagrams of configuration D.

Improved Memory System—Configuration F

FIGS. 9A-9D show an improved memory system with a fourth configuration F 900 with different combinations of one or two memory modules in a 3-SPC memory channel according to one embodiment. The F configuration 900 has similarities to the D configuration 900 in that an access utilizes the DRAMs from more than one module 902, and CS (chip-selection) must be shared with the other modules 902. Configuration F 900 is different from configuration D 700 in that the DQ buffer components 915 each connect to three primary group links and three secondary group links, as illustrated in FIG. 9C. Each DQ buffer component 915 of a pair also has a private port to the other component.

FIGS. 9A-9B show simplified diagrams 920, 930 of two of the six read access cases for different module capacities {1,2,3}. The other simplified diagrams of the other read access cases for 3-SPC memory channels are described below. FIG. 9D shows a motherboard wiring pattern 950 for this fourth configuration F 900. The topology of the CS links is the same as in FIG. 3B, but the DQ link topology is different.

In this motherboard wiring pattern 950, each of six data groups (each group including 4×DQ links and a DQS± link) is routed from the controller to the three module socket sites. This pattern is repeated two additional times for the other 12 data groups, and the wiring for the CA, CK and CS links may be similar to what is shown in FIG. 3B.

FIG. 9A-9B both show configuration F with a module 902 occupying the center and right-most sockets. The left-most socket contains a continuity module 919. All accesses involve some DRAMs on each module 902. Otherwise, the diagrams of configuration F in FIGS. 9A-9B are similar to the diagrams of configuration E.

Improved Memory System—Configuration B

FIGS. 10A-10D show an improved memory system with a fifth configuration B 1000 with different combinations of one or two memory modules 1002 in a 3-SPC memory channel according to one embodiment. FIGS. 10A-10B show simplified diagrams 1020, 1030 of two of the six read access cases for different module capacities {1,2,3}. The other simplified diagrams of the other read access cases for 3-SPC memory channels are described below. FIG. 10C shows a motherboard wiring pattern 1050 for this fifth configuration B 1000. The topology of the CS links is the same as in FIG. 3B, but the DQ link topology is different.

FIG. 10D shows a motherboard wiring pattern 1050 for the fifth configuration B 1000. This wiring pattern is the same as was used in Configuration A in FIGS. 6a-e. The topology of the CS links is the same as in FIG. 3B, but the DQ link topology is different. Each DQ link connects the memory controller 1004 to the first module 1002, but to only one of the second and third modules 1002. The other DQ links on the second and third module sockets are connected together with motherboard wires that do not connect back to the controller 1004. This is a key distinction with respect to the standard system of FIG. 3A. Each DQ link is multi-drop, but only with two module connections instead of three. This gives an improvement to the DQ signal integrity. Other configurations are shown which have a single point-to-point controller to module connection on each DQ link.

Returning to FIGS. 10A-10B, the two two-module diagrams 1020, 1030 show the cases for two modules 1002 in the memory channel. In both cases, the modules 1002 occupy the second and third sockets, and the first socket is left empty.

The two-module diagrams 1020 shows a read access to the third module 1002. The CS group links for the third module 1002 are asserted, as indicated with arrow 1017. The DQ buffer components 1015 enable the device sites 1006 in the {a,b,c,d,e,f} positions. It should be noted that this is different than the equivalent case in Configuration A 600. A private bus 1122 allows the CA-BUF component (not illustrated) on the third module 1002 to communicate with the CA-BUF component (not illustrated) on the second module 1002. The details of this private bus 1022 are described below. The DQ buffer components 1015 on the second module enable a bypass path 1024 for the {b,d,f} positions, allowing that portion of the read access to be transferred to the controller 1004. The details of this bypass path 1024 are described below. It should be noted that it is only necessary for a single bit to be communicated to indicate a bypass operation in the second module in Configuration B 1000, rather than the entire CS group as in Configuration A 600. Also, the bypass buss may include data connections to data lines and control connections to control lines.

The two-module diagram 1030 shows a read access to the second module 1002. The CS group links for the second module are asserted, as indicated with the arrow 1019. The DQ buffer components 1015 enable the device sites 1006 in the {a,b,c,d,e,f} positions. It should be noted that this is different than the equivalent case in Configuration A. A private bus 1022 allows a CA-BUF component (not illustrated) on the third module 1002 to share its CS group with a CA-BUF component (not illustrated) on the second module 1002. The details of this private bus 1022 are described below. The DQ buffer components 1015 on the third module enable a bypass path 1026 for the {a,c,e} positions, allowing that portion of the read access to be transferred to the controller 1004. The details of this bypass path are described below. Similarly, a single bit may be communicated to indicate a bypass operation in the third module, rather than the entire CS group as in Configuration A 600.

Improved Memory System—Configuration C

FIGS. 11A-C show an improved memory system with a sixth configuration C 1100 with different combinations of one or two memory modules in a 3-SPC memory channel according to one embodiment.

The C configuration 1100 has similarities to the B configuration 1000, in that an access utilizes the DRAMs from a single module, and bypass paths are required on the other modules 1102. Configuration C 1100 is different from configuration B 1000 in that all three motherboard positions use DPP module sockets; there are no non-DPP module sockets used (this is also the case for Configuration D 700, Configuration E 800, and Configuration F 900).

FIGS. 11A-11B show simplified diagrams 1120, 1130 of two of the six read access cases for different module capacities {1,2,3}. The other simplified diagrams of the other read access cases for 3-SPC memory channels are described below. FIG. 11C shows a motherboard wiring pattern 1150 for this sixth configuration C 1100. The topology of the CS links is the same as in FIG. 3B, but the DQ link topology is different.

In this motherboard wiring pattern 1150, each of six data groups (each group including 4×DQ links and a DQS± link) is routed from the memory controller 1104 to the three module sockets. This pattern is repeated two additional times for the other 12 data groups, and the wiring for the CA, CK and C S links may be similar to what is shown in FIG. 3B.

FIG. 11A-11B both show configuration C with a module 1102 occupying the center and right-most sockets. The left-most socket contains a continuity module 1119. All accesses involve DRAMs on a single memory module 1102.

Data accessed on the right-most module may flow between the controller 1104 and the DQ buffer components 1115 through either [1] a continuity module 1119 or [2] a bypass path 1124 in the DQ-BUF on the other unselected module. The diagram shows the data direction for a read access. The arrows show the DRAM access, including the movement through the continuity module 1119 and the movement through the bypass path 1124. The bypass path 1124 can have data lines, as well as control lines.

For all of these cases in FIGS. 11A-B, each access only uses DRAMs on a single module 1102. A first consequence is that no chip-selection information needs to be shared with the other unselected modules 1102. A second consequence is that the unselected module, whose DRAMs are not being accessed, is instead used to provide a bypass path 1124 through its DQ buffer components 1115 (except for the single module capacity case as described below). The bypass path 1124 may be implemented in various ways as described below.

Private Bus for Sharing CS

Figure 12A:
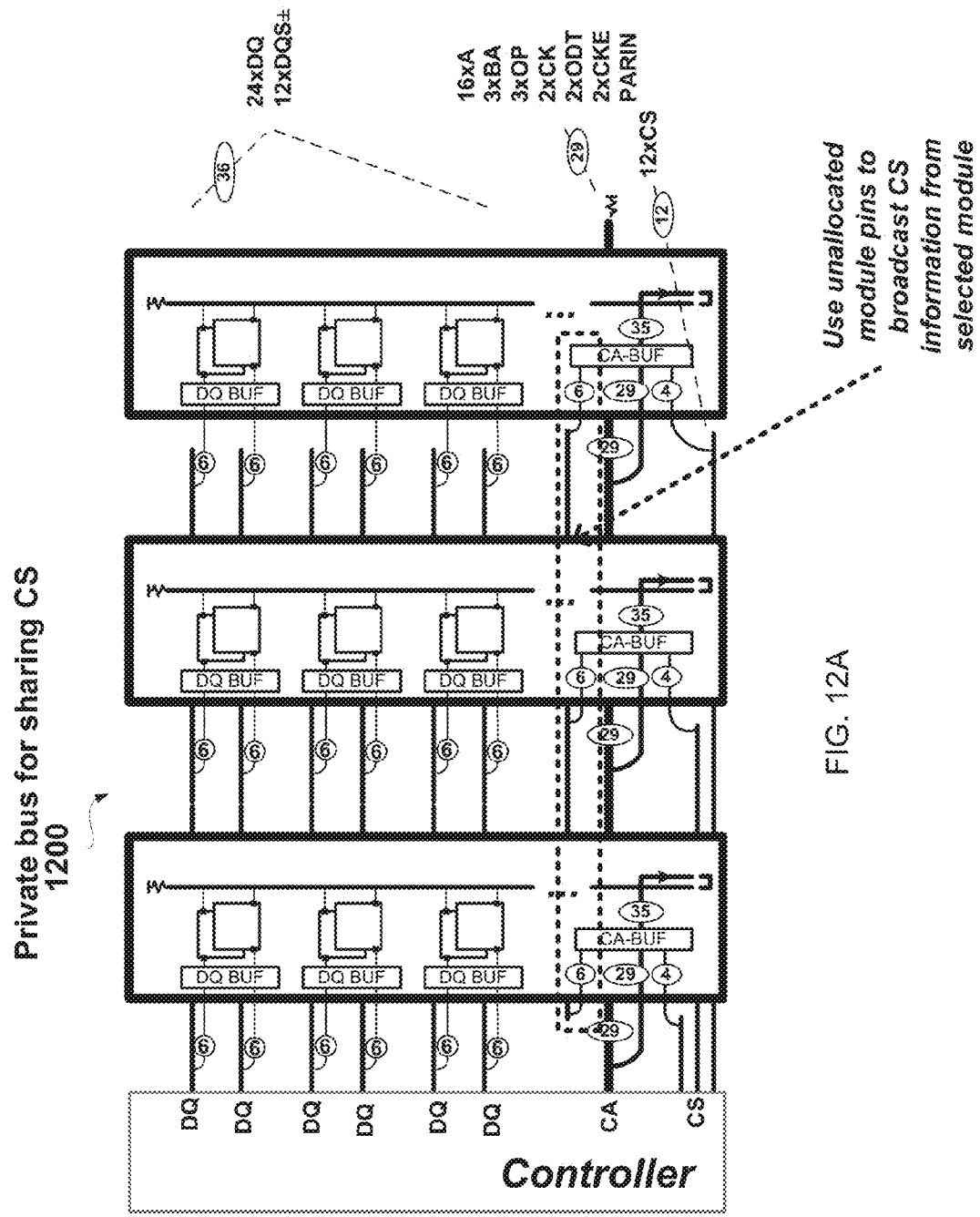
FIG. 12A is a block diagram illustrating a private bus for sharing CS information between memory modules according to one embodiment.

FIG. 12A is a block diagram illustrating a private bus 1200 for sharing CS information between memory modules according to one embodiment.

For example, a private bus for sharing CS information has been added to the link details of FIG. 3B. Alternatively, the private bus can be added to other link configurations.

The private bus uses unallocated module pins to connect the motherboard wires to each module. This example uses four unallocated pins. The motherboard wires connect the three modules together, but do not connect to the controller. Note that module pins that are allocated but not used in configurations A and B can also be used for the private bus.

FIG. 12B is a timing diagram 1250 of the private bus for sharing CS information according to one embodiment. FIG. 12B shows the transfer of a command on the primary CA links (a WR write command) from the controller to the CA-BUF components on each of the three modules. The 12 CS links carry the selection information in the same time slot, with one of the 12 links asserted to indicate the rank and module.

The timing of the CA and CS links is single-data-rate, also called "1T" timing. Alternatively, "2T" timing could be used, in which case each command occupies two clock cycles instead of one.

The CA-BUF that is selected by the primary CS links transmits on the private CS bus in the following cycle.

The two unselected modules receives this information so they can coordinate the actions of DRAMs on two modules, as required by Configuration A 600 in FIGS. 6A-B.

The CA-BUF components on the modules retransmit the command and the modified CS information onto the secondary links in the next cycle. The CS sharing actions require an additional clock cycle of latency, relative to a system, which uses a standard multi-drop topology or the DQ links.

In the case of Configuration B 1000 in FIGS. 10A-B, each command is interpreted by DRAMs which reside on a single module, so it is not necessary to share the CS selection information as for Configuration A 600 in FIGS. 6A-B.

Configuration B 1000 uses an unselected module(s) to coordinate a bypass operation for a column access command. However, the bypass operation does not occur until after the command-to-data delay of the column access (typically 8-12 clock cycles). Thus, Configuration B 1000 may not increase the latency of the command pipeline, although it would still require a private bus to send bypass information from the selected module to the unselected module(s). This case is not shown in the figures, but would utilize timing and logic similar to what is shown. It is also possible to use on-die termination (ODT) enable signals from the controller to the unselected modules to enable the bypass in the DQ-BUFs of the respective unselected module(s).

FIG. 12C is a block diagram illustrating a CA buffer component 1260 for sharing CS information according to one embodiment. FIG. 12C shows one embodiment of additional logic that can be used to support the private bus. The primary CK link supplies the timing signal for the CA-BUF component. A PLL/DLL feedback loop ensures that the internal clock is closely phase-matched to the clock that is received at the input pin. The secondary CK link employs a similar PLL/DLL feedback loop to ensure the transmitted clock is closely phase-matched to the internal clock. The primary CA and CS links are received with registers, which load on the positive-edge of the internal clock. The registered CS value is checked to see if one of the four bits is asserted, indicating a rank on this module is selected (using the four-input OR gate).

If so, the output-enable control signal is asserted for one cycle on the next falling edge of clock. This allows the four registered CS bits along with the two-bit module address to be transmitted onto the private shared bus.

The six-bit shared CS information is received by the other two unselected modules and loaded into registers on the next positive-edge of their internal clocks.

It is assumed that the modules are close enough together that the skew between the internal clocks of the selected module and the unselected modules is relatively small. This skew can be absorbed in the ½ cycle of margin between the transmitter edge and receiver edge for this bus.

The six shared CS bits are merged with the four primary CS bits into a final six bit value which can be transmitted (with the command) onto the secondary links. The six bit secondary value may cause the selected module and unselected module(s) to perform the command in the selected rank of devices.

The private CS bus and the secondary CS bus may be modified from the six-bit format described above. For example, the four decoded (one-hot) CS bits could be encoded into a two-bit value, and one of the four module addresses could be reserved as a NOP (no-operation). This would reduce the size of the CS bus and the secondary CS bus to four bits each. Alternatively, the one-hot CS signals can be sent as-is (i.e. un-encoded) on the private bus.

Figure 13:
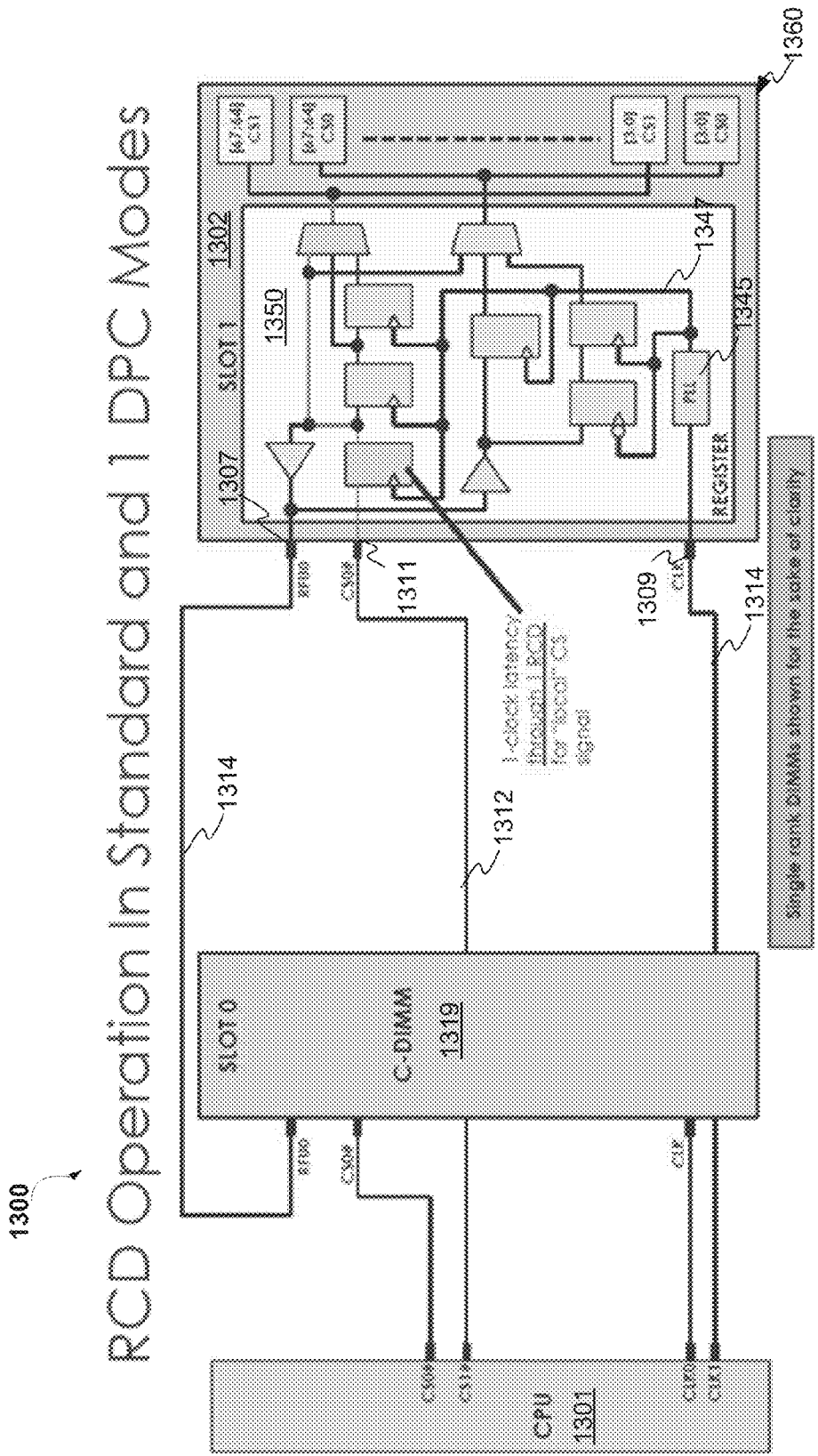
FIG. 13 is a block diagram of CA buffer component operation in standard and 1DPC modes according to one embodiment.

FIG. 13 is a block diagram of CA buffer component operation 1300 in a standard and 1 DPC modes according to one embodiment. A CPU slot 1301 is populated with a CPU, including a memory controller. A first DIMM slot 1302 (slot 0) is populated with a continuity module 1319 and a second DIMM slot 1304 (slot 1) is populated with a memory module with a CA buffer component 1350. The memory module in the second DIMM slot 1304 includes multiple device sites 1360. The device sites 1360 may each include a single memory component or each multiple memory components. These memory components may be DDR4 DRAM devices and the memory modules may be R+LRDIMMs. Alternatively, the memory components can be standard memory components in a standard configuration. It should be noted that FIG. 13 illustrates a single-rank LRDIMMs for sake of clarity, but similar data and control lines can be connected to other devices sites 1360.

The CA buffer component 1350 includes a primary interface with a first pin 1311, which is coupled to control line 1312 to receive a local chip select (CS) signal (CS1#), and a second pin 1307, which is coupled to a control line 1313 of a private bus to receive or send a copy of the CS signal passed through the continuity module 1319 CS0#, as described below. This can be considered a distant CS signal. The CA buffer component 1350 includes a secondary interface to select one or more of the device sites 1360. The CA buffer component 1350 selects the device sites 1360 when the local CS signal is received on the first pin 1311 (for slot 1).

In a further embodiment, the CA buffer component 1350 includes: multiple flip-flop coupled to the first pin 1311 clocked by a timing signal 1347. The timing signal 1347 can be generated by a phase locked loop (PLL) 1345, which is coupled to a fourth pin 1309 that receives a clock signal (CLK1) on control line 1314 from the CPU 1301. The CA buffer component 1350 also includes an output buffer coupled to the output of a first flip-flop. An output of the output buffer is coupled to the second pin 1307. The output buffer 1341 generates a second distant CS signal (e.g., CS_COPY#) on second pin 1307. The output buffer retransmits the local CS signal received on the first pin 1311 as the distant CS signal on the second pin 1307 to one or more other modules in other slots. Because slot 0 is populated with a continuity module 1319, the distant CS signal is not used. In the single rank DIMM configuration there is a 1-clock latency through the CA buffer component for local CS signals.

Although FIG. 13 illustrates two DIMM slots 1319, 1302 and only four device sites per DIMM slot, in other embodiments, more than two DIMM slots can be used and more than four device sites per DIMM slot may be used. FIG. 13 also illustrates single-device memory sites, but in other embodiments, multi-device memory sites may be used as described herein.

Figure 14:
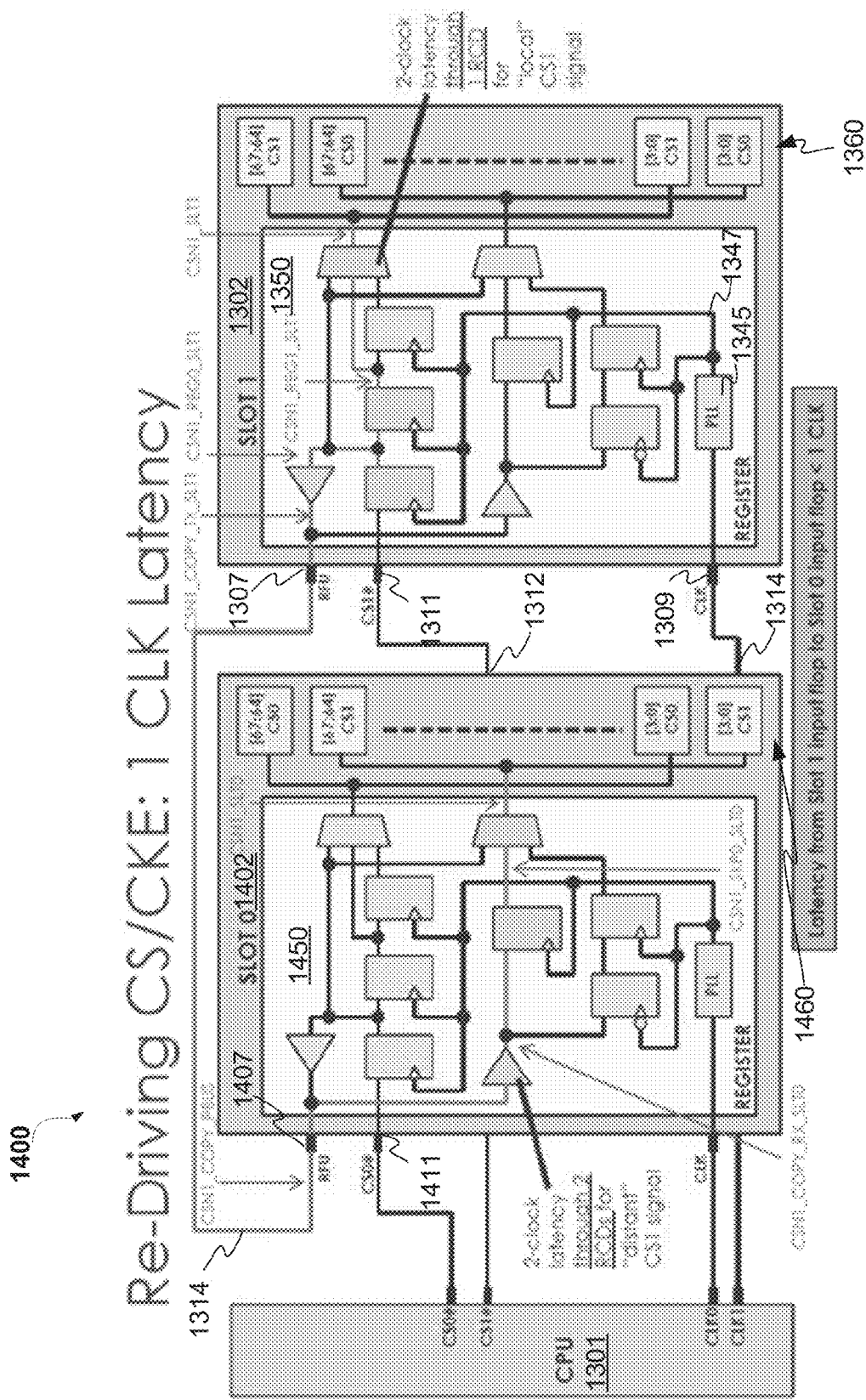
FIG. 14 is a block diagram of CS sharing logic for re-driving CS information to other memory modules according to another embodiment.

FIG. 14 is a block diagram of CS sharing logic 1400 for re-driving CS information to other memory modules according to another embodiment. The CS sharing logic 1400 is similar to the CS sharing logic in the CA buffer component described above with respect to FIG. 13 as noted by similar reference numbers, except the slot 0 is populated with a second memory module 1402 with a CA buffer component 1450 and device sites 1460. The device sites 1460 may each include a single memory component or each multiple memory components. These memory components may be DDR4 DRAM devices and the memory modules may be R+LRDIMMs. Alternatively, the memory components can be standard memory components in a standard configuration. It should be noted that FIG. 13 illustrates a two-rank LRDIMMs for sake of clarity, but similar data and control lines can be connected to other devices sites 1460.

The CA buffer component 1450 includes a primary interface with a first pin 1411, which is coupled to control line to receive a local chip select (CS) signal (CS0#), and a second pin 1407, which is coupled to the control line 1313 of the private bus to receive a copy of the CS signal from the CA buffer component 1350. This can be considered a distant CS signal. The CA buffer component 1450 includes a secondary interface to select one or more of the device sites 1460. The CA buffer component 1450 selects some of the device sites 1460 when the local CS signal is received on the first pin 1411 and selects some of the device sites 1460 when the distant CS signal is received on the second pin 1407. In the two-rank DIMM configuration, there is a 2-clock latency through CA buffer component 1350 for local CS1 signal and 2-clock latency through the CA buffer component 1350 and CA buffer component 1450 for distant CS1 signal. The latency from slot 1 input flop to slot 0 input flop is less than 1 clock cycle.

Although FIG. 13 illustrates two DIMM slots and only four device sites per DIMM slot, in other embodiments, more than two DIMM slots can be used and more than four device sites per DIMM slot may be used. FIG. 13 also illustrates single-device memory sites, but in other embodiments, multi-device memory sites may be used as described herein.

In another embodiment, the CS sharing logic can be configured for other timing configuration. In one embodiment, the CS sharing logic is configured so there is a 3-clock latency through CA buffer component 1350 for local CS1 signal and 3-clock latency through CA buffer component 1450 for distant CS1 signal. The latency from slot 1 input flop to slot 0 input flop is greater than 1 clock cycle and less than 1.5 clock cycle. In another embodiment, the CS sharing logic is configured so there is a 3-clock latency through CA buffer component 1350 for local CS1 signal and 3-clock latency through the CA buffer component 1350 and CA buffer component 1450 for distant CS1 signal, but the latency from slot 1 input flop to slot 0 input flop is greater than 1.5 clock cycles and less than 2 clock cycles.

Figure 15:
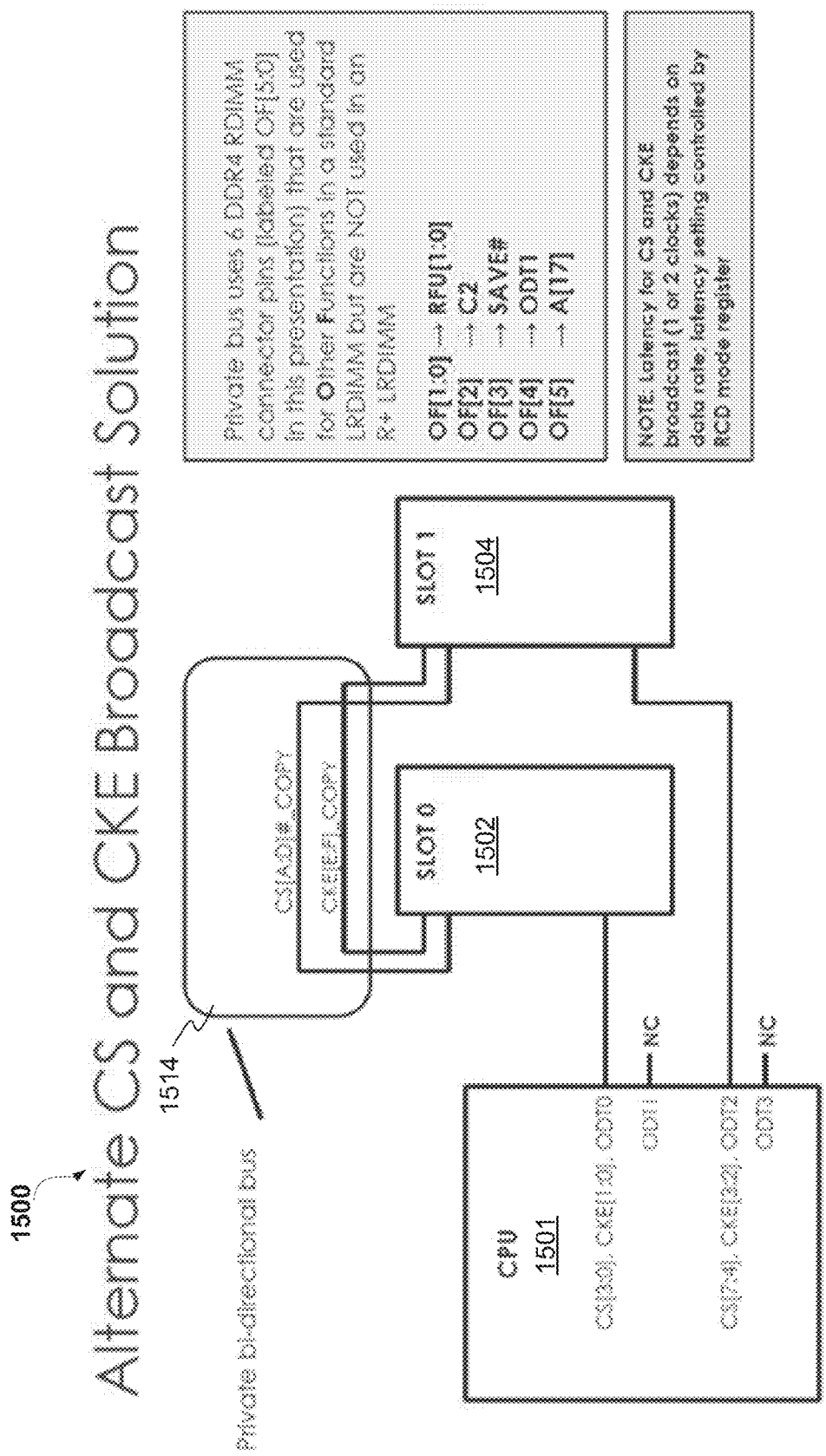
FIG. 15 is a block diagram of a broadcast solution according to another embodiment.

FIG. 15 is a block diagram of a broadcast solution according to another embodiment. In this solution, a private bi-directional bus 1514 is used between slot 0 1502 and slot 1 1504. The CPU slot 1501 sends primary CS and CK signals to the slots respectively, and the selected slot broadcasts a copy of the CS and CK signals to the other non-selected slot. The private bus 1514 uses 6 DDR RDIMM connector pins, e.g., other function pins such as OF[0:0] that are used in a standard LRDIMM mode, but may not be used in the R+LRDIMM mode. The latency for CS and CKE broadcast (1 or 2 clocks) depends on data rate. The latency setting may be controlled by a setting in a mode register in the CA buffer components (also referred to herein as RCD mode register).

Figure 16:
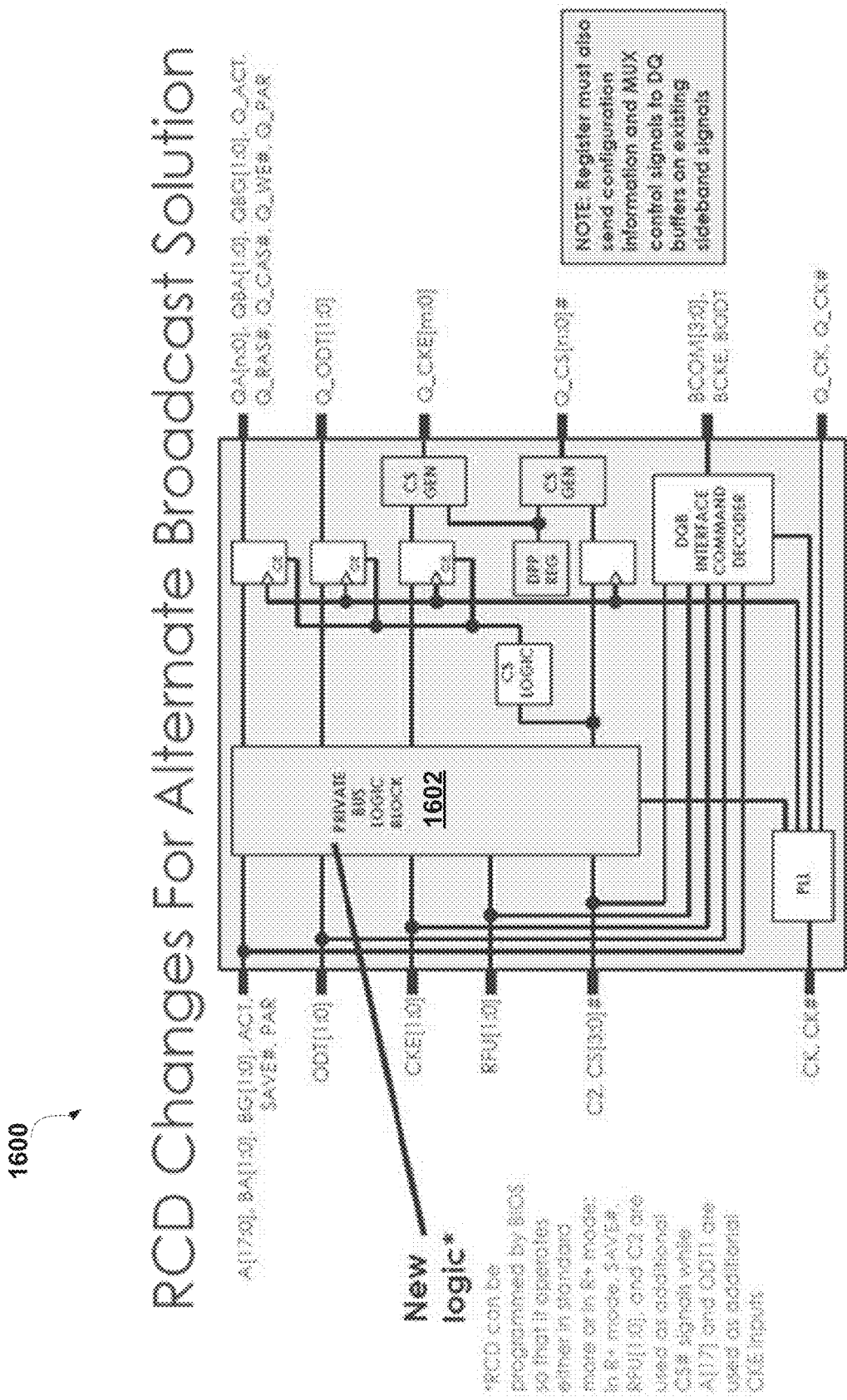
FIG. 16 is a block diagram of a CA buffer component with logic for the broadcast solution of FIG. 15 according to one embodiment.

FIG. 16 is a block diagram of a CA buffer component 1600 with logic 1602 for the broadcast solution of FIG. 15 according to one embodiment. The CA buffer component 1600 can be programmed by BIOS so that it operates either in standard mode or in an R+ mode (enhanced mode). In R+ mode, some signal lines are used as additional CS signals while other signal lines are used as additional CKE inputs. The CA buffer component 1600 sends configuration information and MUX control signals to DQ buffer components on existing sideband signals.

Figure 17:
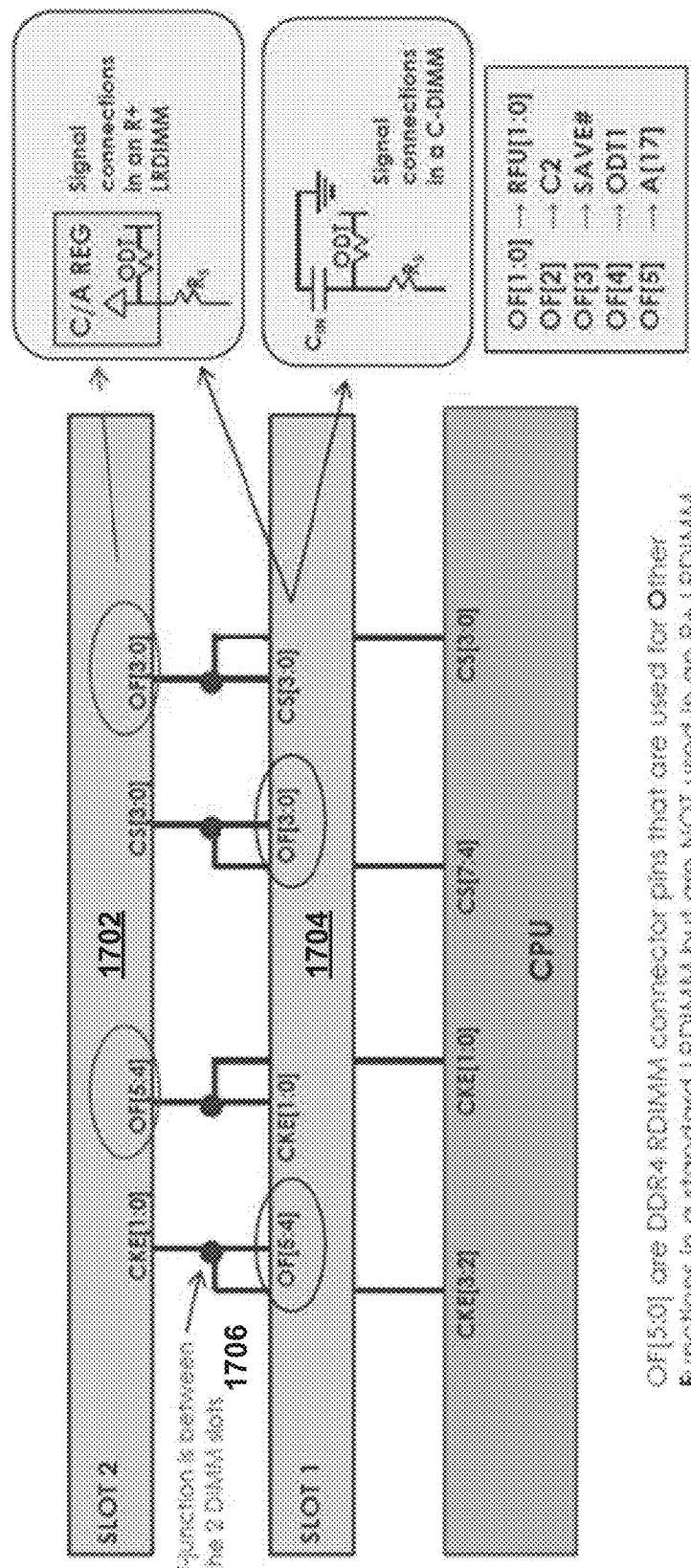
FIG. 17 is a block diagram illustrating a private bus for sharing CS information between memory modules according to another embodiment.

FIG. 17 is a block diagram illustrating a private bus 1700 for sharing CS information between memory modules according to another embodiment. Instead of having a CA-BUF component on the module selected by the primary CS signals transmit the CS on the private bus to CA-BUF components on other modules, the primary CS signals are connected to multiple DIMM slots using a T-topology wiring on the motherboard. In FIG. 17, there is a memory system with two modules 1702, 1704, where each module receives four primary CS signals from the controller (CS[3:0] to the first module and CS[7:4] to the second module).

The eight CS signals are connected on the motherboard substrate to junction nodes 1706 that are situated (on the motherboard) between the connectors for the two modules. Each node is then connected to the matching CS pin on one connector and an unused module pin on the other connector. So, the CS[0] signal from the controller is connected to the CS[0] pin of the first module and an unused pin of the second module. Similarly, the CS[4] signal from the controller is connected to CS[0] pin of the second module and an unused pin of the first module. The CS signals are then terminated on both the modules in an identical manner.

If the impedance of the wires from the module pins to the junction nodes 1706 is twice that of the wire from the junction node to the controller, then the T-topology is transparent to the controller since the wire from the controller to the two module pins appears as a single wire with constant impedance. In practice, it may not be possible to achieve twice the wire impedance. In such case, the impedance of the wire from the junction node to the module pin is made higher than that of the wire from the controller to the junction node.

In this embodiment, the module pins used for the private bus in the embodiment illustrated in FIG. 12A is used for the T-topology wiring.

In another embodiment, the CA-BUF component is designed to operate the secondary CA link with 2T timing. In this mode, the CA-BUF transmits the addresses (e.g. A[16:0], BA[1:0], BG[1:0], etc.) and commands (e.g. ACT, RAS, CAS, WE, etc.) for a first and second clock cycle (i.e. for 2 clock cycles) on the secondary CA link while transmitting the secondary CS signals only on the second clock cycle.

Figure 18:
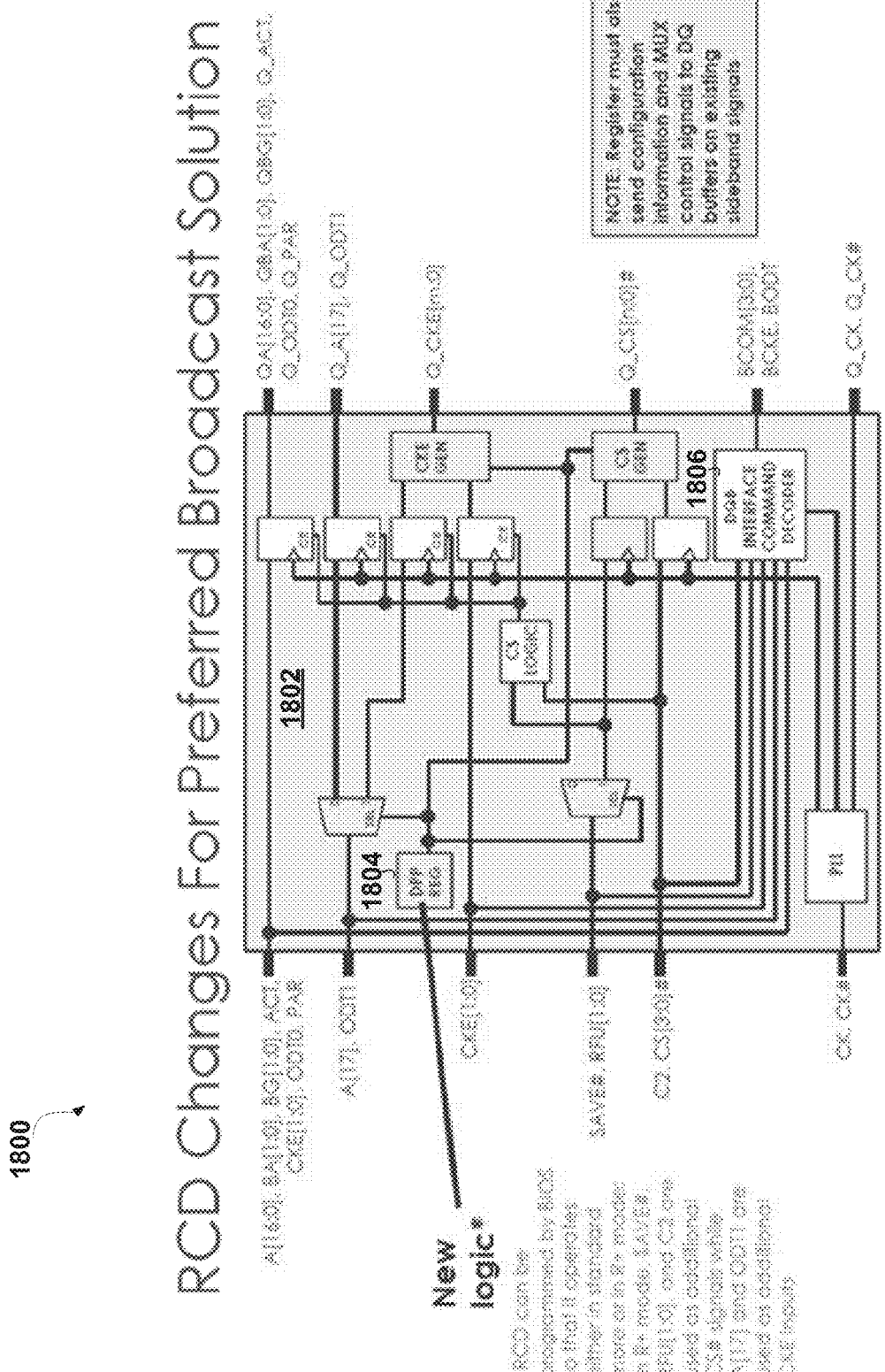
FIG. 18 is a block diagram of a register with logic for the broadcast solution of FIG. 17 according to one embodiment.

FIG. 18 is a block diagram of a register 1804 with logic for the broadcast solution of FIG. 17 according to one embodiment. The CA buffer component 1802 includes the register 1804 and a DQ buffer interface command decoder to send MUX control signals to DQ buffer components on existing sideband signals. The register 1804 can be programmed by BIOS so that it operates either in standard mode or in a R+ mode (enhanced mode). In R+ mode, some signal lines are used as additional CS signals while other signal lines are used as additional CKE inputs. The CA buffer component 1600 sends configuration information and MUX control signals to DQ buffer components on existing sideband signals.

Figure 19:
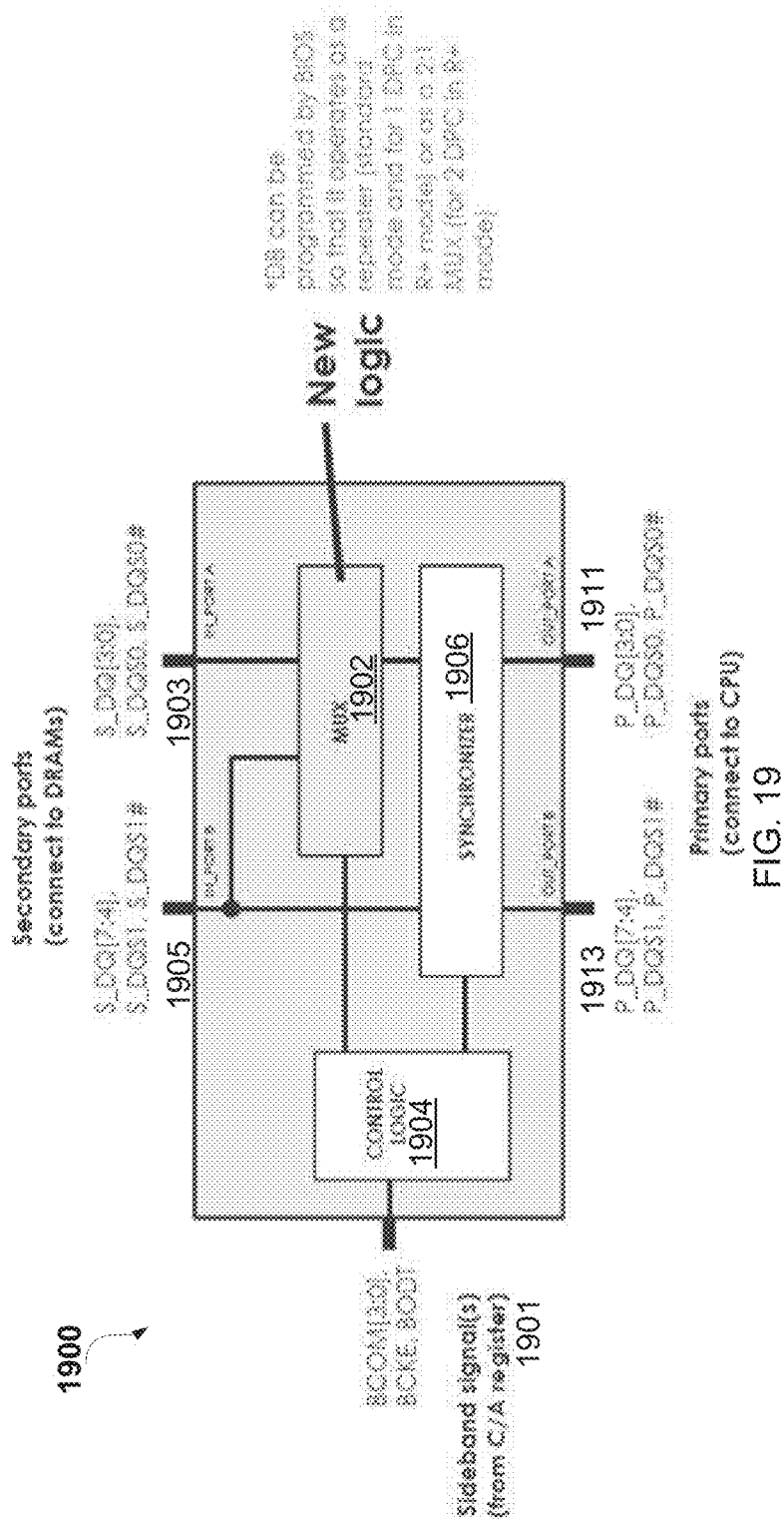
FIG. 19 is a block diagram of a DQ buffer component for two-slot DPP according to one embodiment.

FIG. 19 is a block diagram of a DQ buffer component 1900 for two-slot DPP according to one embodiment. The DQ buffer component 1900 includes a multiplexer 1902, control logic 1904 and a synchronizer 1906. The multiplexer 1902 is coupled to multiple input ports: IN_PORTA and IN_PORTB. The multiplexer 1902 receives a first nibble, including data signals S_DQ[3:0] and timing signals S_DQS0 and S_DQS0#. It should be noted that nibble, as used herein, refers to the data signals and the corresponding timing signals, and thus, is 6-bits. The multiplexer 1902 receives a second nibble, including data signals S_DQ[7:4] and timing signals S_DQS1 and S_DQS1#. In a further embodiment, the multiplexer 1902 receives a third nibble, including S_DQ[11:9] and timing signals S_DQS2 and S_DQS2# (not illustrated). The third port can be used for some SPC configurations, but these pins may not be needed for some configurations. It should be noted that the multiplexer 1902 is a bi-directional multiplexer, such as a 2:1 mux and 1:2 demux.

As described above, sideband signals 1901 can be generated by the CA buffer component. Control logic 1904 receives the sideband signals 1901 to control the multiplexer 1902 and the synchronizer 1906. The synchronizer 1906 synchronizes the data to be output on first and second ports (OUT_PORTA, OUT_PORTB). For example, the synchronizer 1906 can output data signals (e.g., P_DQ[3:0]) and timing signals 1911 (e.g., P_DQS0 and P_DQS0#) on first port and can output data signals (e.g., P_DQ[7:4]) and timing signals 1913 (e.g., P_DQS1 and P_CDQ1#) on the second port.

Domain Crossing Detail for Memory System

As described herein, a private bus distributes selection information to the other two unselected modules so they can participate in the access.

Figure 20:
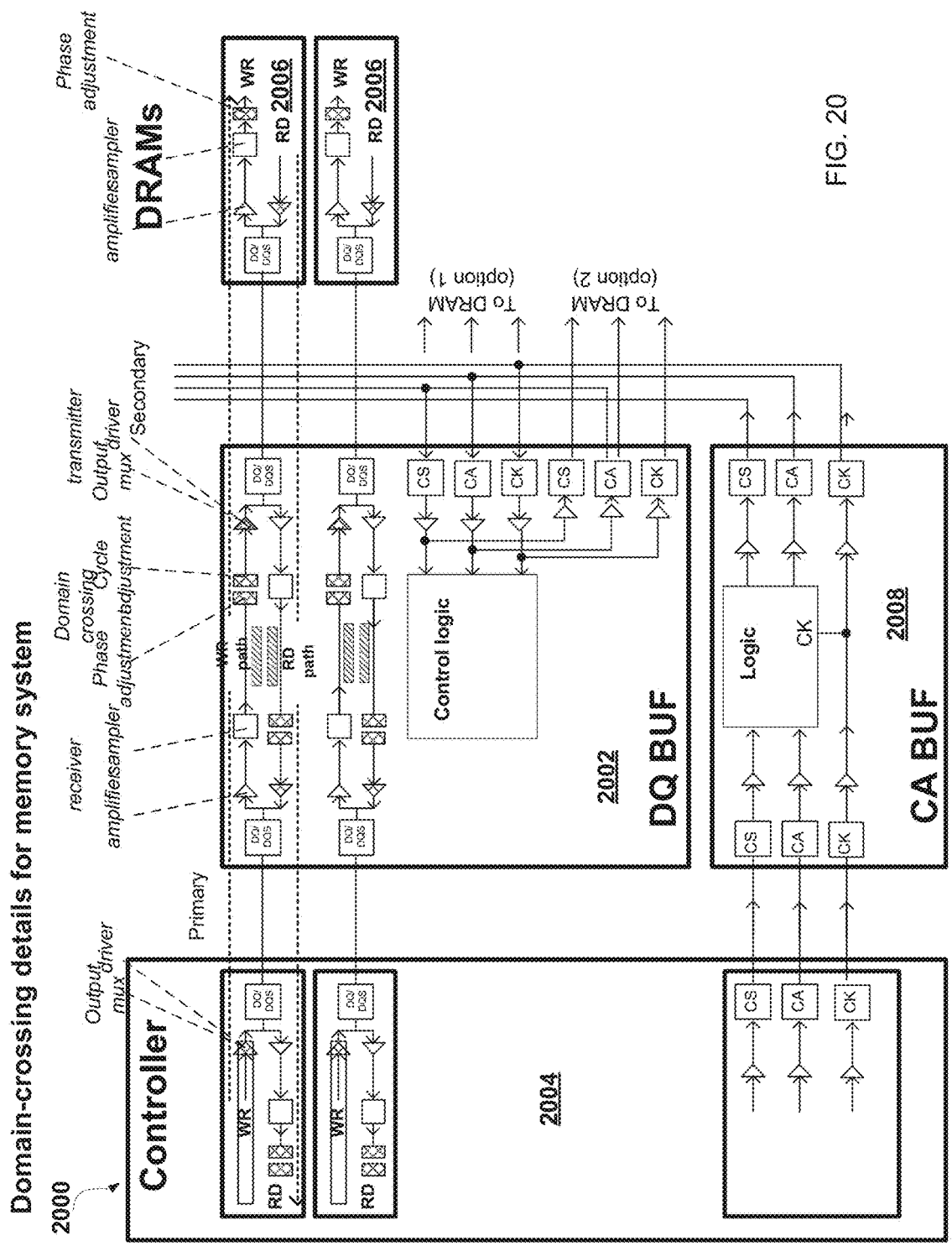
FIG. 20 is a block diagram illustrating domain-crossing logic of a memory system according to one embodiment.

FIG. 20 is a block diagram illustrating domain-crossing logic 2000 of a memory system according to one embodiment. FIG. 20 shows the write (WR) and read (RD) paths for the data group (e.g., 4×DQ and 2×DQS). The primary links and the secondary links connect to the bidirectional input-output pads, but inside the buffer component, the WR and RD paths are unidirectional. Although WR path is shown in the FIG. 20, the RD may be nearly identical, except where some differences as noted.

The DQS link is received and gated with a signal called DQS-EN. The DQS-EN is generated in the clock (CK) domain of the buffer component, and turns on in response to a column write command. The gated DQS loads two registers with write data on the DQ pads, such as on rising and falling DQS edges. These registers are labeled "sampler" in the figure. The write data is in the DQS domain. The gated DQS also samples the internal clock and the ninety degree delayed clock on each rising edge of DQS during a write transfer. The last sampled values are SKP[1:0], and may be used by delay adjustment logic. The sampled data is now passed to registers in the CK domain (illustrated with cross-hatching). For the minimum delay case, the data passes through the multiplexer in the phase adjustment block and the multiplexer in the cycle adjustment block, and is clocked by the two registers in a cycle adjustment block. The registered data is transmitted with the output multiplexer and driver, and may be aligned to the CK domain of the DQ buffer component. An enable signal OUT-EN is generated in the CK domain and turns on the output driver.

The multiplexers in the phase adjustment and cycle adjustment blocks can be set to other selection values to provide more delay. This may allow the delay adjustment logic block to automatically track the DQS timing drift so that the overall timing of the system is constant.

Note that the register placement in the phase adjustment block and cycle adjustment block does not necessarily reflect the best circuit embodiment. It is shown this way for clarity. In the actual circuit, the registers may be broken into half-latches to get the best possible timing margin.

A similar circuit can be used for the read path. The principle difference is that the DQS timing signal may not be center-aligned with the data (as it is with the write path), but may be edge-aligned with the data. As a result, a 90° delay may need to be inserted into the path of the gated DQS before it samples the read data. Also, there may be no 90° delay in the path of the CK used for the output multiplexer for DQS. This also means that the SKP[1:0] results from sampling CK with the gated DQS and the gated DQS delayed by 90°.

It should be noted that the 90° delay can typically be implemented by creating a mirror (copy) of the delay elements used by the phase-locked loop (PLL) or delay-locked loop (DLL) for the DQ buffer component.

Referring back to FIG. 20, the memory system includes a controller component 2004, a DQ-BUF component 2002, and CA-BUF component 2008 on a module in the center, and the DRAM components 2006.

The CA, CS, and CK primary links connect from the controller 2004 to the CA-BUF component. The CA, CS, and CK primary links are received by the CA-BUF component 2008 and are retransmitted on the secondary links on the module.

The secondary links can be received by the DQ buffer components 2002 and the DRAMs 2006 directly (option 1), or they can be received by the DQ buffer component 2008 and retransmitted to the DRAMs 2006 on a tertiary link (option 2). Option 1 may have slightly lower latency, but may require some timing adjustment for the write data. Option 2 may minimize the skew between the CA buffer component 2008 and write data at the DRAM 2006. Either option may work with the high capacity methods disclosed in this disclosure.

It is assumed that the controller component 2004, the CA-BUF component 2008, and the DQ buffer component 2002 all utilize PLL or DLL techniques minimize skew between their internal clock trees and the timing signals received and transmitted on the links. However, the timing signals may accumulate delay as they propagate on the links between the components. When two clock domains interact, they can have relative skew due to the unequal propagation paths their timing signals have traveled. This relative skew can be accommodated by providing a complementary delay to a signal passing from one domain to another.

Each DQ buffer component 2002 has two DQ paths, each connecting to a DQ link group on the primary side and a DQ link group on the secondary side. Each secondary link group (4×DQ and 2×DQS) connects to a ×4 device site with one to four DRAMs 2006. Other embodiments could use wider DRAMs 2006, with two or more DQ link groups connecting to the same device or device site.

The WR path begins in the controller component on the left side of the figure. The write data and its timing signal are transmitted from the controller clock domain. The write data and its timing signal are received and sampled on the DQ-BUF component 2002. The domain crossing blocks perform phase and cycle adjustment so the write data can be transferred to the internal clock domain of the DQ buffer component.

From there, the write data is retransmitted to the DRAM 2006, where is it is received and sampled. The skew between the write data and the CK domain on the DRAM 2006 may be small because both signals have travelled on similar paths from the clock domain of the DQ-BUF component 2002 (option 2 is assumed). As a result, the DRAM 2006 does not require the magnitude of domain-crossing adjustment needed by the DQ-BUF component 2002.

The RD path begins in the DRAM component on the right side of the figure. The read data and its timing signal are transmitted from the DRAM clock domain. The read data and its timing signal are received and sampled on the DQ-BUF component 2002. The domain crossing blocks perform phase and cycle adjustment so the read data can be transferred to the internal clock domain of the DQ buffer component 2002.

From there, the read data is retransmitted to the controller 2004, where is it is received and sampled. The skew between the read data and the clock domain on the controller may be large because of the large round trip delay to the DRAM 2006 and back. As a result, the domain crossing blocks perform phase and cycle adjustment so the read data can be transferred to the internal clock domain of the controller component.

Additional RD/WR Paths in DQ Buffer Component

Figure 21A:
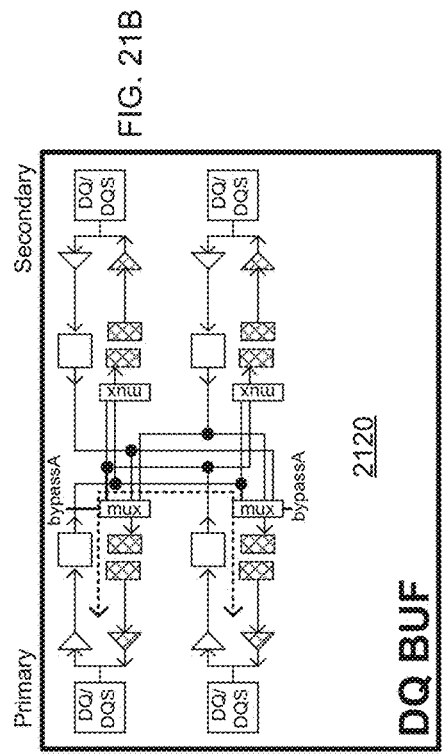
FIG. 21A is a block diagram illustrating a DQ buffer component with read and write paths between both primary and both secondary ports for Configuration A and Configuration B according to one embodiment.

FIG. 21A is a block diagram illustrating a DQ buffer component 2100 with read and write paths between both primary and both secondary ports for Configuration A and Configuration B according to one embodiment. It allows WR data to be transferred from either one of the two primary link groups to either one of the two secondary link groups. It also allows RD data to be transferred from either of the two secondary link groups to either of the two primary link groups.

This is accomplished by adding a 2-to-1 multiplexer in front of the domain crossing blocks of each read and each write path (four total). In general, each direct path and each alternate path may need its own set of DLY0.5 and DLY123 [1:0] values for the various domain crossing combinations.

Synchronous Bypass in DQ Buffer Component

Figure 21B:
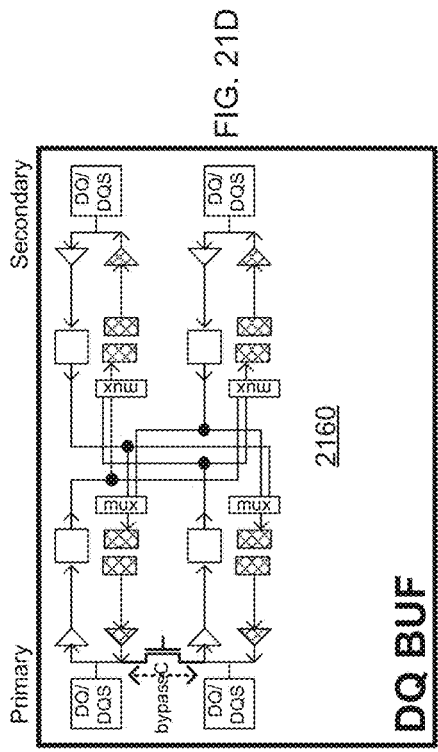
FIG. 21B is a block diagram illustrating a DQ buffer component with synchronous read and write bypass paths between both primary ports for Configuration B according to one embodiment.
Figure 21C:
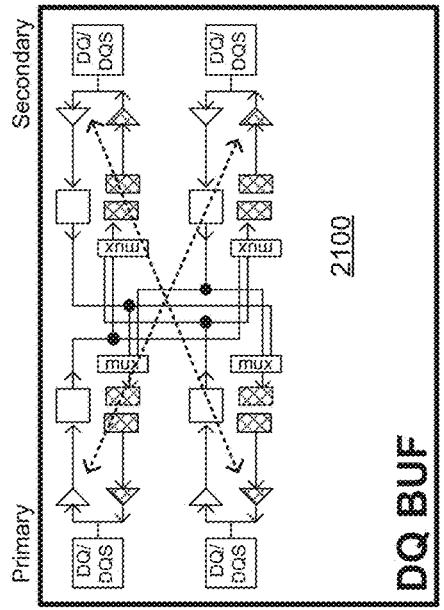
FIG. 21C is a block diagram illustrating a DQ buffer component with active asynchronous read and write bypass paths between both primary ports for Configuration B according to one embodiment.
Figure 21D:
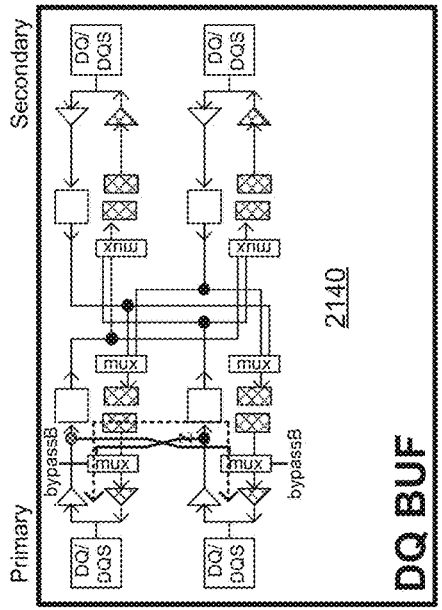
FIG. 21D is a block diagram illustrating a DQ buffer component with passive asynchronous read and write bypass paths between both primary ports for Configuration B according to one embodiment.

As described above, the bypass path 1124 may be implemented in various ways, as shown in FIGS. 21B, 21C, and 21D.

FIG. 21B is a block diagram illustrating a DQ buffer component 2110 with synchronous read and write bypass paths between both primary ports for Configuration B according to one embodiment. Each of the primary multiplexers in FIG. 23A is given a third input which allows RD/WR data from one primary link group to be transferred to the other. In general, each direct path, each alternate path, and each bypass path can have its own set of DLY0.5 and DLY123[1:0] values for the various domain crossing combinations.

The first method is synchronous and involves re-synchronizing the bypassed data. This is implemented by routing the clocked output of a primary receiver to the output multiplexer of the other primary transmitter. The clock domain crossing logic is included in this path.

The control register state needed for domain crossing between the two primary ports should be maintained for this method (e.g., this may be the DLY0.5 and DLY123[1:0] values which are updated after each transfer).

Active Asynchronous Bypass in DQ Buffer Component

FIG. 21C is a block diagram illustrating a DQ buffer component 2140 with active asynchronous read and write bypass paths between both primary ports for Configuration B according to one embodiment. This enhancement is an alternative to the enhancement shown in FIG. 21B. Each of the primary transmitters in FIG. 21B is given a 2-to-1 multiplexer which allows the data received on the other primary receiver to be directly retransmitted without synchronization. One possible advantage of this approach is latency because there is no synchronization to the internal clock domain of the DQ buffer component. One possible disadvantage is that there may be more variability in the asynchronous delay, and this may need to be accommodated in the range of the delay adjustment in the controller or buffer component, which eventually samples the signal.

The second method is asynchronous, and involves using just the non-clocked elements of the receiver and transmitter to provide amplification of the bypassed data, but no resynchronization.

Passive Asynchronous Bypass in DQ Buffer Component

FIG. 21D is a block diagram illustrating a DQ buffer component 2160 with passive asynchronous read and write bypass paths between both primary ports for Configuration B according to one embodiment. This enhancement is an alternative to the enhancements shown in FIG. 21B and FIG. 21C. Each of the links in a primary group in FIG. 21C is coupled with a large pass transistor(s) to the corresponding link in the other primary group. This allows the data arriving on one primary link group to propagate directly through to the other primary link group without synchronization. One possible advantage of this approach is latency because there is no synchronization to the internal clock domain of the DQ buffer component. One possible disadvantage is that there may be more variability in the asynchronous delay, and this may need to be accommodated in the range of the delay adjustment in the controller or buffer component, which eventually samples the signal. There may also be signal-integrity issues, since there may be loss and distortion through the pass transistors.

The third method is asynchronous, and involves using a transistor in a series-pass mode. This mode means the primary motherboard wires are coupled with a low-resistance connection with no amplification and no re-synchronization.

Even though no chip-selection information needs to be shared with the other DPP module, it is still necessary to provide a small amount of information to control the bypass path. A circuit similar to what is shown in FIG. 12A could be used for this.

A smaller amount of information needs to be transferred (typically one bit per access), and the information is transferred later in the access, so the access latency is not impacted.

FIG. 22 is a memory module card 2200 for two-socket DPP according to one embodiment. The memory module card 2200 may be a R+LRDIMM including multiple DRAM devices 2206 (e.g., 18 DRAMs), a CA buffer component 2002, and multiple DB buffer components 2204 (e.g., 9 DBs). There are new signals on the raw card (e.g., 8×CS+ 4×CKE total and RFU [1:0] (2×RFU)). In one embodiment, a R+LRDIMM can be similar to a standard LRDIMM but with some modifications. These modifications may include 1 additional CKE and 2 additional CS# signals routed to the DRAMs along with other C/A signals. The RFU[1:0] pins on connector may also be routed to the CA buffer component (RCD) on the R+LRDIMM and a larger RCD package can be used to accommodate 14 new signals pins (2 on primary side, 12 on secondary side).

Figure 23:
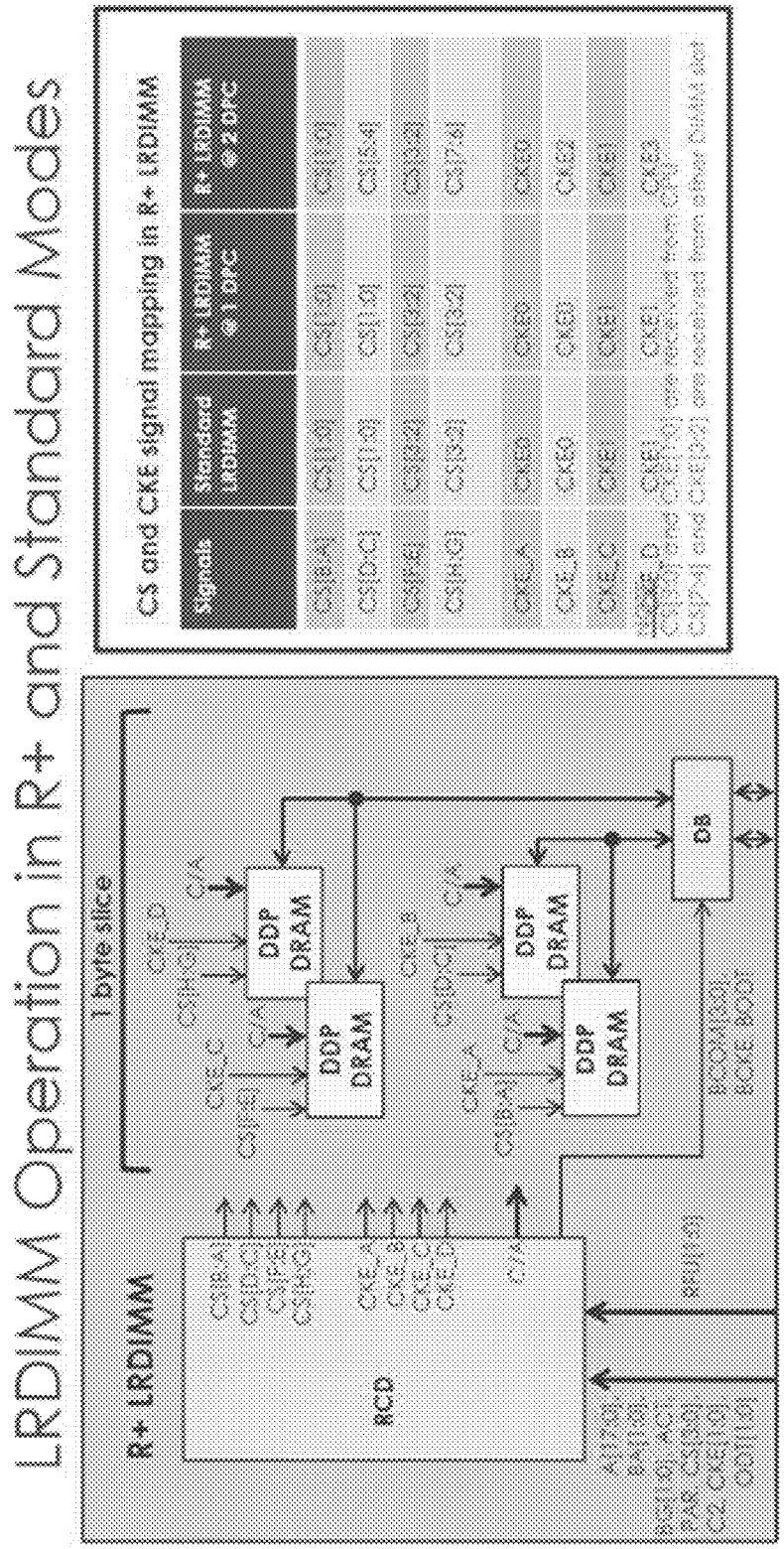
FIG. 23 illustrates LRDIMM operation of a memory module in an enhanced mode (R+) and in standard mode according to one embodiment.

FIG. 23 illustrates LRDIMM operation of a memory module in an enhanced mode (R+) and in standard mode according to one embodiment. FIG. 23 includes a table indicating the CS and CKE signal mapping in R+LRDIMM in both stand mode and enhanced mode.

The embodiments described above are directed to 1-DPC and 2-DPC memory configurations in both 2-SPC memory channel wiring and 3-SPC memory channel wiring. Some of these memory configurations have unused sockets and some memory configurations use continuity modules as described herein. The following briefly describes embodiments of 1-DPC, 2-DPC and 3-DPC memory configurations in 3-SPC memory channel wiring for new R+LRDIMMs.

3-SPC Configurations

Figure 24:
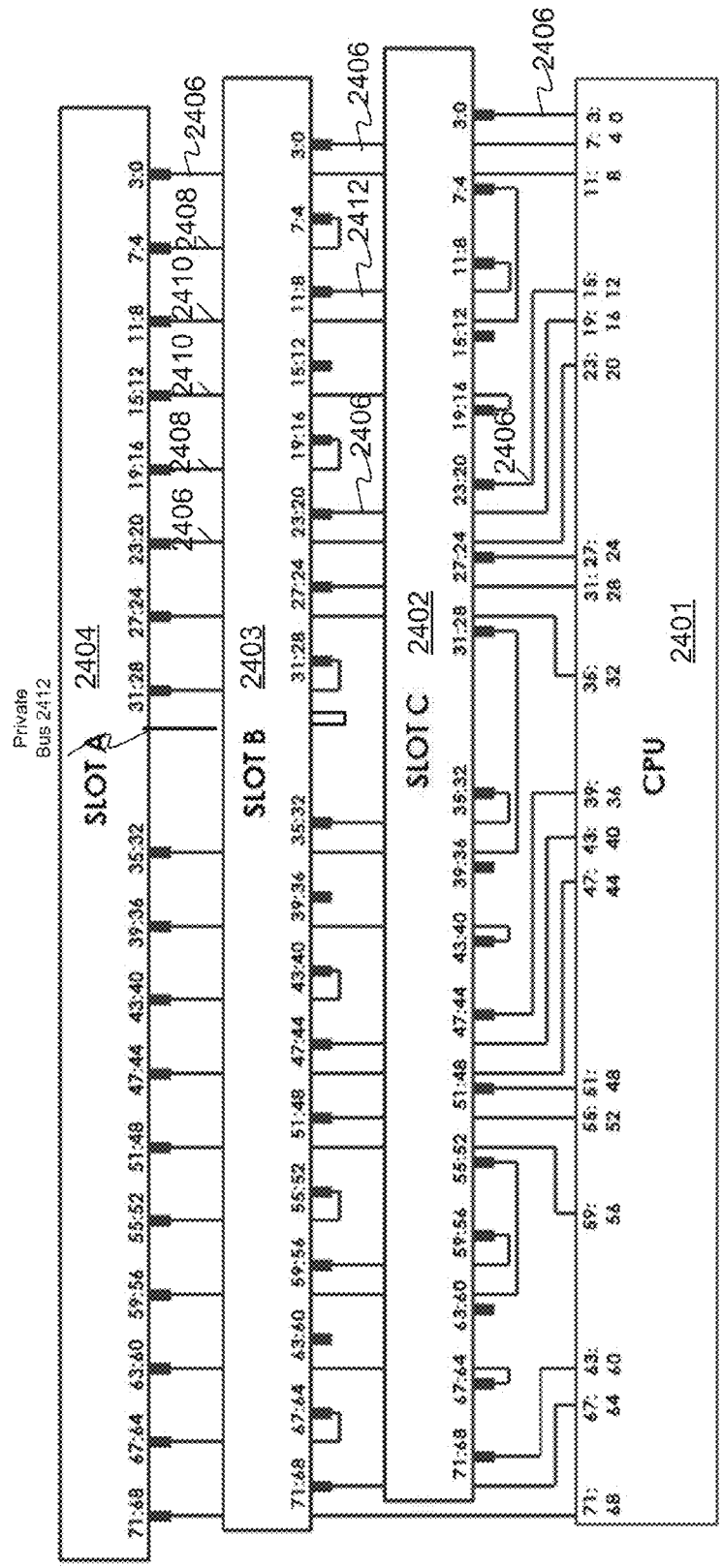
FIG. 24 illustrates 3-SPC memory channel wiring for new R+LRDIMM according to one embodiment.

FIG. 24 is a diagram illustrating 3-SPC memory channel wiring 2400 with a CPU slot 2401 and three DIMM slots 2402-2404 for R+LRDIMMs coupled to the CPU slot 2401 with data lines according to sets of nibbles according to one embodiment. A first set of data lines 2406 of the three DIMM slots 2402-2404 are connected to CPU slot 2401. A second set of data lines 2408 are connected between the second and third DIMM slots 2403-2404. A third set of data lines 2410 are connected between the first and third DIMM slots 2402, 2404. A fourth set of lines (private bus 2412) are connected between the first and second DIMM slots 2402, 2403. The data lines for only one 24-bit wide slice are labeled, but the first, second, third, and fourth sets of data lines can accommodate eighteen nibbles for 1 DPC, 2 DPC, and 3 DPC memory configurations, as described below with respect to FIGS. 25A-26C.

The 3-SPC memory channel wiring 2400 also includes CS lines (not illustrated) and a private bus 2412. Details regarding the private bus are described herein. In this embodiment, slots 1 and 2 are DIMM slots wired for DPP and slot 0 is a DIMM slot connected in parallel.

Figure 25A:
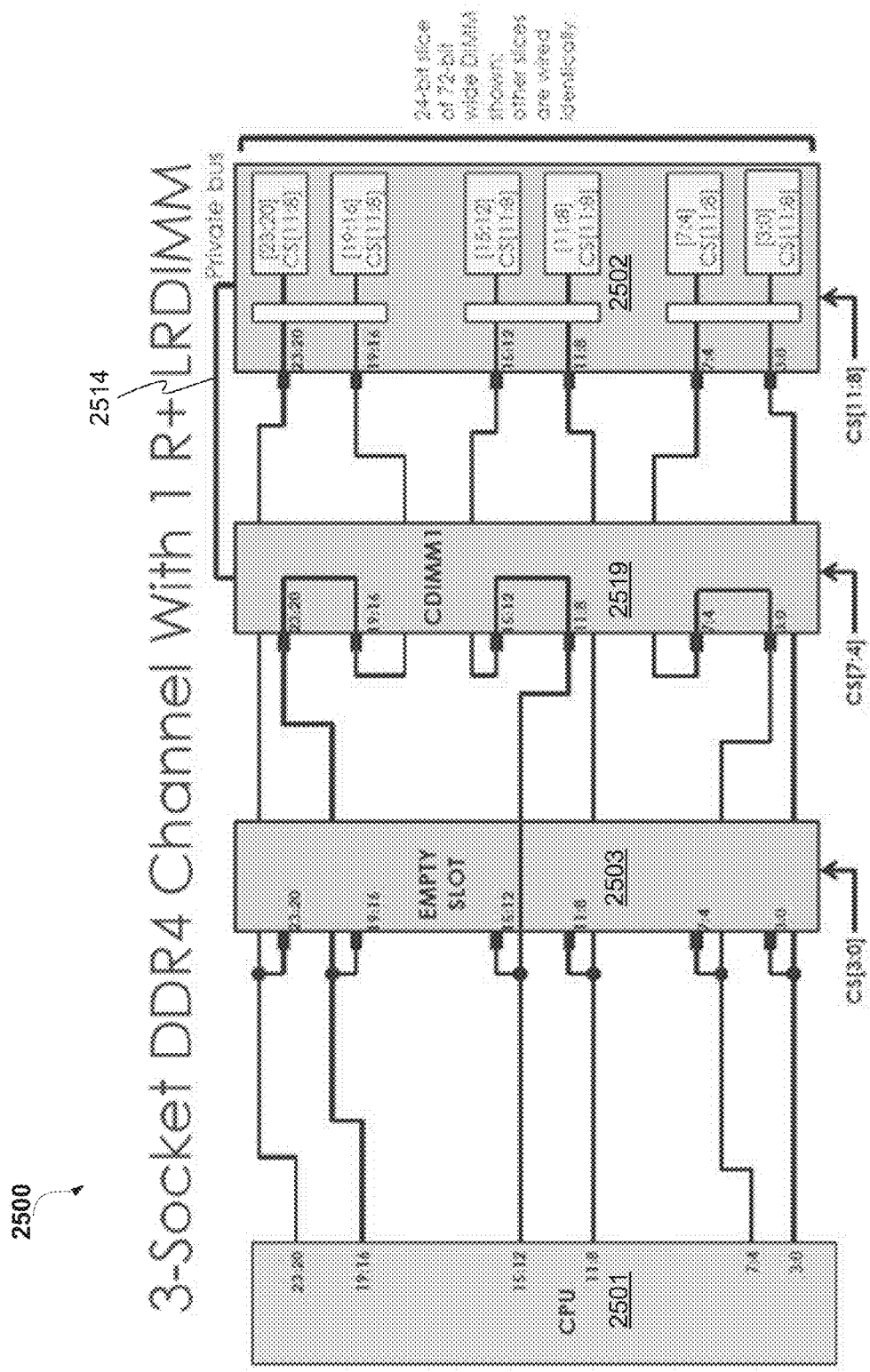
FIG. 25A illustrates 3-socket DDR4 Channel with 1 R+LRDIMM according to one embodiment.

FIG. 25A illustrates 3-socket DDR4 Channel 2500 with 1 R+LRDIMM according to one embodiment. A CPU slot 2501 is coupled to the 3-socket DDR4 Channel 2500. The 3-socket DDR4 Channel 2500 has one DIMM slot empty 2503, one DIMM slot populated with a continuity module 2519 and third DIMM slot 2502 populated with one R+LRDIMM. There is a private bus 2514 coupled between the second and third slots. A 24-bit slice of a 72-bit wide DIMM is illustrated, but other slices are wired identically. The slice of R+LRDIMM 2502 includes six device sites, where each site may be a single memory component or multiple memory components.

In FIG. 25A, a DQ buffer component is coupled between the first device site and second device site 614 and the data lines, respectively. A second DQ buffer component is coupled between the third device site and data lines. In another embodiment, the DQ buffer component is coupled to the three device sites (not illustrated in FIG. 25A). Electrical connections may be through the D-DIMM 2519.

Figure 25B:
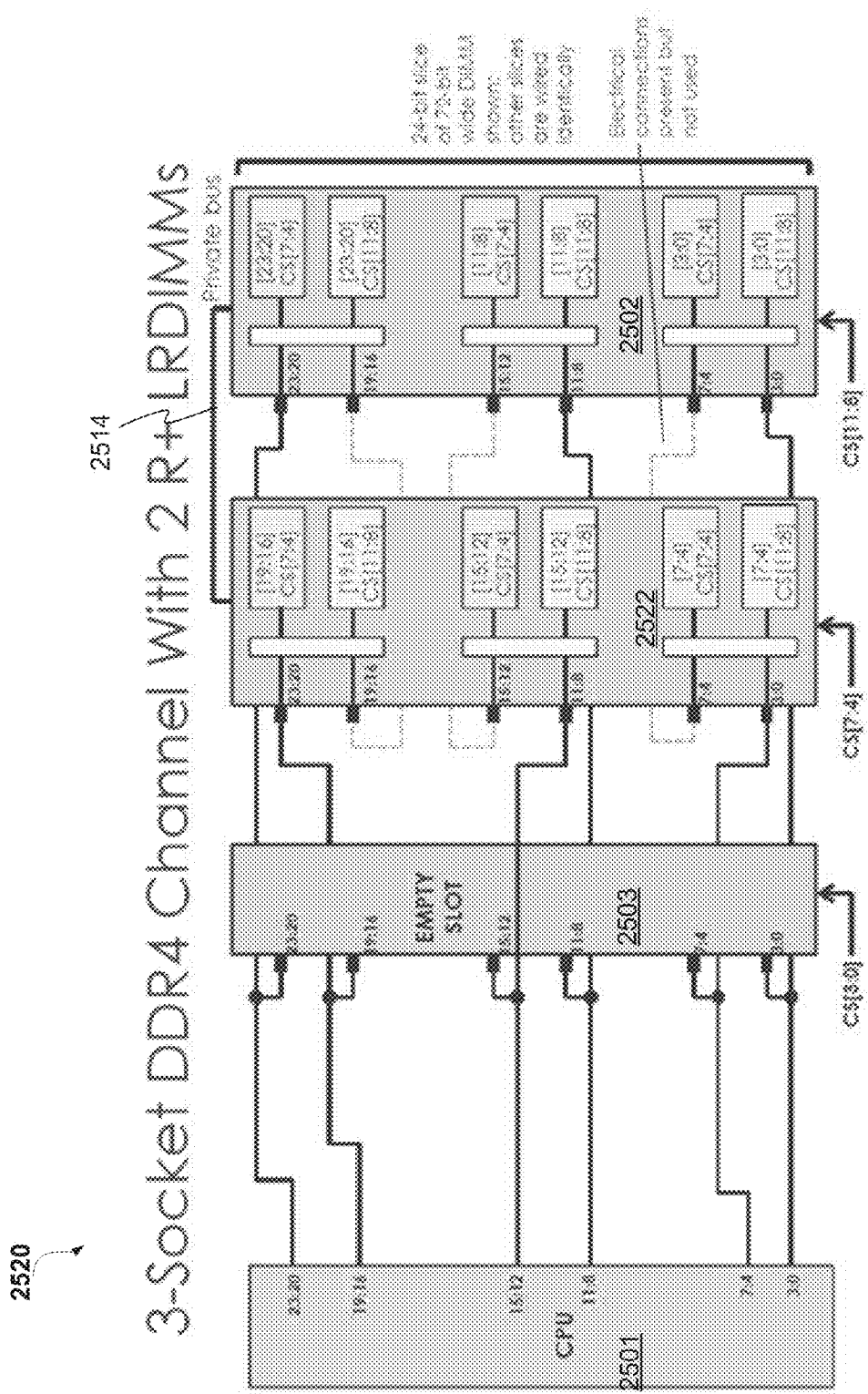
FIG. 25B illustrates 3-socket DDR4 Channel with 2 R+LRDIMMs according to one embodiment.

FIG. 25B illustrates 3-socket DDR4 Channel 2520 with 2 R+LRDIMMs according to one embodiment. The 3-SPC DDR4 channel 650 with two DIMM slots populated with R+LRDIMMs 2502, 2522 and another DIMM slot empty according to one embodiment. The 3-SPC DDR4 channel 2520 is similar to the 3-SPC DDR channel 2500 as noted by similar reference labels. However, the second slot is populated with a second R+LRDIMM 2522. The corresponding slice of the R+LRDIMM 2522 includes six device sites, where each site may be a single memory component or multiple memory components. There is a private bus 2514 coupled between the second and third slots. A 24-bit slice of a 72-bit wide DIMM is illustrated, but other slices are wired identically.

Figure 25C:
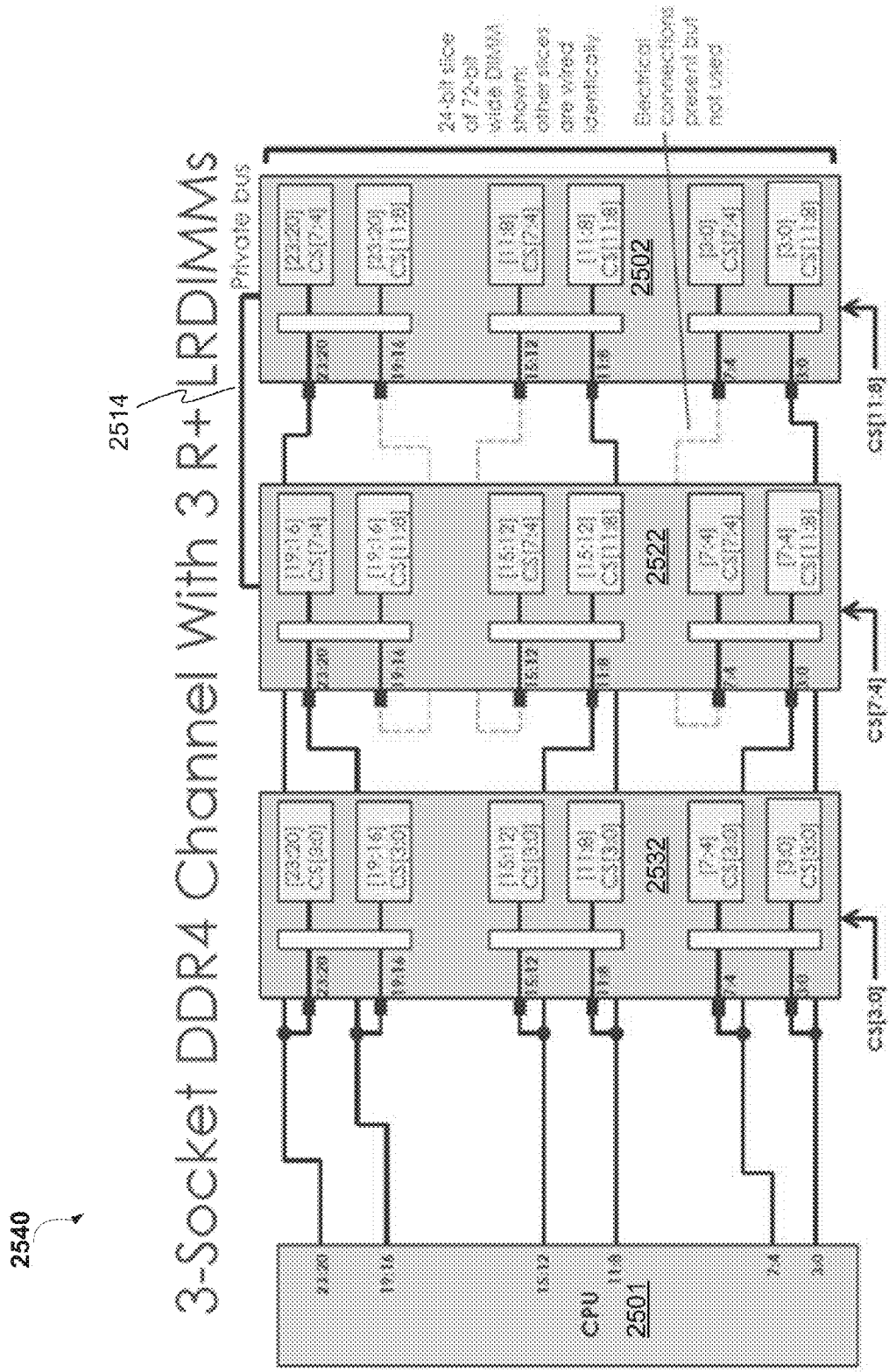
FIG. 25C illustrates 3-socket DDR4 Channel with 3 R+LRDIMMs according to one embodiment.

FIG. 25C illustrates 3-socket DDR4 Channel 2540 with 3 R+LRDIMMs according to one embodiment. The 3-SPC DDR4 channel 2540 with three DIMM slots populated with R+LRDIMMs 2502, 2522, 2532. The 3-SPC DDR4 channel 2540 is similar to the 3-SPC DDR channels 2500, 2520 as noted by similar reference labels. However, the first slot is populated with a third R+LRDIMM 2532. The corresponding slice of the R+LRDIMM 2532 includes six device sites, where each site may be a single memory component or multiple memory components. It should be noted that the electrical connections for some data lines are present on the motherboard and R+LDIMMs, but are not used. Similar data lines can be used to connect the other device sites of the three R+LRDIMMs 2502, 2522, 2532 for the other nibbles in the slice. There is a private bus 2514 of control lines coupled between the second and third slots. A 24-bit slice of a 72-bit wide DIMM is illustrated, but other slices are wired identically.

In some implementations, DDR4 R+LRDIMM requires that all CS# and CKE signals in a memory channel be broadcast to all the DIMM slots (or DIMM sockets or module sockets) in the channel. With DPP, each data signal is connected to only one R+LRDIMM. In a channel with multiple R+LRDIMMs, each and every R+LRDIMM responds to a Read or Write operation. The DDR4 specification allows up to 8 ranks per DIMM slot. In one implementation, for single rank (SR) DIMM, rank 0 is controlled by CS0#, CKE0, and ODT0, for double-rank (DR) DIMM, rank 1 is controlled by CS1#, CKE1, and ODT1, and for quad-rank (QR) DIMM or octa-rank (OR) DIMM, rank is controlled by C[2:0], CS#, CKE, and ODT. The CS# signal may be a 1-cycle signal and is connected to only one DIMM slot, and broadcasting CS# to all DIMM slots may violate register setup and hold times. The embodiments described below create a private shared bus between the DIMM slots in a memory channel using pins defined as not connected (NC) or non-functional (NF) in the DDR4 RDIMM specification. ODT pins in each DIMM slot may optionally be used for the private bus since all DQ nets are always point-to-point. CA buffer components (also referred to as CA register) may be modified for operation with a local CS signal (local CS#) and clock enabled (CKE) signals and a distant CS signal (distant CS#) and CKE signals. Local CS signals are signals received directly from the memory controller (MC) and distant signals are signals from another DIMM connector on the private bus. The CA buffer component treats local CS signals different than distant CS signals. For example, in one embodiment, local signals go through two flip-flops before being driven to the DRAM devices, whereas distant signals go through 1 flip-flop before being driven to the DRAM devices.

Configuration A (3-SPC)

FIGS. 26A-B show an improved memory system with the first configuration A 600 with different combinations of one or three memory modules in a 3-SPC memory channel according to one embodiment.

Returning to FIG. 26A, the three-module diagram 2620 shows a case of a single module 2602 in Configuration A. The module 2602 is placed in the third socket. The first socket is left unoccupied, and a continuity module 2619 is placed in the second socket. The arrows indicate the wires on the continuity module 2619 and the direction of data movement for a read access. The three-module diagrams FIG. 26B show the cases for three modules.

The three-module diagram 2630 of FIG. 26B shows a read access to the third module. This case is identical to the two-module case in FIG. 6A. The CS group links for the third module are asserted, as indicated with the arrow 2617. The DQ buffer components 2615 only enables the device sites 2606 in the {a,c,e} positions. A private bus 3622 allows the CA-BUF component 3650 on the third module to share its CS group with the CA-BUF component on the second module. The DQ buffer components on the second module only enable the device sites in the {b,d,f} positions, allowing the rest of the read access to be performed.

The three-module diagram 2640 of FIG. 26B shows a read access to the second module. This case is identical to the two module case in FIG. 6B. The CS group links for the second module are asserted, as indicated with the arrow. The DQ buffer components only enable the device sites in the {b,d,f} positions. Note that these are the device sites that were not accessed in the previous case.

A private bus 2622 allows the CA-BUF component on the second module to share its CS group with the CA-BUF component on the third module. The DQ buffer components 2615 on the third module only enable the device sites 2606 in the {a,c,e} positions, allowing the rest of the read access to be performed. Note that these are the device sites 2606 that were not accessed in the previous case.

The three-module diagram 2640 of FIG. 26B shows a read access to the first module. The CS group links for the first module are asserted, as indicated with the arrow. The DQ buffer components 2615 enable the device sites Z06 in the {a,b,c,d,e,f} positions, as indicated with the six arrows.

Configuration D (3-SPC)

Figures 27A, 27B:
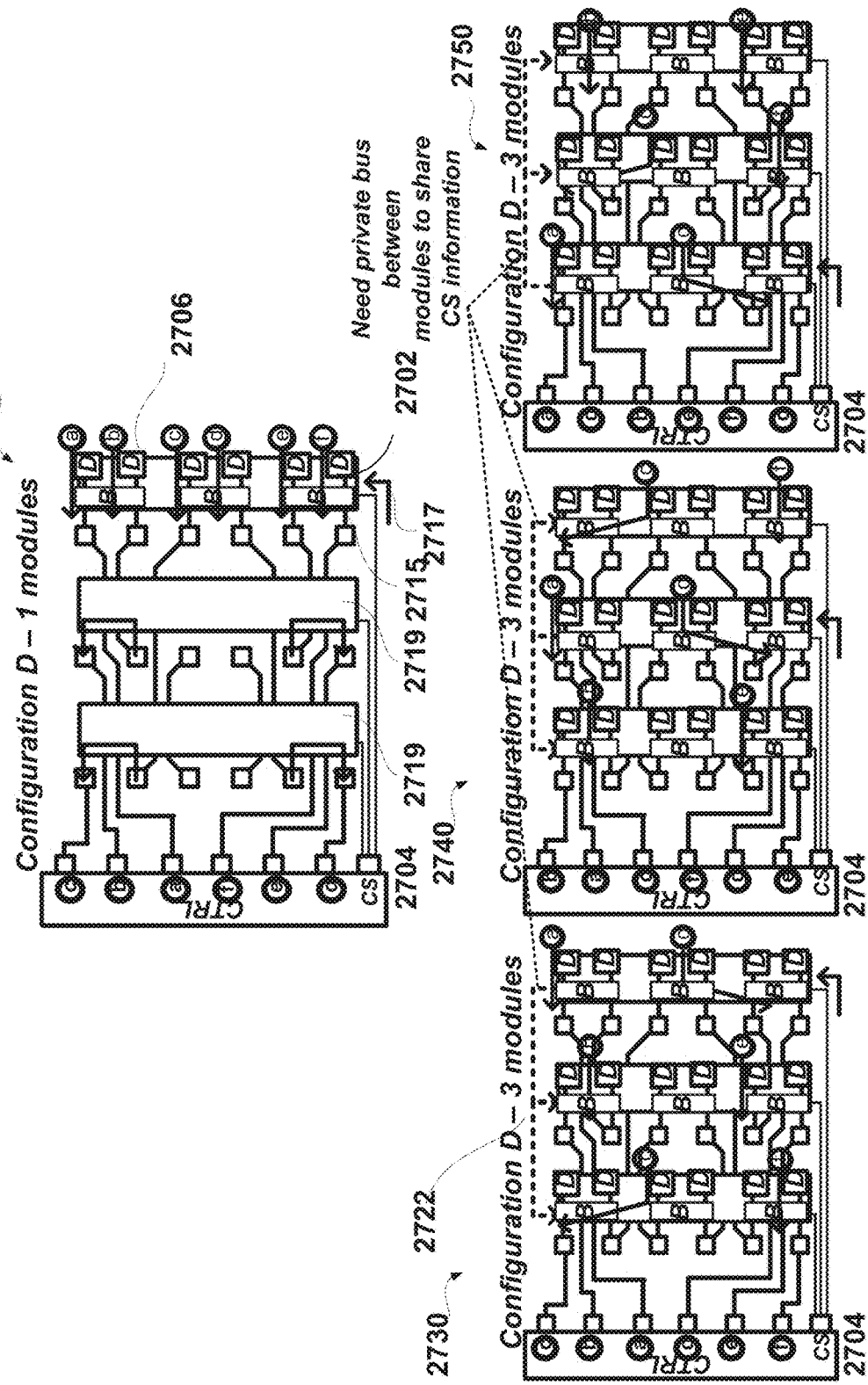
FIGS. 27A-B show an improved memory system with the second configuration D with different combinations of one or three memory modules in a 3-SPC memory channel according to one embodiment.

FIGS. 27A-B show an improved memory system with the second configuration D 700 with different combinations of one or three memory modules in a 3-SPC memory channel according to one embodiment.

The three-module diagram 2720 of FIG. 27A shows configuration D 700 with a single module occupying the right-most socket. The other two sockets contain continuity modules 2719. All accesses involve DRAMs from the single module 2702. The data accessed flows through either [1] directly through a motherboard wire or [2] one continuity module 2719 between the controller and the DQ buffer components. The diagram shows the data direction for a read access. The arrows show the DRAM access and the arrows show the movement through the continuity module 2719. No sharing of CS information is required for this case.

Alternate one module capacity can be achieved by putting the module in the center or left-most socket, with continuity modules in the two unfilled sockets (the wire pattern on the continuity modules are different for these alternate configurations).

The three-diagrams 2730, 2740, 2750 of FIG. 27B show configuration D 700 with modules occupying all three sockets. There are no continuity modules. All accesses involve some DRAMs from each of the modules.

Each data access connects DRAMs at ⅓ of the device sites to the controller. The data accessed either [1] flows through an edge DQ buffer component and flow onto a motherboard wire which connects to the controller, or [2] flows through a center DQ buffer component, flow through an edge DQ buffer component and flow onto a motherboard wire which connects to the controller.

The term "edge DB-BUF" refers to the DB-BUF components on each module in FIG. 27B. The term "center DB-BUF" refers to the middle DB-BUF components on each module FIG. 27B.

There are two private buses connecting the center DQ-BUF to each of the edge DQ buffer components. This allows the device sites connected to the center DQ-BUF to couple to the primary data group links connected to the edge DQ-BUF.

The private bus connection may have a transmitter and receiver as described herein. It is likely that the domain crossing logic will not need to accommodate a large range of skew since the internal clocks of the DQ buffer components may be phase aligned to the secondary CK signal from the CA-BUF component (FIG. 3B).

In each of the three access cases FIG. 7B, the chip select of a different module is asserted. A private bus (as in FIG. 12A) distributes this selection information to the other two unselected modules so they can participate in the access.

Configuration E (3-SPC)

FIGS. 28A-B show an improved memory system with the third configuration E 800 with different combinations of one or three memory modules in a 3-SPC memory channel according to one embodiment.

The three-module diagram 2820 of FIG. 28A shows configuration E 800 with a single module occupying the right-most socket. The other two sockets contain continuity modules 2819. All accesses involve DRAMs from the single module 2802. The data accessed flows through either [1] directly through a motherboard wire or [2] one continuity module between the controller and the DQ buffer components. The diagram shows the data direction for a read access. The arrows show the DRAM access and the arrows show the movement through the continuity module. No sharing of CS information is required for this case.

The three-module diagrams 2830, 2840, 2850 of FIG. 28B show configuration E 800 with modules occupying all three sockets. There are no continuity modules. All accesses involve some DRAMs from each of the modules.

Each data access connects DRAMs at ⅓ of the device sites to the controller. The data accessed either [1] flows through an edge DQ buffer component and flow onto a motherboard wire which connects to the controller, or [2] flows from a DRAM at a center device site, flow through an edge DQ buffer component and flow onto a motherboard wire which connects to the controller.

The term "edge DB-BUF" refers to the upper and lower DB-BUF components on each module in FIG. 28B. The term "center device site" refers to the two middle device sites on each module FIG. 28B.

There is an extra secondary port connecting each of the edge DQ buffer components to one of the center device sites. This allows the center device sites to couple to the primary data group links connected to the edge DQ-BUF.

This creates a more complex physical connection topology for the center device sites; they connect to two secondary ports on DQ buffer components, not one secondary port (like the edge device sites). This extra secondary port connection has a transmitter and receiver like the two others already present (see FIG. 5).

In each of the three access cases in FIG. 28B, the chip select of a different module is asserted. A private bus (as in FIG. 12A) distributes this selection information to the other two unselected modules so they can participate in the access.

Configuration F (3-SPC)

FIGS. 29A-B show an improved memory system with the fourth configuration F 900 with different combinations of one or three memory modules in a 3-SPC memory channel according to one embodiment.

The three-module diagram 2920 of FIG. 29A shows configuration F 900 with a single module 2902 occupying the right-most socket. The other two sockets contain continuity modules 2919. All accesses involve DRAMs from the single module 2902. The data accessed flows through either [1] directly through a motherboard wire or [2] one continuity module between the controller 2904 and the DQ buffer components. The diagram shows the data direction for a read access. The arrows show the DRAM access and the arrows show the movement through the continuity module. No sharing of CS information is required for this case.

The three-module diagrams 2930, 2940, 2950 of FIG. 29B shows show configuration F 900 with modules occupying all three sockets. There are no continuity modules. All accesses involve some DRAMs from each of the modules.

Each data access connects DRAMs at ⅓ of the device sites to the controller. The data accessed flows through a DQ buffer component and flow onto a motherboard wire which connects to the controller.

The private bus connection has a transmitter and receiver as described herein. It's likely that the domain crossing logic needs to accommodate a large range of skew since the internal clocks of the DQ buffer components may be phase aligned to the secondary CK signal from the CA-BUF component (FIG. 3B).

In each of the three access cases in FIG. 29B, the chip select of a different module is asserted. A private bus (as in FIG. 12A) distributes this selection information to the other two unselected modules so they can participate in the access.

Configuration B (3-SPC)

FIGS. 30A-B show an improved memory system with the fifth configuration B 1000 with different combinations of one or three memory modules in a 3-SPC memory channel according to one embodiment.

The three-module diagram 3020 of FIG. 30A shows configuration B 1000 with a single module 3002 occupying the right-most socket. One sockets contains continuity module 3019 and the other socket is empty. All accesses involve DRAMs from the single module 3002.

The three diagrams in the top row show the cases for three modules.

The three-module diagram 3030 shows a read access to the third module. The CS group links for the third module are asserted, as indicated with the arrow. The DQ buffer components enable the device sites in the {a,b,c,d,e,f} positions. It should be noted that this is different than the equivalent case in configuration A.

A private bus 3022 allows the CA-BUF component on the third module to communicate with the CA-BUF component on the second module. The details of this private bus are described below.

The DQ buffer components on the second module enable a bypass path 3024 for the {b,d,f} positions, allowing that portion of the read access to be transferred to the controller 3004. The details of this bypass path 3024 are described herein.

In one embodiment, a single bit can be communicated to indicate a bypass operation in the second module, rather than the entire CS group, as in configuration A.

The three-module diagram 3040 shows a read access to the second module. The CS group links for the second module are asserted, as indicated with the arrow. The DQ buffer components enable the device sites in the {a,b,c,d,e,f} positions. It should be noted that this is different than the equivalent case in configuration A.

A private bus 3022 allows the CA-BUF component on the second module to communicate with the CA-BUF component on the third module. The details of this private bus are described below.

The DQ buffer components on the third module enable a bypass path 3024 for the {a,c,e} positions, allowing that portion of the read access to be transferred to the controller. The details of this bypass path 3024 are described herein. It should be noted that it is only necessary for a single bit to be communicated to indicate a bypass operation in the third module, rather than the entire CS group, as in configuration A.

The three-module diagram 3050 shows a read access to the first module. The CS group links for the first module are asserted, as indicated with the arrow. The DQ buffer components enable the device sites in the {a,b,c,d,e,f} positions, as indicated with the six arrows.

Configuration C (3-SPC)

FIGS. 31A-B show an improved memory system with the sixth configuration C 1100 with different combinations of one or three memory modules in a 3-SPC memory channel according to one embodiment.

The three-module diagram 3120 shows configuration C 1100 with a single module 3102 occupying the right-most socket. The other two sockets contain continuity modules 3119. All accesses involve DRAMs from the single module. The data accessed traverses one continuity module 3119 between the controller 3104 and the DQ buffer components. The diagram shows the data direction for a read access. The arrows show the DRAM access and the arrows show the movement through the continuity module 3119.

The three-module diagrams 3130, 3140, 3150 of FIG. 31B show configuration C 1100 with modules occupying all three sockets. There are no continuity modules. All accesses involve DRAMs from a single module.

Data accessed on the right-most module flows between the controller and the DQ buffer components through a bypass path in the DQ-BUF on one of the other modules. The diagram shows the data direction for a read access. The arrows show the DRAM access, and the blue arrows show the movement through the bypass path. The domain crossing logic in the controller can take care of the path differences for this case.

Data accessed on the center module (three-module diagram 3140 of FIG. 31B) flows between the controller and the DQ buffer components through either [1] a motherboard wire or [2] two bypass paths in the DQ-BUF on the other two modules. The diagram shows the data direction for a read access. The diagram shows the data direction for a read access, with the arrows indicating data movement, as before. The domain crossing logic in the controller can take care of the path differences for this case.

Data accessed on the left-most module (three-module diagram 3150 of FIG. 31B) flows flow between the controller and the DQ buffer components through either [1] a motherboard wire or [2] two bypass paths in the DQ-BUF on the other two modules. The diagram shows the data direction for a read access. The diagram shows the data direction for a read access, with the arrows indicating data movement, as before. The domain crossing logic in the controller can take care of the path differences for this case.

Figure 32:
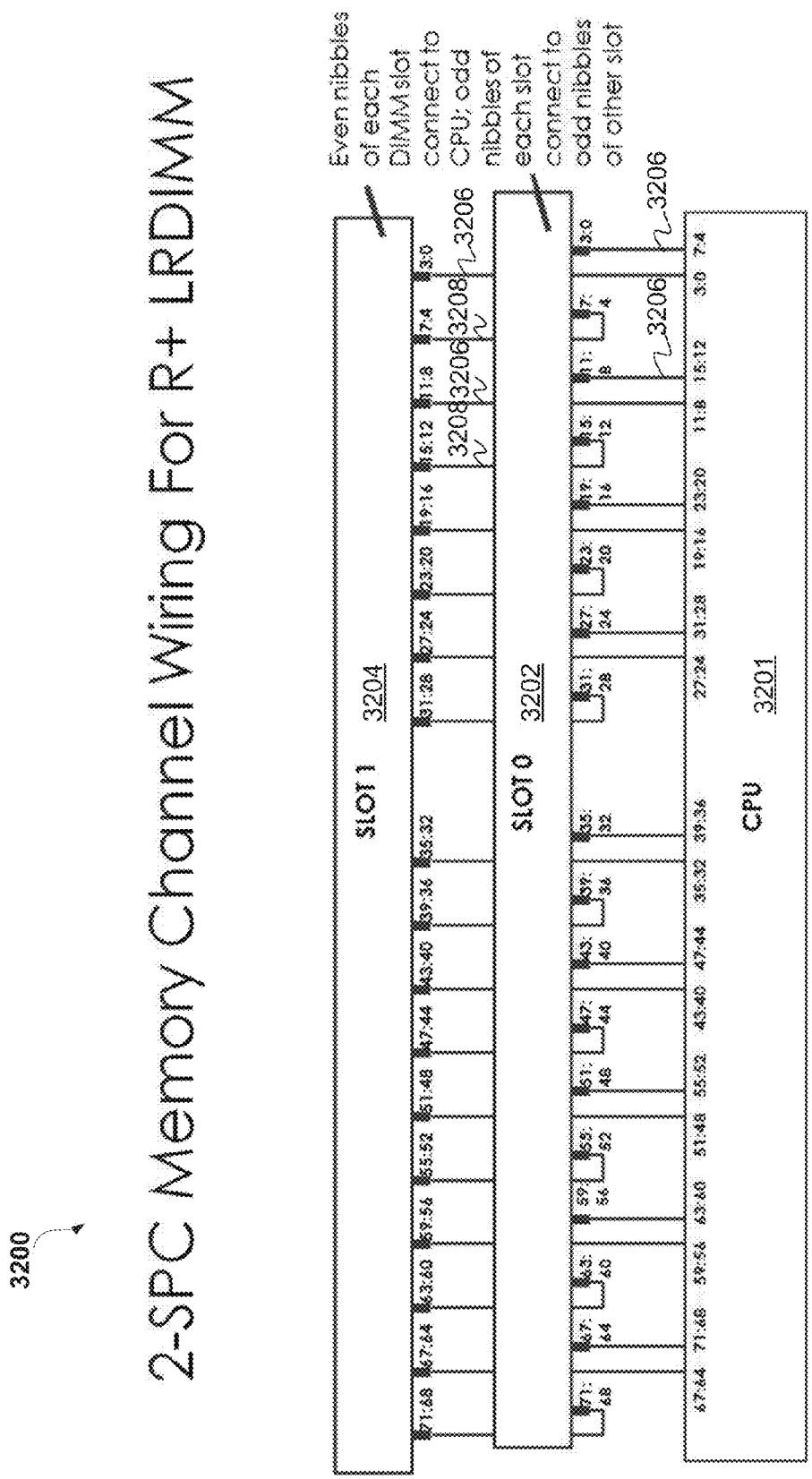
FIG. 32 is a diagram illustrating 2-SPC memory channel wiring with a CPU slot and two DIMM slots for R+LRDIMMs coupled to the CPU slot with data lines according to even and odd nibbles according to one embodiment.

FIG. 32 is a diagram illustrating 2-SPC memory channel wiring 3200 with a CPU slot 3201 and two DIMM slots 3202, 3204 for R+LRDIMMs coupled to the CPU slot 3201 with data lines according to even and odd nibbles according to one embodiment. A first set of data lines 3206, corresponding to even nibbles, are connected to the DIMM slots 3202, 3204 and the CPU slot 3201. A second set of data lines 3208, corresponding to odd nibbles, are connected between the two DIMM slots 3202, 3204. That is odd nibbles of one DIMM slot is coupled to odd nibbles of the other DIMM slot. The first and second sets of data lines 3206, 3208 can accommodate 9 even nibbles and 9 odd nibbles for a 72-bit wide DIMM in 1 DPC or 2 DPC memory configurations. The 2-SPC memory channel wiring 3200 is similar to the 2-SPC memory channel wiring 400 of FIG. 4, except that the 2-SPC memory channel wiring 3200 does not include the private bus 412.

Figure 33:
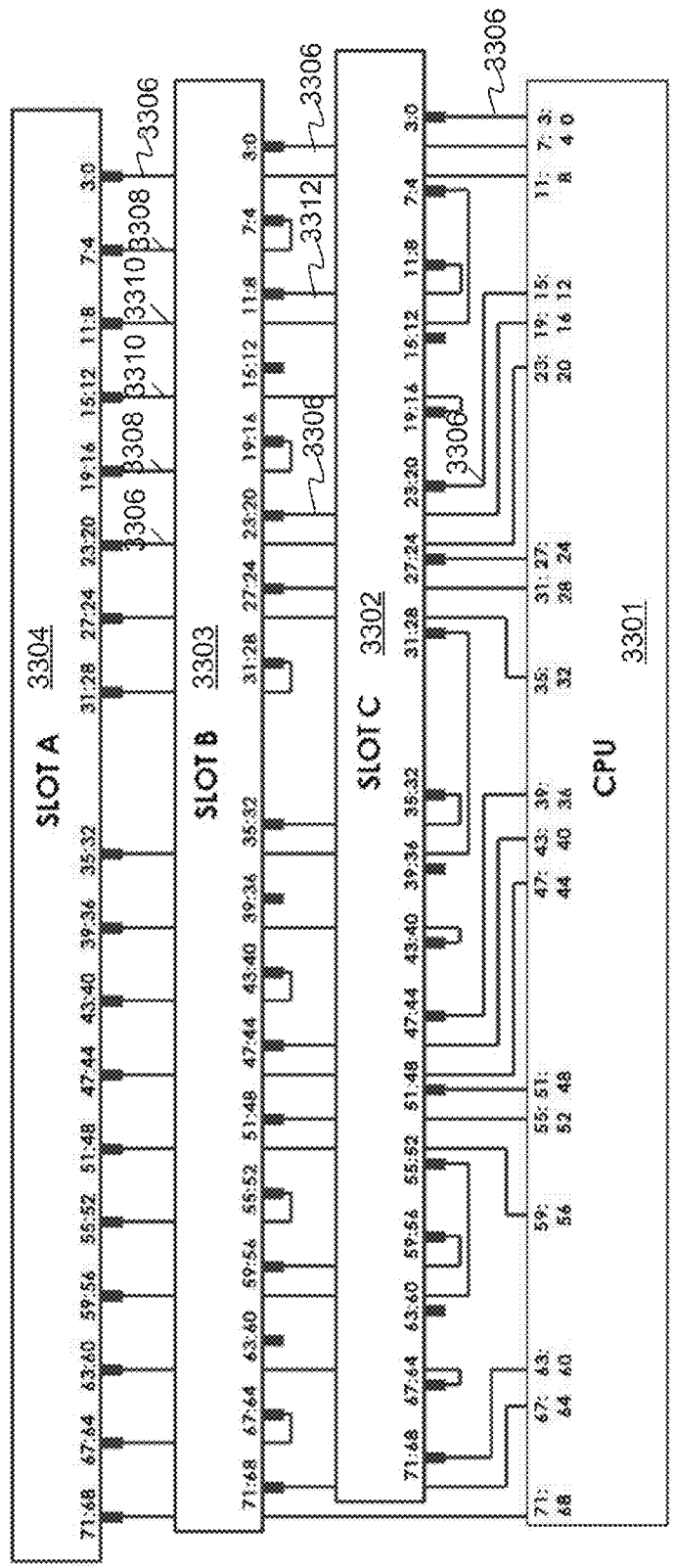
FIG. 33 is a diagram illustrating 3-SPC memory channel wiring with a CPU slot 301 and three DIMM slots for R+LRDIMMs coupled to the CPU slot with data lines according to sets of nibbles according to one embodiment.

FIG. 33 is a diagram illustrating 3-SPC memory channel wiring 3300 with a CPU slot 3301 and three DIMM slots 3302-3304 for R+LRDIMMs coupled to the CPU slot 3301 with data lines according to sets of nibbles according to one embodiment. A first set of data lines 3306 of the three DIMM slot 3302-3304 are connected to CPU slot 3301. A second set of data lines 3308 are connected between the second and third DIMM slots 3303-3304. A third set of data lines 3310 are connected between the first and third DIMM slots 3302, 3304. A fourth set of data lines 3312 are connected between the first and second DIMM slots 3302, 3303. The data lines for only one 24-bit wide slice are labeled, but the first, second, third, and fourth sets of data lines can accommodate eighteen nibbles for 1 DPC, 2 DPC, and 3 DPC memory configurations, as described below with respect to FIGS. 34A-34C. The 3-SPC memory channel wiring 3300 is similar to the 3-SPC memory channel wiring 2400 of FIG. 24, except that the e-SPC memory channel wiring 3300 does not include the private bus 2412.

Figure 34A:
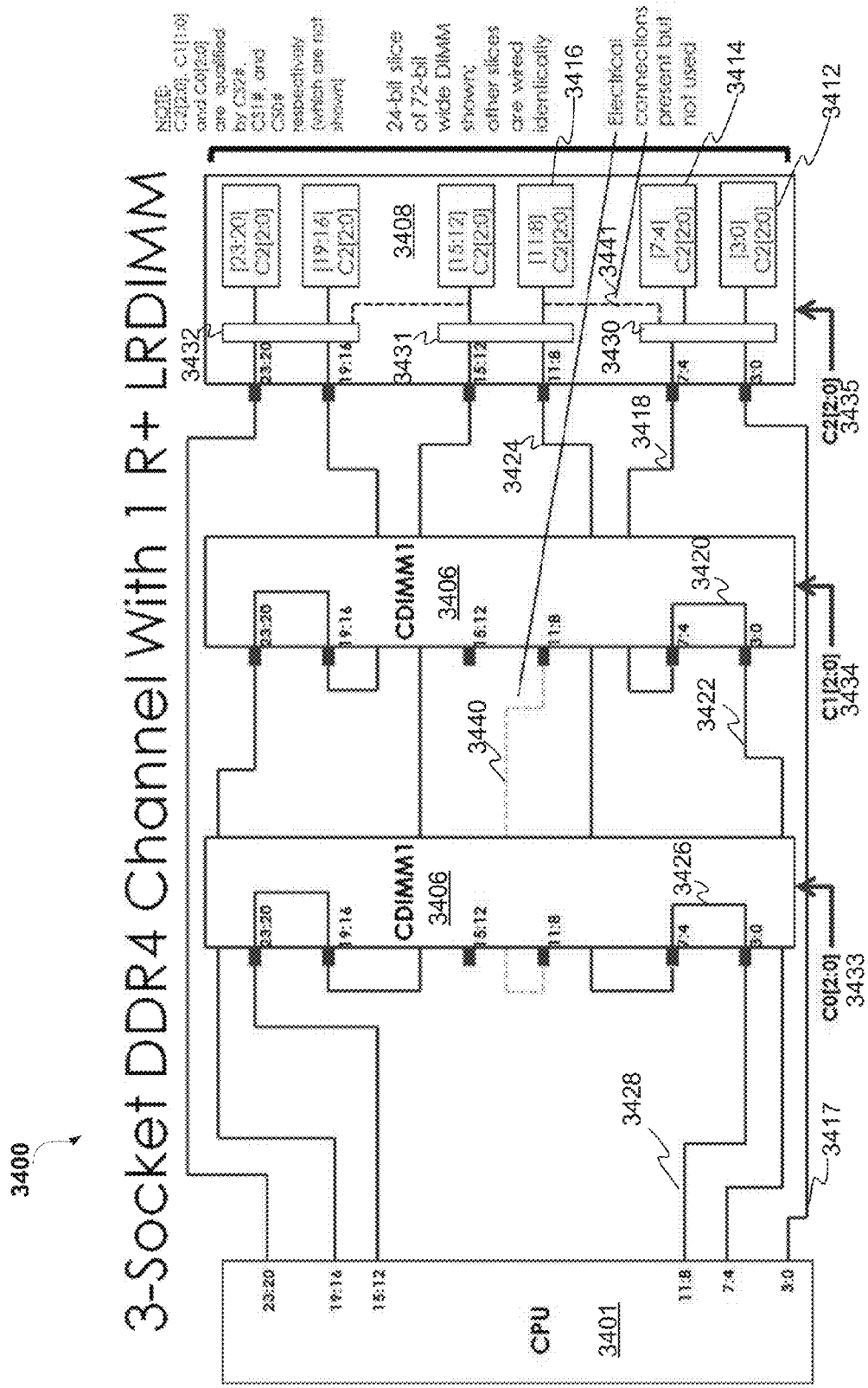
FIG. 34A is a diagram illustrating 3-SPC DDR4 channel with one DIMM slot populated with one R+LRDIMM and two DIMM slots populated with C-DIMMs according to one embodiment.

FIG. 34A is a diagram illustrating 3-SPC DDR4 channel 3400 with one DIMM slot populated with one R+LRDIMM 3408 and two DIMM slots populated with C-DIMMs 3406 according to one embodiment. A 24-bit slice of a 72-bit wide DIMM is illustrated, but other slices are wired identically. The slice of R+LRDIMM 3408 includes six device sites, where each site may be a single memory component or multiple memory components. For ease of description, the data lines of three devices sites 3412, 3414, 3416 in the 3-SPC DDR4 channel 3400 are described. A first device site 3412 is coupled to the CPU 3401 via data lines 3417 (first nibble). A second device site 3414 is coupled to the second C-DIMM 3406 in the second slot via data lines 3418, and the inner traces 3420 of second C-DIMM 3406 connect data lines 3418 to data lines 3422, which are coupled to the CPU 3401 (second nibble). A third device site 3416 is coupled to the first C-DIMM 3406 in the first slot via data lines 3424, and the inner traces 3426 of first C-DIMM 3406 connect data lines 3424 to data lines 3424, which are coupled to the CPU 3401 (third nibble). Similar data lines can be used to connect the other device sites of the R+LRDIMM 3408 to the CPU 3401 for the other three nibbles in the slice. The DQ buffer component 3432, with or without DQ buffer component 3431, can be used for the other device sites of the R+LRDIMM 3408.

In FIG. 34A, a DQ buffer component 3430 is coupled between the first device site 3412 and second device site 3414 and the data lines 3417 and 3418, respectively. A second DQ buffer component 3431 is coupled between the third device site 3416 and data lines 3424. In another embodiment, the DQ buffer component 3430 is coupled to the three device sites 3412-3416 and the third device site 3416 is coupled to the DQ buffer component 3430 via data lines 3441. Electrical connections may be presented for data lines 3440 between the first and second C-DIMMS 3406, but may be unused. Similarly, electrical connections may be presented for the data lines 3441, but may be unused in some embodiments. The DQ buffer component 3430 acts as a repeater with one R+LRDIMM 3408 in the 3-SPC DDR4 channel 3400. The DQ buffer component 3430 could also act as multiplexer in some cases. It should be noted that C2[2:0], C1[2:0] and C0[2:0] are qualified by CS2#, CS1#, and CS0#, respectively (not illustrated in FIG. 34A).

Figure 34B:
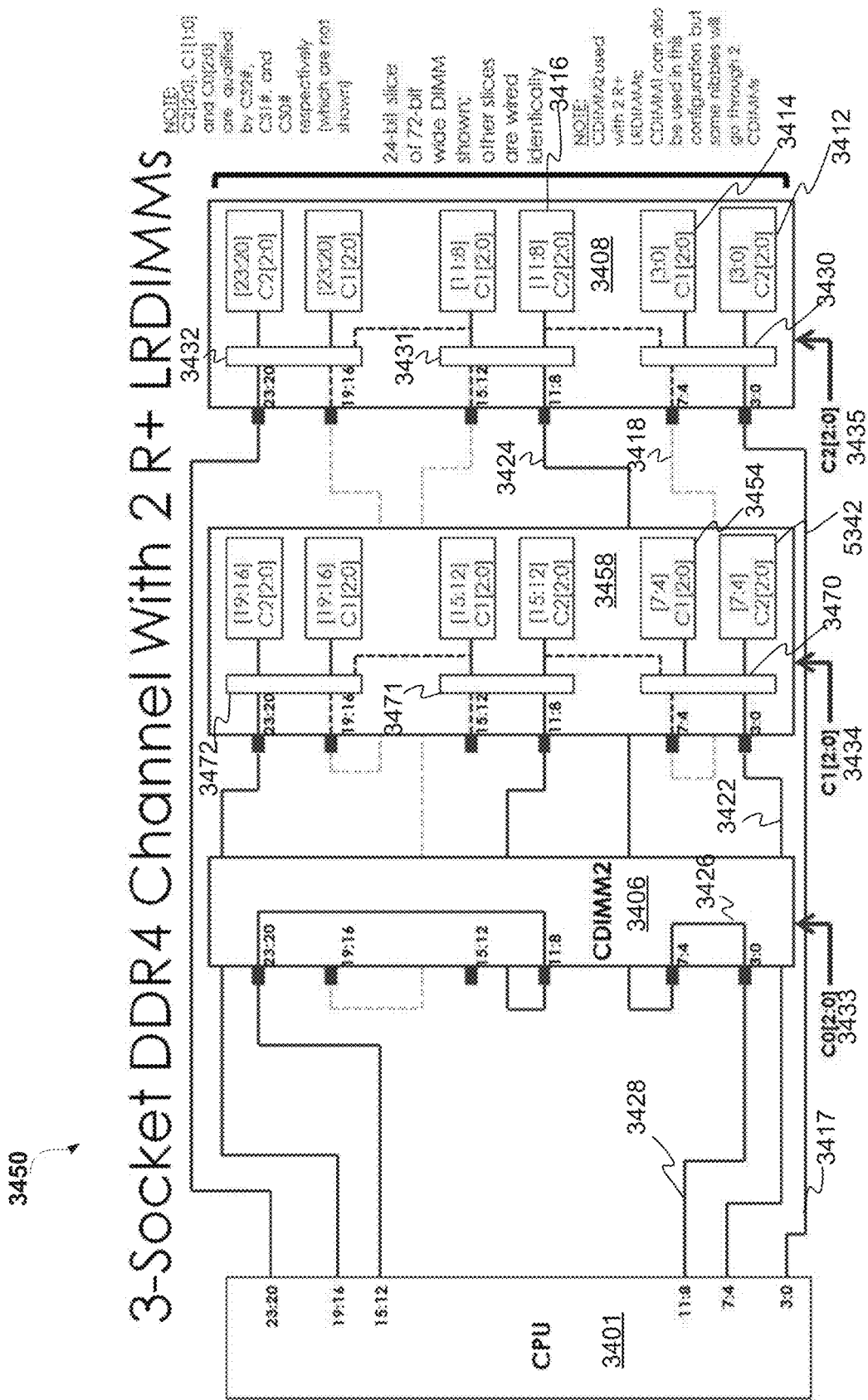
FIG. 34B is a diagram illustrating 3-SPC DDR4 channel with two DIMM slots populated with R+LRDIMMs and another DIMM slot populated with a C-DIMM according to one embodiment.

FIG. 34B is a diagram illustrating 3-SPC DDR4 channel 3450 with two DIMM slots populated with R+LRDIMMs 3408, 3458 and another DIMM slot populated with a C-DIMM 3406 according to one embodiment. The 3-SPC DDR4 channel 3450 is similar to the 3-SPC DDR channel 3400 as noted by similar reference labels. However, the second slot is populated with a second R+LRDIMM 3458. The corresponding slice of the R+LRDIMM 3458 includes six device sites, where each site may be a single memory component or multiple memory components. For ease of description, the data lines of three devices sites 3412-3416 in the 3-SPC DDR4 channel 3450 are described. A first device site 3412 is coupled to the CPU 401 via data lines 3417 (first nibble) as described above with respect to 3-SPC DDR4 channel 3400. A second device site 3452 is coupled to the CPU 401 via data lines 3422 (second nibble). A third device site 3416 is coupled to the CPU via data lines 3424, which are coupled to the first slot with the C-DIMM 3406. The internal traces of the C-DIMM 3406 connect the data lines 3424 to the data lines 3428 (third nibble). In effect, location of the second device site 3414 of the 3-SPC DDR4 channel 3400 is swapped with the first device site 452 of 3-SPC DDR4 channel 3450 when both slots are populated with R+LRDIMMs 3408, 3458. It should be noted that the electrical connections for data lines 3418 and internal data lines to the DQ buffer components are present on the motherboard and R+LDIMMs, but are not used. Similar data lines can be used to connect the other device sites of the two R+LRDIMMs 3408, 3458 to the CPU 3401 for the other three nibbles in the slice. The DQ buffer components 3430-3432 and DQ buffer components 3470-3472 may be used for the device sites of the two R+LRDIMMs 3408, 3458. In some cases, the DQ buffer components may act as repeaters or multiplexers as described herein. It should be noted that C2[2:0], C1[2:0] and C0[2:0] are qualified by CS2#, CS1#, and CS0#, respectively (not illustrated in FIG. 34B).

Figure 34C:
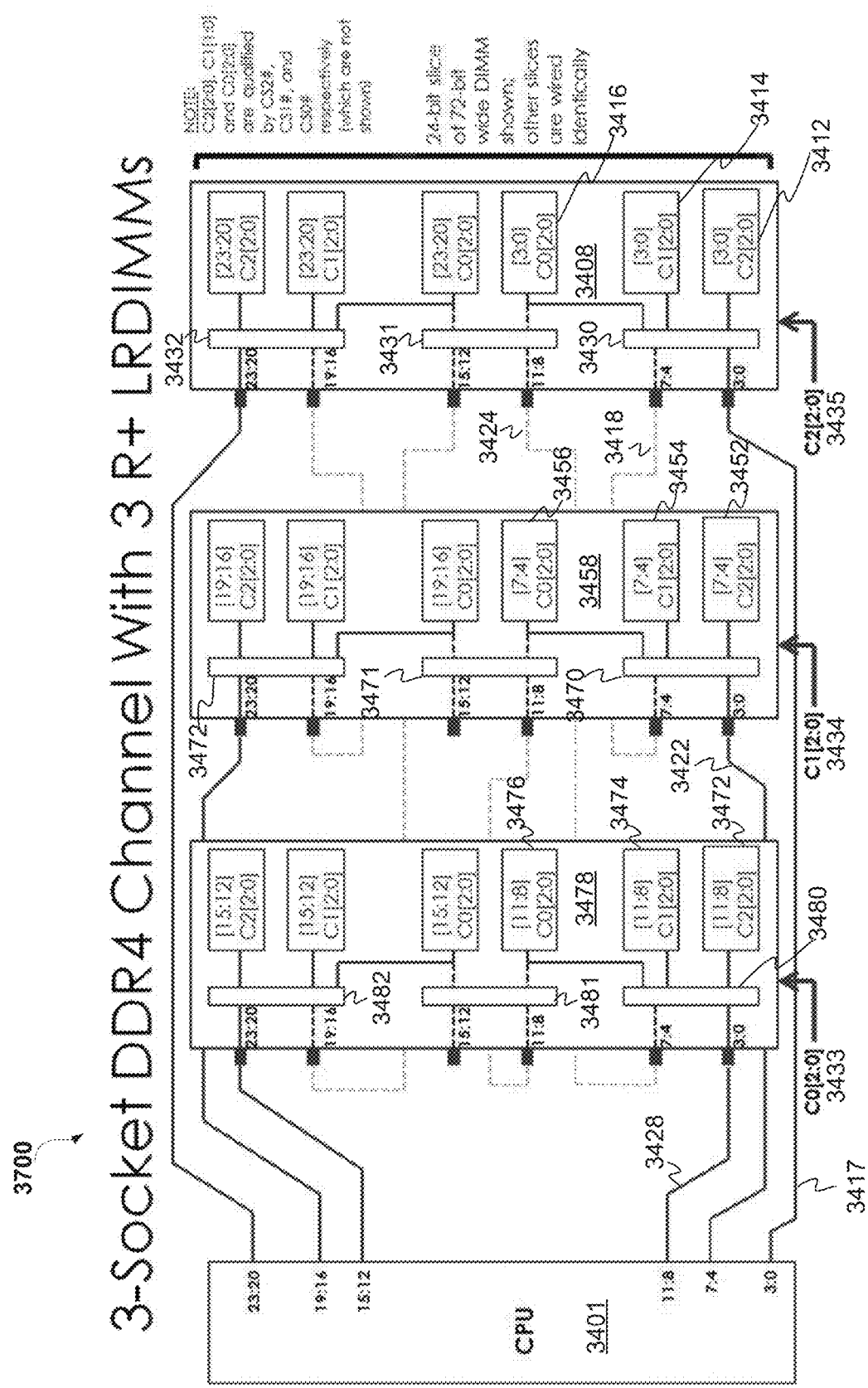
FIG. 34C is a diagram illustrating 3-SPC DDR4 channel 3470 with three DIMM slots populated with R+LRDIMMs 3408, 3458, 3478 according to one embodiment.

FIG. 34C is a diagram illustrating 3-SPC DDR4 channel 3470 with three DIMM slots populated with R+LRDIMMs 3408, 3458, 3478 according to one embodiment. The 3-SPC DDR4 channel 3470 is similar to the 3-SPC DDR channel 3450 as noted by similar reference labels. However, the first slot is populated with a third R+LRDIMM 3478. The corresponding slice of the R+LRDIMM 3478 includes six device sites, where each site may be a single memory component or multiple memory components. For ease of description, the data lines of three devices sites 3412, 3452, 3472 in the 3-SPC DDR4 channel 3470 are described. A first device site 3412 is coupled to the CPU 401 via data lines 3417 (first nibble) as described above with respect to 3-SPC DDR4 channel 3400. A second device site 3452 is coupled to the CPU 401 via data lines 3422 (second nibble). A third device site 3472 is coupled to the CPU 401 via data lines 3428 (third nibble). It should be noted that the electrical connections for data lines 3418, 3424 and internal data lines to the DQ buffer components are present on the motherboard and R+LDIMMs, but are not used. Similar data lines can be used to connect the other device sites of the three R+LRDIMMs 3408, 3458, 3478 to the CPU 3401 for the other three nibbles in the slice. The DQ buffer components 3430-3432, DQ buffer components 3470-3472, and DQ buffer components 3480-3482 may be used for the device sites of the three R+LRDIMMs 3408, 3458, 3478. In some cases, the DQ buffer components may act as repeaters or multiplexers as described herein. It should be noted that C2[2:0], C1[2:0] and C0[2:0] are qualified by CS2#, CS1#, and CS0#, respectively (not illustrated in FIG. 34C).

In some implementations, DDR4 R+LRDIMM requires that all CS# and CKE signals in a memory channel be broadcast to all the DIMM slots (or DIMM sockets or module sockets) in the channel. With DPP, each data signal is connected to only one R+LRDIMM. In a channel with multiple R+LRDIMMs, each and every R+LRDIMM respond s to a Read or Write operation. The DDR4 specification allows up to 8 ranks per DIMM slot. In one implementation, for single rank (SR) DIMM, rank 0 is controlled by CS0#, CKE0, and ODT0, for double-rank (DR) DIMM, rank 1 is controlled by CS1#, CKE1, and ODT1, and for quad-rank (QR) DIMM or octa-rank (OR) DIMM, rank is controlled by C[2:0], CS#, CKE, and ODT. The CS# signal may be a 1-cycle signal and is connected to only one DIMM slot, and broadcasting CS# to all DIMM slots may violate register setup and hold times. The embodiments described below create a private shared bus between the DIMM slots in a memory channel using pins defined as not connected (NC) or non-functional (NF) in the DDR4 RDIMM specification. ODT pins in each DIMM slot may optionally be used for the private bus since all DQ nets are always point-to-point. CA buffer components (also referred to as CA register) may be modified for operation with a local CS signal (local CS#) and clock enabled (CKE) signals and a distant CS signal (distant CS#) and CKE signals. Local CS signals are signals received directly from the memory controller (MC) and distant signals are signals from another DIMM connector on the private bus. The CA buffer component treats local CS signals different than distant CS signals. For example, in one embodiment, local signals go through two flip-flops before being driven to the DRAM devices, whereas distant signals go through 1 flip-flop before being driven to the DRAM devices.

Figure 35:
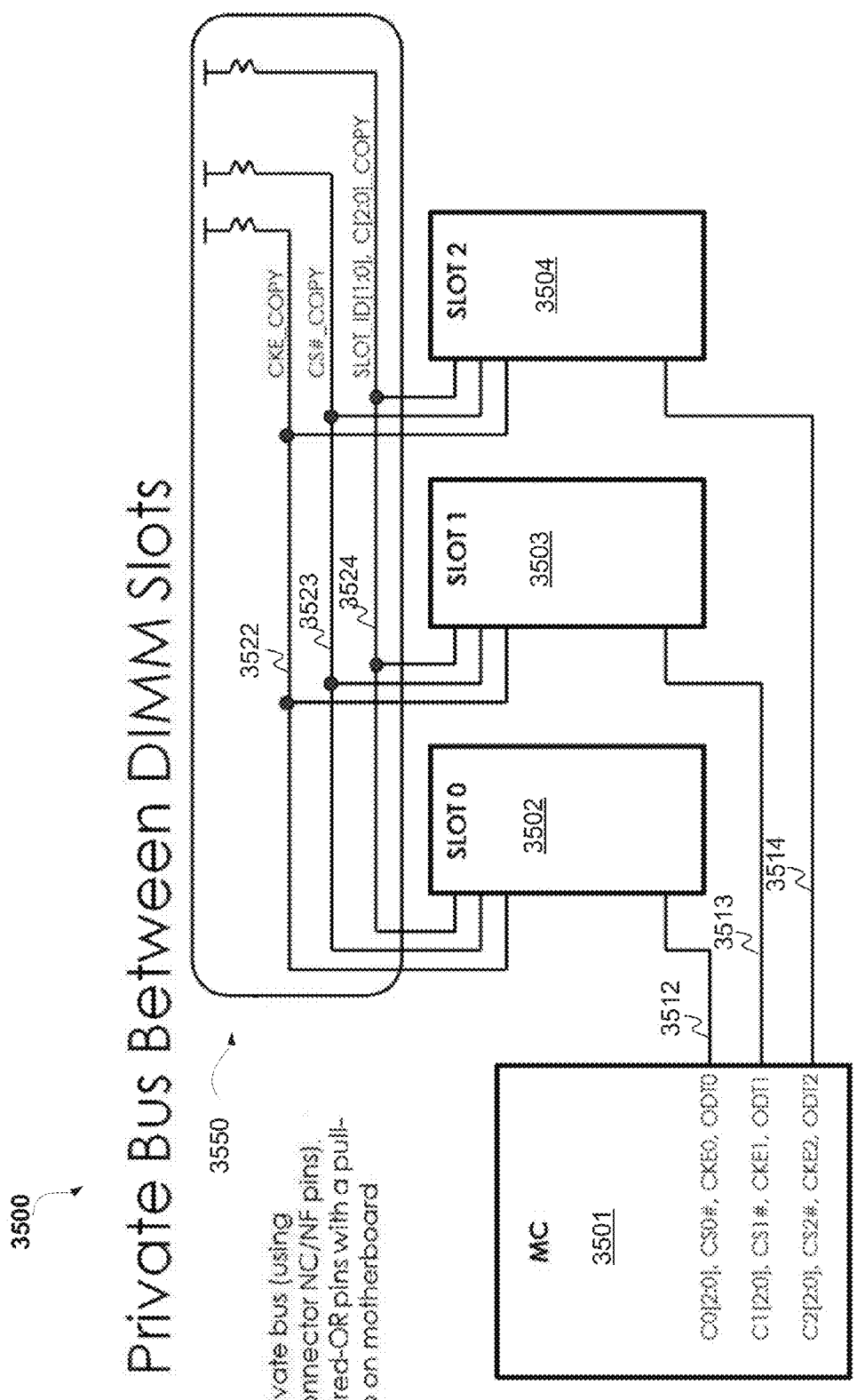
FIG. 35 is a diagram illustrating a private bus between three DIMM slots of a 3-SPC memory system according to one embodiment.

FIG. 35 is a diagram illustrating a private bus 3550 between three DIMM slots 3502-3504 of a 3-SPC memory system 3500 according to one embodiment. In the memory system 3500, a memory controller (MC) 3501 is coupled to three slots 3502-3504. A first set of control lines 3512 is coupled between the MC 3501 and a first slot 3502 (slot 0) (e.g., CS0#[2:0], CKE0, and ODT0). A second set of control lines 3513 is coupled between the MC 3501 and a second slot 3503 (slot 1) (e.g., CS1#[2:0], CKE1, and ODT1). A third set of control lines 3514 is coupled between the MC 3501 and a third slot 3504 (slot2) (e.g., CS2#[2:0], CKE2, and ODT2). For a SR DIMM configuration, rank 0 is controlled by CS0#, CKE0, and ODT0. For a DR DIMM configuration, rank 0 is controlled by CS0#, CKE0, and ODT0 and rank 1 is controlled by CS1#, CKE1, and ODT1. For a QR DIMM configuration or OR DIMM configuration, ranks are controlled by C[2:0], CS#, CKE, and ODT. C[2:0] may be 3 encoded CS signals with each one of CS0# or CS1#. C[2:0] may be used to control up to 8 ranks (e.g., stacked devices). For stacked technology devices, also referred to as 3DS technology, there may be 18 device sites and three C bits can be used to select devices at the selected device site. The CS# signal may be a 1-cycle signal and is connected to only one DIMM slot.

In one embodiment, the R+LRDIMMs at the three slots 3502-3504 receive three signals each and the R+LRDIMMs retransmit the signals to the other two slots on the private bus 3550. The private bus 3550 includes a first line 3522 for CKE_COPY, a second line 3523 for CS#_COPY, and a third set of lines 3524 for SLOT_ID[1:0] and C[2:0]_COPY. The SLOT_ID[1:0] can be used to identify which of the three slots 3502-3504 is retransmitting the CS information. C[2:0]_COPY is a copy of the CS[2:0] received by the respective slot. Similarly, CKE_COPY is a copy of the CKE received by the respective slot and CS#_COPY is a copy of the CS# received by the respective slot. The private bus 3550 may use wired-OR pins with a pull-up on a motherboard upon which the three slots 3502-3504 are disposed.

In one embodiment, the following NC pins are available to use for the private bus 3550: 92, 202, 224, 227, 232 and 234. In another embodiment, the following NF pins may be used: 88, 90, 200, 215, and 216. These NC and NF pins may be in the vicinity of the CA pins.

Figure 36:
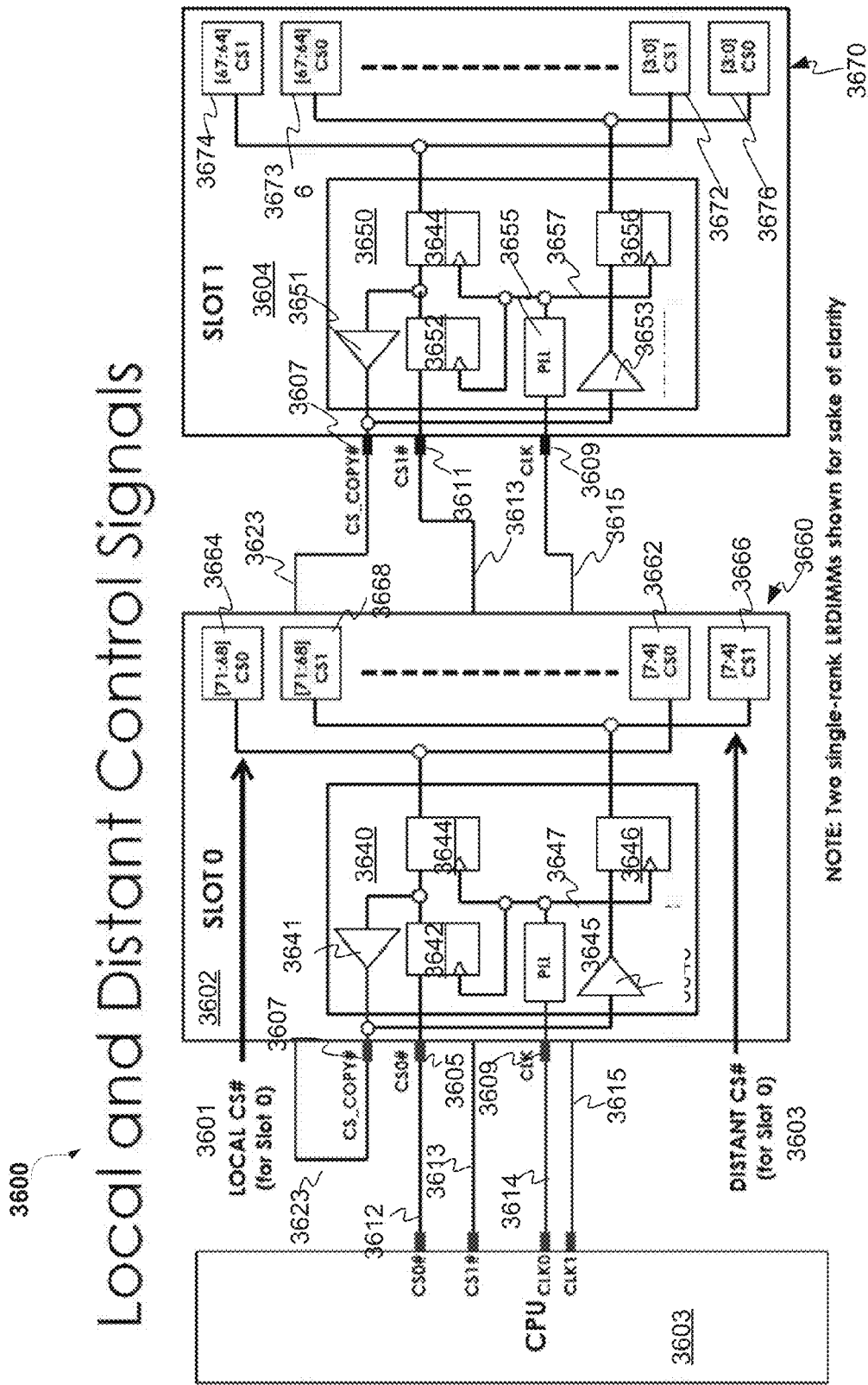
FIG. 36 is a diagram illustrating local control signals and distant control signals of a private bus between two DIMM slots of a memory system according to one embodiment.

FIG. 36 is a diagram illustrating local control signals 3601 and distant control signals 3603 of a private bus 3623 between two DIMM slots 3602, 3604 of a memory system 3600 according to one embodiment. A first DIMM slot 3602 (slot 0) is populated with a first memory module with a CA buffer component 3640 and a second DIMM slot 3604 (slot 1) is populated with second memory module with a CA buffer component 3650. The first memory module in the first DIMM slot 3602 includes multiple device sites 3660 and the second memory module in the second DIMM slot 3604 includes multiple device sites 3670. The device sites 3660, 3670 may each include a single memory component or each multiple memory components. These memory components may be DDR4 DRAM devices and the memory modules may be R+LRDIMMs. It should be noted that FIG. 36 illustrates two single-rank LRDIMMs for sake of clarity, but similar data lines can be connected to other devices sites 3660 and 3670.

The CA buffer component 3640 includes a primary interface with a first pin 3605, which is coupled to line 3612 to receive a local chip select (CS) signal (CS0#) 3601, and a second pin 3607, which is coupled to a line of the private bus 3623 to receive a distant CS signal (CS_COPY#) 3603. The primary interface is coupled to the CPU. The CA buffer component 3640 includes a secondary interface to select one or more of the device sites 3660 (e.g., 3662, 3664, 3666, 3668). The CA buffer component 3640 selects the device sites 3662, 3664 when the local CS signal 3601 is received on the first pin 3605 (for slot 0) and selects the device sites 3666, 3668 when the distant CS signal 3603 is received on the second pin 3607 (for slot 0). In other embodiments where there are additional slots, the CA buffer component 3640 receives a second distant CS signal on a third pin (not illustrated) to select other device sites.

In a further embodiment, the CA buffer component 3640 includes: 1) a first flip-flop 3642 coupled to the first pin 3605; 2) a second flip-flop 3644 coupled to an output of the first flip-flop 3642. An output of the second flip-flop 3644 is coupled to the device sites 3662, 3664. The CA buffer component 3640 also includes an input buffer 3643 coupled to the second pin 3607 and an output of the input buffer 3643 is coupled to a third flip-flop 3646. An output of the third flip-flop 3646 is coupled to the device sites 3666, 3668. The first flip-flop 3642, second flip-flop 3644, and third flip-flop 3646 are clocked by a timing signal 3647. The timing signal 3647 can be generated by a phase locked loop (PLL) 3645, which is coupled to a fourth pin 3609 that receive a clock signal (CLK0) on line 3614 from a CPU 3603. The CA buffer component 3640 also includes an output buffer 3641 coupled to the output of the first flip-flop 3642. An output of the output buffer 3641 is coupled to the second pin 3607. The output buffer 3641 generates a second distant CS signal (e.g., CS_COPY#) on second pin 3607. The output buffer 3641 retransmits the local CS signal 3601 received on the first pin 3605 as the distant CS signal 3603 on the second pin 3607 to one or more other modules in other slots (e.g., second slot 3604).

The CA buffer component 3650 may also include similar primary and secondary interfaces as the CA buffer component 3640. The primary interface couples to the CPU 3603 and the secondary interface is to select one or more of the device sites 3670 (e.g., 3672, 3674, 3676, 3678). The CA buffer component 3650 selects the device sites 3672, 3674 when the local CS signal (CS1#) is received on a first pin 3611 (for slot 1) from line 3613 coupled to the CPU 3603. The CA buffer component 3650 selects the device sites 3676, 3678 when the distant CS signal (CS_COPY#) is received on the second pin 3607 (for slot 1) from the line of the private bus 3623 coupled to the first slot 3602. The CA buffer component 3650 includes: 1) a first flip-flop 3652 coupled to the first pin 3611; 2) a second flip-flop 3654 coupled to an output of the first flip-flop 3652. An output of the second flip-flop 3654 is coupled to the device sites 3672, 3674. The CA buffer component 3650 also includes an input buffer 3653 coupled to the second pin 3607 and an output of the input buffer 3653 is coupled to a third flip-flop 3656. An output of the third flip-flop 3656 is coupled to the device sites 3676, 3678. The first flip-flop 3652, second flip-flop 3654, and third flip-flop 3656 are clocked by a timing signal 3657. The timing signal 3657 can be generated by a PLL 3655, which is coupled to a fourth pin 3609 that receives a clock signal (CLK1) on line 3615 from the CPU 3603. The CA buffer component 3650 also includes an output buffer 3651 coupled to the output of the first flip-flop 3652. An output of the output buffer 3651 is coupled to the second pin 3607. The output buffer 3651 generates a second distant CS signal (e.g., CS_COPY#) on second pin 3607. The output buffer 3641 retransmits the local CS signal received on the first pin 3611 as the distant CS signal on the second pin 3607 to one or more other modules in other slots (e.g., first slot 3602).

Although FIG. 36 illustrates two DIMM slots 3602, 3604 and only four device sites per DIMM slot, in other embodiments, more than two DIMM slots can be used and more than four device sites per DIMM slot may be used. FIG. 36 also illustrates single-device memory sites, but in other embodiments, multi-device memory sites may be used, such as illustrated in FIG. 9.

Figure 37:
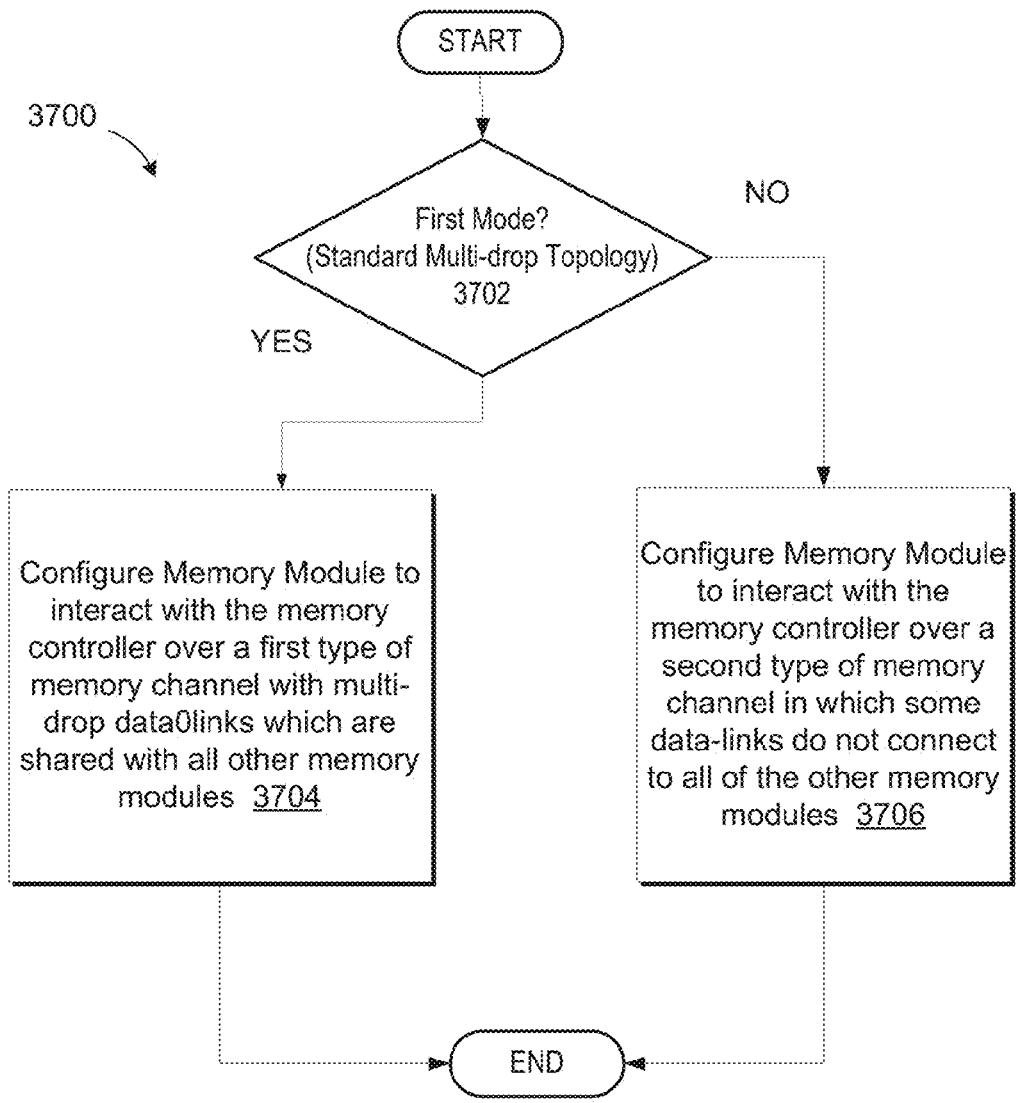
FIG. 37 is a flow diagram of a method of operating a dual-mode memory module according to an embodiment.

FIG. 37 is a flow diagram of a method 3700 of operating a dual-mode memory module according to an embodiment. The method 3700 begins with determining whether the memory module is in a first mode or a second mode (block 3702). If in the first mode, the memory module is configured to interact with a memory controller over a first type of memory channel with multi-drop data-links which are shared with all other memory modules connected to the memory controller (block 3704). If in the second mode, the memory module is configured to interact with the memory control over a second type of memory channel in which some data-links do not connect to all of the other memory modules (block 3706). The buffer component receives a reference clock from a memory controller, such as a register, an address buffer, or the like, as described herein. The buffer component generates a clock signal based on the reference clock and forwards the clock signal to a data buffer and DRAM devices. Data is communicated to and from the memory controller on a primary interface of the data buffer using strobe signals, and data is communicated to and from the DRAM devices on a secondary interface of the data buffer as described herein.

In another embodiment, the method includes operating a memory module in a first mode when the memory module is inserted onto a first type of memory channel with multi-drop data-links and operating the memory module in a second mode when the memory module is inserted onto a second type of memory channel with multi-drop data-links.

In a further embodiment, the method operates a DQ buffer component as a repeater in the first mode and in the second mode. In another embodiment, the method operates the DQ buffer component as a repeater in the first mode and as a multiplexer in the second mode.

In a further embodiment, the following are performed by the method: a) coupling a first bi-directional path between a first primary port and a first secondary port in the first mode; b) coupling a second bi-directional path between a second primary port and a second secondary port in the first mode; b) coupling a third bi-directional path between the first primary port and the second secondary port in the second mode; and c) coupling a fourth bi-directional path between the second primary port and the first secondary port in the second mode.

Figure 38:
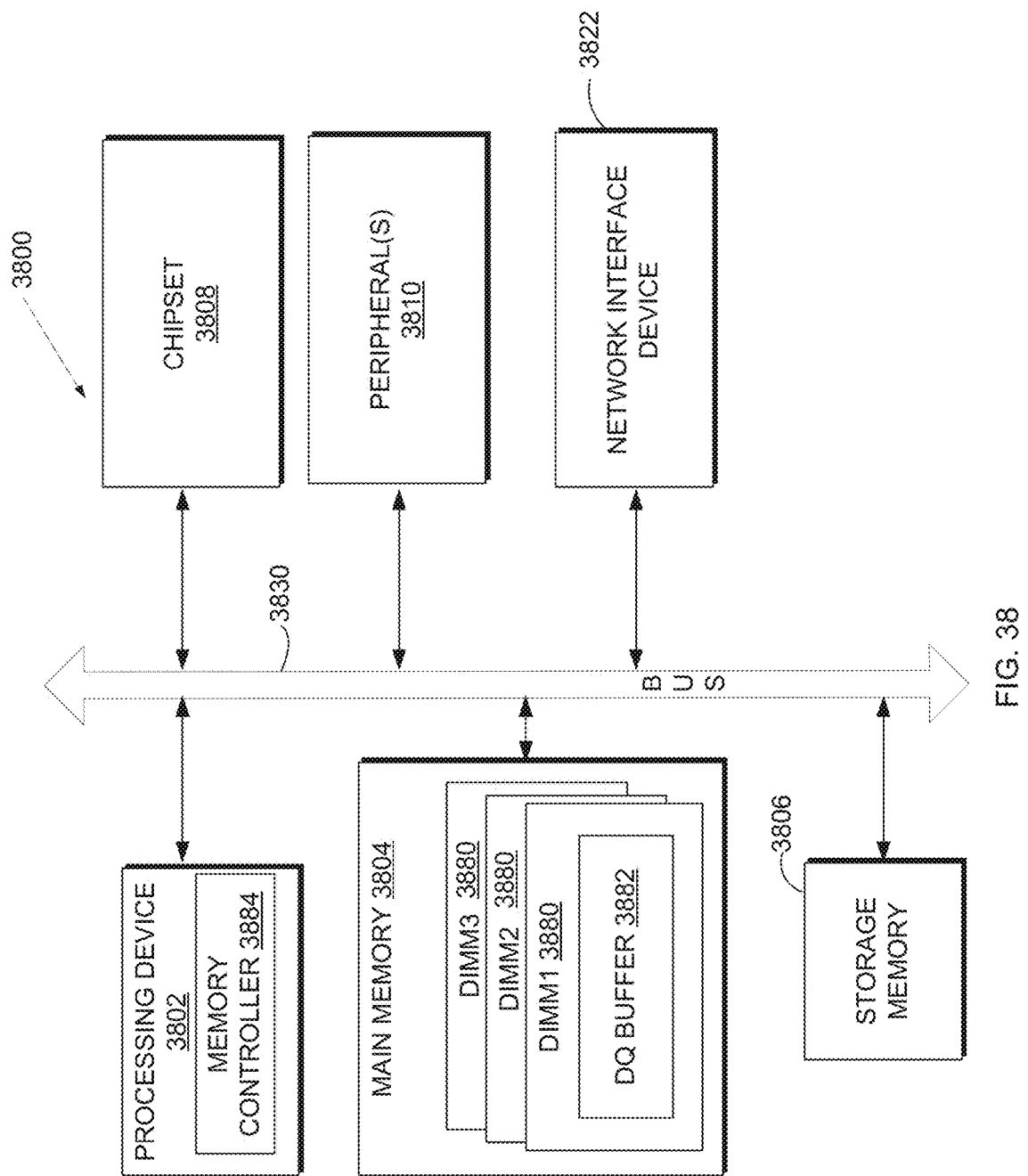
FIG. 38 is a diagram of one embodiment of a computer system, including main memory with three memory modules with memory modules according to one embodiment.

FIG. 38 is a diagram of one embodiment of a computer system 3800, including main memory 3804 with three memory modules 3880 with memory modules 3880 according to one embodiment. The computer system 3800 may be connected (e.g., networked) to other machines in a LAN, an intranet, an extranet, or the Internet. The computer system 3800 can be a host in a cloud, a cloud provider system, a cloud controller, a server, a client, or any other machine. The computer system 3800 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 3800 includes a processing device 3802, a main memory 3804 (e.g., read-only memory (ROM), flash memory, dynamic random access memory (DRAM), a storage memory 3806 (e.g., flash memory, static random access memory (SRAM), etc.), and a secondary memory 3818 (e.g., a data storage device in the form of a drive unit, which may include fixed or removable computer-readable storage medium), which communicate with each other via a bus 3830. The main memory 3804 includes the memory modules 3880 and DQ buffer components 3882 are described herein. The processing device 3802 includes a memory controller 3884.

Processing device 3802 represents one or more general-purpose processing devices such as a microprocessor, central processing unit, or the like. More particularly, the processing device 3802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 3802 may also be one or more special-purpose processing devices such as an application specific integrated circuit (ASIC), a field programmable gate array (FPGA), a digital signal processor (DSP), network processor, or the like. Processing device 3802 includes a memory controller 3884 as described above. The memory controller 3884 is a digital circuit that manages the flow of data going to and from the main memory 3804. The memory controller 3884 can be a separate integrated circuit, but can also be implemented on the die of a microprocessor.

In one embodiment, the processing device 3802 may reside on a first circuit board and the main memory 3804 may reside on a second circuit board. For example, the circuit board may include a host computer (e.g., CPU having one more processing cores, L1 caches, L2 caches, or the like), a host controller or other types of processing devices 3802. The second circuit board may be a memory module inserted into a socket of the first circuit board with the host device. The memory module may include multiple memory devices, as well as the buffer components as described herein. The memory module's primary functionality is dependent upon the host device, and can therefore be considered as expanding the host device's capabilities, while not forming part of the host device's core architecture. A memory device may be capable of communicating with the host device via a DQ bus and a CA bus. For example, the memory device may be a single chip or a multi-chip module including any combination of single chip devices on a common integrated circuit substrate. The components of FIG. 38 can reside on "a common carrier substrate," such as, for example, an integrated circuit ("IC") die substrate, a multi-chip module substrate or the like. Alternatively, the memory device may reside on one or more printed circuit boards, such as, for example, a mother board, a daughter board or other type of circuit card. In other embodiments, the main memory and processing device 3802 can reside on the same or different carrier substrates.

The computer system 3800 may include a chipset 3808, which refers to a group of integrated circuits, or chips, that are designed to work with the processing device 3802 and controls communications between the processing device 3802 and external devices. For example, the chipset 3808 may be a set of chips on a motherboard that links the processing device 3802 to very high-speed devices, such as main memory 3804 and graphic controllers, as well as linking the processing device to lower-speed peripheral buses of peripherals 3810, such as USB, PCI or ISA buses.

The computer system 3800 may further include a network interface device 3822. The computer system 3800 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device 3820 (e.g., a speaker.

The embodiments described herein may be R+LRDIMM. R+DDR4 LRDIMM that offers memory bus speed improvement for 2 DPC and 3 DPC cases using Dynamic Point-Point (DPP). R+DDR4 LRDIMM Enables 2 DPC @ 3.2 Gb/s; 3 DPC DQ nets support data rates up to 2.67 Gb/s. R+DDR4 LRDIMM requires no change to DRAMs and CPU and Supports SEC-DED ECC and ChipKill™. R+LRDIMM fully compatible with standard LRDIMMs and standard server motherboards. Motherboard changes required to achieve the higher bus speeds enabled by DPP. Gen2 R+LRDIMM solution addresses current C/A bus limitations. Solving C/A bus limitations enables 3 DPC @ 3.2 Gb/s.

For 2 sockets per channel (SPC) systems, R+LRDIMM implements Dynamic Point-Point (DPP) across the 2 slots as in the previous R+LRDIMM proposal. Broadcast CS and CKE signals over private bus between DIMMs so that each DIMM also sees the CS and CKE signals for the other DIMM. R+LRDIMM supports 3 SPC with DPP across 2 DIMM sockets and 3rd socket in parallel. One load on each DQ net for 1 DPC and 2 DPC can be done. Two loads on DQ net for 3 DPC/Implementing DPP across 2 DIMM sockets may require 9 byte-wide DBs per DIMM, same as standard LRDIMM. Implementing DPP across 2 DIMM sockets ensures that every DRAM is connected only to one DB, same as standard LRDIMM. The max speed of DQ bus with 2 loads>Max speed of C/A bus with 3 loads, so acceptable solution.

Current C/A bus can support 2 DPC @ 3.2 Gb/s with 2T timing. By implementing DPP on the DQ bus, R+LRDIMM enables 2 DPC @ 3.2 Gb/s. Implementing DPP across only 2 DIMM slots makes R+LRDIMM embodiment closely match standard LRDIMM embodiment. This may enable easier adoption of R+LRDIMM by OEMs and may ensure that R+LRDIMM works in standard server motherboards without issues. The max bus speed limited by C/A topology for 3 DPC. An improvement to C/A bus may be needed to realize speed improvements from implementing DPP across 3 DIMM slots. These constraints may be met by the embodiments described herein. For example, no CPU and DRAM changes may be needed. BIOS changes may need to enable R+ mode. The R+LRDIMM operates as a standard LRDIMM in a standard server, using 1 RCD and 9 byte-wide DBs and there are minor changes to RCD, DB, and raw card for compatibility with JEDEC LRDIMM. In R+LRDIMM there is minimum or no latency adder over standard LRDIMM. Same or lower power than standard LRDIMM is consumed. R+LRDIMM can use the same PCB technology and packaging as standard LRDIMM and can use existing HVM technology to maintain BOM cost. R+LRDIMM needs only memory channel wiring changes on motherboard to operate in the enhanced mode, which results in lower design costs and speed to market with those changes.

In summary, described herein are various configurations of primary DQ topologies. There are 13 configurations expressly described above. Alternatively, other configurations may be possible. There are multiple versions of number of modules sockets per channel in a configuration. These module sockets can be configured as DPP (two modules act together on an access) or non-DPP (one module responds to an access. There are various configurations in which a number of DQ groups (4×DQ links plus DQS± links) to which each DQ buffer component connects. These DQ groups are divided into three categories: primary (connecting to motherboard), secondary (connecting to DRAM(s) at a device site), and private (two DQ buffer components connecting together). Some configurations a primary bypass is used to connect one primary DQ group to another primary DQ group in configurations B and C. In other configurations, a private CS bus can be used. The DPP module sockets require some shared information during an access. Configurations {A,D,E,F} require chip-selection information (CS), and configurations {B,C} require bypass direction information.

2 Module Socket Configurations

Some systems have two non-DPP module sockets, while others have three non-DPP module sockets. Other systems have two DPP module sockets (similar to the non-DPP module socket (closest to the controller) removed, leaving two DPP module sockets).

A configurations: The A configuration is a mixed configuration, in which there is one non-DPP module socket and two DPP module sockets. These two configurations require the use of a private CS bus between the DPP module sockets. This allows the CS information for an access to be shared by the two DPP modules.

Another alternative "A" configuration would be the replacement of the single non-DPP module socket with two DPP module sockets. It would be necessary for the controller to supply a fourth set of CS signals (instead of the three shown in the system diagrams—see FIG. 3A, for example). Each pair of DPP module sockets would be connected with a private bus for sharing chip-select information. Each pair would respond to the assertion of any of the eight CS signals connecting to that pair. One of each pair would forward the chip-select information to the other. Each module in a module pair would supply half of the DRAMs for each access B configurations: The B configuration is a mixed configuration, in which there is one non-DPP module socket and two DPP module sockets. There is a key difference with respect to configuration A. An access to the DPP modules only uses DRAMs on a single module, unlike configuration A in which an access uses DRAMs on both DPP modules. This has two consequences. First, since the entire DRAM access is performed by one module, no chip-selection information needs to be shared with the other DPP module. A second consequence is that the DPP module whose DRAMs are not being accessed is instead used to provide a bypassing path through its DQ buffer components. This bypassing path may be implemented in one of various ways as described herein.

The first method is synchronous and involves re-synchronizing the bypassed data. This is implemented by routing the clocked output of a primary receiver to the output multiplexer of the other primary transmitter. The clock domain crossing logic is included in this path.

The control register state needed for domain crossing between the two primary ports should be be maintained for this method (e.g., this may be the DLY0.5 and DLY123[1:0] values which are updated after each transfer).

The second method is asynchronous, and involves using just the non-clocked elements of the receiver and transmitter to provide amplification of the bypassed data, but no resynchronization.

The third method is asynchronous, and involves using a transistor in a series-pass mode. This mode means the primary motherboard wires are coupled with a low-resistance connection with no amplification and no re-synchronization.

Even though no chip-selection information needs to be shared with the other DPP module, it is still necessary to provide a small amount of information to control the bypass path. A circuit similar to what is shown in FIG. 11 could be used for this.

A smaller amount of information needs to be transferred (typically one bit per access), and the information is transferred later in the access so the access latency is not impacted.

R+LRDIMM and standard LRDIMM are similar in various regards as noted below, excepted where state. The DIMM mechanical dimensions may be defined by the JEDEC defined dimensions. DRAM, RCD, DB, component placement, connector-RCD connection, RCD-DRAM connections, DRAM-DB connection, RCD-DB connections can also be JEDEC defined. However, for the RCD, two new pins on a primary side can be added for R+LRDIMM, and eight additional CS pins and four additional CKE pins on the secondary side. For component placement, RCD placement may be similar between standard and R+, but is not exact due to additional pins. The Connector-RCD connections may be the same except that the 2 RFU connector pins are routed to the 2 new pins on the primary side. The RCD-DRAM connections may be the same between standard and R+, except that each secondary C/A bus has four additional CS# and two additional CKE pins as described herein. Also, there may be a larger RCD package to accommodate 14 new signal pins (2 on primary side, 12 on secondary side). The RFU[1:0] pins on connector are also routed to RCD on R+LRDIMM, along with 1 additional CKE and 2 additional CS# signals routed to the DRAMs along with other C/A signals.

As described herein, LRDIMM operation of a memory module can be in a stand mode or an enhanced mode.

The embodiments described herein may be directed to memory modules with multiple modes of operation. In one embodiment, a memory module with two modes of operation; a first mode, in which it can be inserted onto a first type of memory channel with multi-drop data-links which are shared with at least one other module, and a second mode in which it can be inserted onto a second type of memory channel in which some data-links do not connect to all the modules.

In another embodiment, a memory controller component which can initialize memory systems with two different data-link connection topologies: a first system, in which the data-links use a multi-drop topology and connect to all module sockets, and a second system, in some data-links do not connect to all the modules.

In another embodiment, in a memory system includes a controller component, a motherboard substrate with module sockets, and at least three memory modules, in which some of the data-links do not connect the controller to all the sockets. In another embodiment, a method of the system memory may also be used.

In another embodiment, in the second mode of operation, a module may communicate with a second module using private links which do not connect to the controller component.

In another embodiment, data that is accessed on one module passes in a first link-connection and out a second link-connection of another module.

In another embodiment, data accessed on one module passes through one of the following on another module: a wire connection, a pass-transistor, an unclocked receiver-transmitter pair, a clocked receiver-transmitter pair.

In another embodiment, a first command to a first address accesses data on a single module, and a second command to a second address accesses data on more than one module.

In another embodiment, a memory module includes multiple device sites and a DQ buffer component coupled to the device sites. The DQ buffer component is to operate in a first mode when the memory module is inserted onto a first type of memory channel with multi-drop data-links and in a second mode when the memory module is inserted onto a second type of memory channel with point-to-point data-links. In one embodiment, the DQ buffer component is programmed to operate as a repeater in the first mode and in the second mode. In another embodiment, the DQ buffer component is programmed to operate as a repeater in the first mode and as a multiplexer in the second mode. In one embodiment, the point-to-point data-links are point-to-point (P-to-P) links. In another embodiment, the point-to-point data-links are point-to-two-points (P-to-2P) links. In one embodiment, the multi-drop data-links are shared with all other memory modules connected to a memory controller to which the memory module is connected and the point-to-point data-links do not connect to all of the other memory modules connected to the memory controller. Alternatively, other configurations of multi-drop and point-to-point data-links are possible.

In one embodiment, the DQ buffer component includes two primary ports to couple to two of the multi-drop data-links in the first mode and to couple to two of the point-to-point data-links in the second mode. The DQ buffer component also includes two secondary ports coupled to two of the DRAM devices. In a further embodiment, the DQ buffer component includes: a first bi-directional path between a first primary port of the two primary ports and a first secondary port of the two secondary ports; a second bi-directional path between a second primary port of the two primary ports and a second secondary port of the two secondary ports; a third bi-directional path between the first primary port and the second secondary port; and a fourth bi-directional path between the second primary port and the first secondary port.

In one embodiment, a single DRAM device is disposed at the device site. In other embodiments, multiple DRAM devices are disposed at the device site, e.g., a two-package stack, at least a two-die stack, or a four-die stack with a micro-buffer component.

In a further embodiment, the memory module includes a CA buffer component that includes primary data-links to receive chip select (CS) information from a memory controller to select the memory module as a selected module for access. Other memory modules are connected to the memory controller are considered unselected modules. The CA buffer component also includes secondary data-links to retransmit the CS information to at least one of the unselected modules. In another embodiment, the CA buffer component receives CS information from a memory controller over the primary data-links when the memory module is selected by the memory controller and receives a copy of the CS information retransmitted over the secondary data-links from another memory module connected to the memory controller when the memory module is not selected by the memory controller.

In another embodiment, there are multiple DQ buffer components and multiple DRAM devices, such as nine DQ buffer components and eighteen DRAM devices, each of the DQ buffer components being coupled to a pair of the eighteen DRAM devices.

In one embodiment, the DQ buffer component includes: 1) three primary ports to couple to three of the multi-drop data-links in the first mode and to couple to three of the point-to-point data-links in the second mode; and 2) three secondary ports coupled to three of the plurality of DRAM devices. In some embodiments, DQ buffer components are coupled together via a private bus. The DQ buffer component can includes a private port to connect to another DQ buffer component via the private bus. The private bus is disposed a motherboard substrate. During operation, the CA buffer component receives CS information from a memory controller over primary CA links and to broadcast a copy of the CS information on the private bus. A CA buffer component on other module receives the CS information over the private bus as described herein. The copy of the CS information may be sent with approximately a one-clock-cycle delay.

In one embodiment, the DQ buffer component further includes: a) a first multiplexer comprising two inputs coupled to two primary ports and an output coupled to a second secondary port of two secondary ports; b) a second multiplexer comprising two inputs coupled to the two primary ports and an output coupled to a first secondary port of the two secondary ports; c) a third multiplexer comprising two inputs coupled to the two secondary ports and an output coupled to a first primary port of the two primary ports; and d) a fourth multiplexer comprising two inputs coupled to the two secondary ports and an output coupled to a second primary port of the two primary ports. In a further embodiment, the DQ buffer component further includes: e) first synchronization logic coupled between the output of the first multiplexer and the second secondary port; f) second synchronization logic coupled between the output of the second multiplexer and the first secondary port; g) third synchronization logic coupled between the output of the third multiplexer and the first primary port; and h) fourth synchronization logic coupled between the output of the fourth multiplexer and the second primary port.

In another embodiment, the DQ buffer component includes: i) a first bypass path from the first primary port to a third input of the fourth multiplexer; and j) a second bypass path from the second primary port to a third input of the third multiplexer. In another embodiment, the DQ buffer component further includes: k) a fifth multiplexer includes two inputs coupled to an output of the third synchronization logic and a first bypass path coupled the second primary port and an output coupled to the first primary port; and l) a sixth multiplexer comprising two inputs coupled to an output of the fourth synchronization logic and a second bypass path coupled to the first primary port and an output coupled to the second primary port.

In another embodiment, the DQ buffer component further includes a passive asynchronous bypass path directly coupled between the first primary port and the second primary port.

In another embodiment, a printed circuit board (PCB) of a memory module includes pins, memory devices, a CA buffer component, and multiple DQ buffer components. One or more of the DQ buffer components include primary ports coupled to the pins, secondary ports coupled to the memory devices, and programmable bi-directional paths between the primary ports and the secondary ports. The DQ buffer component is programmed to operate the bi-directional paths in a first configuration when the PCB is inserted onto a first type of memory channel with multi-drop data-links and in a second configuration when the PCB is inserted onto a second type of memory channel with point-to-point data-links. In one embodiment, the bi-directional paths includes: a) a first bi-directional path between a first primary port of the two primary ports and a first secondary port of the two secondary ports; b) a second bi-directional path between a second primary port of the two primary ports and a second secondary port of the two secondary ports; c) a third bi-directional path between the first primary port and the second secondary port; and d) a fourth bi-directional path between the second primary port and the first secondary port. Alternatively, the bi-directional paths may include paths between three primary ports and two secondary ports. The bi-directional paths may also include paths to accommodate a private bus, a bypass, or both.

In one embodiment, the PCB includes a register to store information to indicate a first mode or a second mode of operation. The information can be used to configure the bi-directional paths in the first and second configurations. In one embodiment, the first configuration corresponds to the first mode and the second configuration corresponds to the second mode.

In one embodiment, the PCB includes a private bus coupled between a first DQ buffer component and a second DQ buffer component. The first and second DQ buffer components each include a private port coupled to the private bus.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory module comprising:
a plurality of device sites;
a data buffer component coupled to the plurality of device sites;
at least eighteen dynamic random access memory (DRAM) devices disposed at respective device sites;
nine data buffer components coupled to the at least eighteen DRAM devices, each of the nine data buffer components being coupled to a respective pair of the at least eighteen DRAM devices, wherein the nine data buffer components includes the data buffer component; and
a command and address (CA) buffer component coupled to the at least eighteen DRAM devices, wherein the data buffer component is to couple to point-to-point data-links of a memory channel, wherein the data buffer component comprises:
three primary ports to couple to three multi-drop data-links in a first mode and to couple to three point-to-point data-links in a second mode; and
three secondary ports coupled to three of the at least eighteen DRAM devices.

2. The memory module of claim 1, wherein the data buffer component is programmed to operate as a repeater.

3. The memory module of claim 1, wherein the data buffer component is programmed to operate as a multiplexer.

4. The memory module of claim 1, wherein the data buffer component is to couple to point-to-point data-links of a memory channel, wherein the point-to-point data-links do not connect to all other memory modules connected to a memory controller to which the memory module is connected.

5. The memory module of claim 1, wherein the data buffer component is to couple to point-to-point data-links of a memory channel, wherein the point-to-point data-links are at least one of point-to-point (P-to-P) links or point-to-two-points (P-to-2P) links.

6. The memory module of claim 1, further comprising a private bus coupled between at least two of the nine data buffer components.

7. The memory module of claim 1, wherein at least one of the plurality of device sites comprises at least one of a single device, a two-package stack, at least a two-die stack, or a four-die stack with a micro-buffer component.

8. A memory module comprising:
a plurality of device sites;

a data buffer component coupled to the plurality of device sites, and wherein the data buffer component comprises:
two primary ports to couple to two data-links;
two secondary ports coupled to two of the plurality of device sites;
a first bi-directional path between a first primary port of the two primary ports and a first secondary port of the two secondary ports;
a second bi-directional path between a second primary port of the two primary ports and a second secondary port of the two secondary ports; and
a third bi-directional path between the first primary port and the second secondary port, wherein the data buffer component is to couple to point-to-point data-links of a memory channel, wherein the point-to-point data-links do not connect to all other memory modules connected to a memory controller to which the memory module is connected.

9. The memory module of claim 8, wherein the data buffer component further comprises a fourth bi-directional path between the second primary port and the first secondary port.

10. The memory module of claim 8, further comprising a plurality of dynamic random access memory (DRAM) devices disposed at respective device sites, wherein the data buffer component is to couple to point-to-point data-links of a memory channel, wherein the point-to-point data-links are at least one of point-to-point (P-to-P) links or point-to-two-points (P-to-2P) links.

11. The memory module of claim 8, further comprising:
a plurality of dynamic random access memory (DRAM) devices disposed at respective of device sites; and
a plurality of data buffer components coupled to the plurality of DRAM devices.

12. The memory module of claim 8, further comprising:
eighteen dynamic random access memory (DRAM) devices disposed at the respective device sites;
nine data buffer components coupled to the eighteen DRAM devices, each of the nine data buffer components being coupled to a pair of the eighteen DRAM devices, wherein the nine data buffer components includes the data buffer component; and
a command and address (CA) buffer component coupled to the eighteen DRAM devices.

13. A memory module comprising:
a plurality of device sites; and
a data buffer component coupled to the plurality of device sites, wherein the data buffer component further comprises:
a first multiplexer comprising two inputs coupled to two primary ports and an output coupled to a second secondary port of two secondary ports;
a second multiplexer comprising two inputs coupled to the two primary ports and an output coupled to a first secondary port of the two secondary ports;
a third multiplexer comprising two inputs coupled to the two secondary ports and an output coupled to a first primary port of the two primary ports; and
a fourth multiplexer comprising two inputs coupled to the two secondary ports and an output coupled to a second primary port of the two primary ports, wherein the data buffer component further comprises:
first synchronization logic coupled between the output of the first multiplexer and the second secondary port;
second synchronization logic coupled between the output of the second multiplexer and the first secondary port;
third synchronization logic coupled between the output of the third multiplexer and the first primary port; and
fourth synchronization logic coupled between the output of the fourth multiplexer and the second primary port.

14. The memory module of claim 13, wherein the data buffer component further comprises:
a first bypass path from the first primary port to a third input of the fourth multiplexer; and
a second bypass path from the second primary port to a third input of the third multiplexer.

15. The memory module of claim 13, wherein the data buffer component further comprises:
a fifth multiplexer comprising two inputs coupled to an output of the third synchronization logic and a first bypass path coupled the second primary port and an output coupled to the first primary port; and
a sixth multiplexer comprising two inputs coupled to an output of the fourth synchronization logic and a second bypass path coupled to the first primary port and an output coupled to the second primary port.

16. The memory module of claim 13, wherein the data buffer component further comprises a passive asynchronous bypass path directly coupled between the first primary port and the second primary port.

17. The memory module of claim 13, wherein the data buffer component is to couple to point-to-point data-links of a memory channel, wherein the point-to-point data-links do not connect to all other memory modules connected to a memory controller to which the memory module is connected.

18. The memory module of claim 13, further comprising a plurality of dynamic random access memory (DRAM) devices disposed at respective device sites, wherein the data buffer component is to couple to point-to-point data-links of a memory channel, wherein the point-to-point data-links are at least one of point-to-point (P-to-P) links or point-to-two-points (P-to-2P) links.

19. The memory module of claim 13, further comprising:
eighteen dynamic random access memory (DRAM) devices disposed at the respective device sites;
nine data buffer components coupled to the eighteen DRAM devices, each of the nine data buffer components being coupled to a pair of the eighteen DRAM devices, wherein the nine data buffer components includes the data buffer component; and
a command and address (CA) buffer component coupled to the eighteen DRAM devices.

20. The memory module of claim 13, further comprising:
a plurality of dynamic random access memory (DRAM) devices disposed at respective of device sites; and
a plurality of data buffer components coupled to the plurality of DRAM devices.

* * * * *